(12) United States Patent
Cox et al.

(10) Patent No.: US 11,013,140 B1
(45) Date of Patent: May 18, 2021

(54) WALL-MOUNTED CABLE HOUSING ASSEMBLIES

(71) Applicant: Amazon Technologies, Inc., Seattle, WA (US)

(72) Inventors: Dylan Thomas Cox, Seattle, WA (US); Jeremy Samuel De Bonet, Southborough, MA (US); Thomas Duester, Seattle, WA (US); Jennifer Li, Seattle, WA (US); Aaron M. McDaniel, Seattle, WA (US); Robert M. Riggs, Lynnwood, WA (US)

(73) Assignee: Amazon Technologies, Inc., Seattle, WA (US)

( * ) Notice: Subject to any disclaimer, the term of this patent is extended or adjusted under 35 U.S.C. 154(b) by 53 days.

(21) Appl. No.: 16/141,769

(22) Filed: Sep. 25, 2018

(51) Int. Cl.
*H05K 7/18* (2006.01)
*H05K 5/02* (2006.01)
(Continued)

(52) U.S. Cl.
CPC ............ *H05K 7/186* (2013.01); *A47B 57/30* (2013.01); *H04Q 1/062* (2013.01); *A47B 21/06* (2013.01);
(Continued)

(58) Field of Classification Search
CPC .... H05K 7/186; H05K 7/1491; H05K 5/0247; H04Q 1/062; H04Q 1/09; A47B 21/06;
(Continued)

(56) References Cited

U.S. PATENT DOCUMENTS

| 4,762,072 A | * | 8/1988 | Boundy | A47B 21/06 |
| | | | | 108/50.02 |
| 5,231,562 A | * | 7/1993 | Pierce | A47B 21/06 |
| | | | | 108/50.02 |

(Continued)

OTHER PUBLICATIONS

Abhaya Asthana et al., "An Indoor Wireless System for Personalized Shopping Assistance", Proceedings of IEEE Workshop on Mobile Computing Systems and Applications, 1994, pp. 69-74, Publisher: IEEE Computer Society Press.

(Continued)

*Primary Examiner* — Hiwot E Tefera
(74) *Attorney, Agent, or Firm* — Athorus, PLLC

(57) ABSTRACT

Cable housing assemblies include frames and cable carriers slidably mounted to channels provided at edges of the frames. The cable carriers may house or support male or female connectors to the cables, which may be power or communications cables (e.g., Ethernet cables) that extend from the connectors within the cable carriers into the channels, and through voids within the frames to power sources or communications systems. The cable carriers are releasably inserted into channels at edges of the frames, and permitted to slide in either direction (e.g., up or down) to various positions within such channels, in order to make power or communications services available at such positions. When installed in association with a shelving unit, e.g., between a backerboard and shelves, the cable carriers may be used to provide power or communications services available to such shelves provided at any height within the shelving unit.

12 Claims, 43 Drawing Sheets

(51) Int. Cl.
*H05K 7/14* (2006.01)
*H04Q 1/06* (2006.01)
*A47B 57/30* (2006.01)
*A47B 97/00* (2006.01)
*A47B 21/06* (2006.01)
*H04Q 1/02* (2006.01)

(52) U.S. Cl.
CPC .......... *A47B 2097/003* (2013.01); *H04Q 1/09* (2013.01); *H05K 5/0247* (2013.01); *H05K 7/1491* (2013.01)

(58) Field of Classification Search
CPC ........ A47B 2097/003; A47B 2021/066; A47B 83/001; A47B 2200/0082; A47B 21/00; A47B 2200/008; A47B 57/30; E04B 2002/7483; E04B 2002/7488; E04B 2002/7462; H01R 13/6395; H01R 13/74
USPC ..... 312/223.6; 174/480, 481, 54, 58, 61, 50; 52/220.7
See application file for complete search history.

(56) References Cited

U.S. PATENT DOCUMENTS

| | | | | |
|---|---|---|---|---|
| 5,357,055 A | * | 10/1994 | Sireci | H02G 3/288 174/497 |
| 5,574,256 A | * | 11/1996 | Cottone | H01R 13/6395 174/53 |
| 5,695,261 A | * | 12/1997 | Slesinger | A47F 11/10 312/223.6 |
| 6,125,600 A | * | 10/2000 | Bastian | E04B 2/7422 52/220.7 |
| 6,327,983 B1 | * | 12/2001 | Cronk | A47B 21/06 108/50.02 |
| 6,497,075 B1 | * | 12/2002 | Schreiner | A47B 21/06 52/127.6 |
| 7,225,980 B2 | | 6/2007 | Ku et al. | |
| 7,949,568 B2 | | 5/2011 | Fano et al. | |
| 8,009,864 B2 | | 8/2011 | Linaker et al. | |
| RE42,970 E | * | 11/2011 | Fournier | G02B 6/4452 211/26 |
| 8,175,925 B1 | | 5/2012 | Rouaix | |
| 8,189,855 B2 | | 5/2012 | Opalach et al. | |
| 8,423,431 B1 | | 4/2013 | Rouaix et al. | |
| 8,630,924 B2 | | 1/2014 | Groenevelt et al. | |
| 8,688,598 B1 | | 4/2014 | Shakes et al. | |
| 9,078,348 B1 | * | 7/2015 | Grandin | H05K 7/02 |
| 9,473,747 B2 | | 10/2016 | Kobres et al. | |
| 2002/0095890 A1 | * | 7/2002 | Brauning | A47B 57/18 52/239 |
| 2003/0002712 A1 | | 1/2003 | Steenburgh et al. | |
| 2004/0104037 A1 | * | 6/2004 | Solet | H02G 11/02 174/50 |
| 2004/0181467 A1 | | 9/2004 | Raiyani et al. | |
| 2007/0204537 A1 | * | 9/2007 | Bastian | A47B 83/001 52/220.7 |
| 2008/0055087 A1 | | 3/2008 | Horii et al. | |
| 2008/0077511 A1 | | 3/2008 | Zimmerman | |
| 2008/0109114 A1 | | 5/2008 | Orita et al. | |
| 2008/0295744 A1 | * | 12/2008 | Henriott | A47B 21/06 108/50.02 |
| 2009/0121017 A1 | | 5/2009 | Cato et al. | |
| 2009/0245573 A1 | | 10/2009 | Saptharishi et al. | |
| 2010/0178797 A1 | * | 7/2010 | Byrne | H05K 5/0247 439/540.1 |
| 2010/0193455 A1 | * | 8/2010 | Russell | A47B 57/56 211/90.02 |
| 2010/0227498 A1 | * | 9/2010 | Byrne | A47B 21/06 439/528 |
| 2011/0011936 A1 | | 1/2011 | Morandi et al. | |
| 2011/0240363 A1 | * | 10/2011 | Dinh | H02G 3/088 174/551 |
| 2012/0284132 A1 | | 11/2012 | Kim et al. | |
| 2013/0076898 A1 | | 3/2013 | Philippe et al. | |
| 2013/0253700 A1 | | 9/2013 | Carson et al. | |
| 2014/0279294 A1 | | 9/2014 | Field-Darragh et al. | |
| 2014/0362223 A1 | | 12/2014 | LaCroix et al. | |
| 2015/0019391 A1 | | 1/2015 | Kumar et al. | |
| 2015/0073907 A1 | | 3/2015 | Purves et al. | |
| 2018/0084904 A1 | * | 3/2018 | Gosling | A47B 83/001 |

OTHER PUBLICATIONS

Cristian Pop, "Introduction to the BodyCom Technology", Microchip AN1391, May 2, 2011, pp. 1-24, vol. AN1391, No. DS01391A, Publisher: 2011 Microchip Technology Inc.

\* cited by examiner

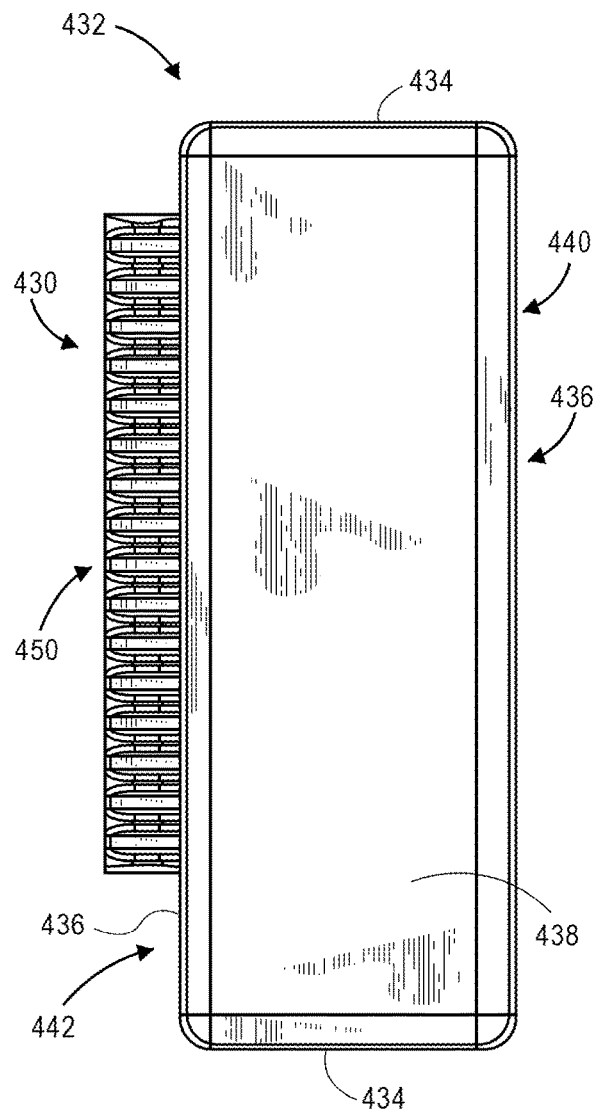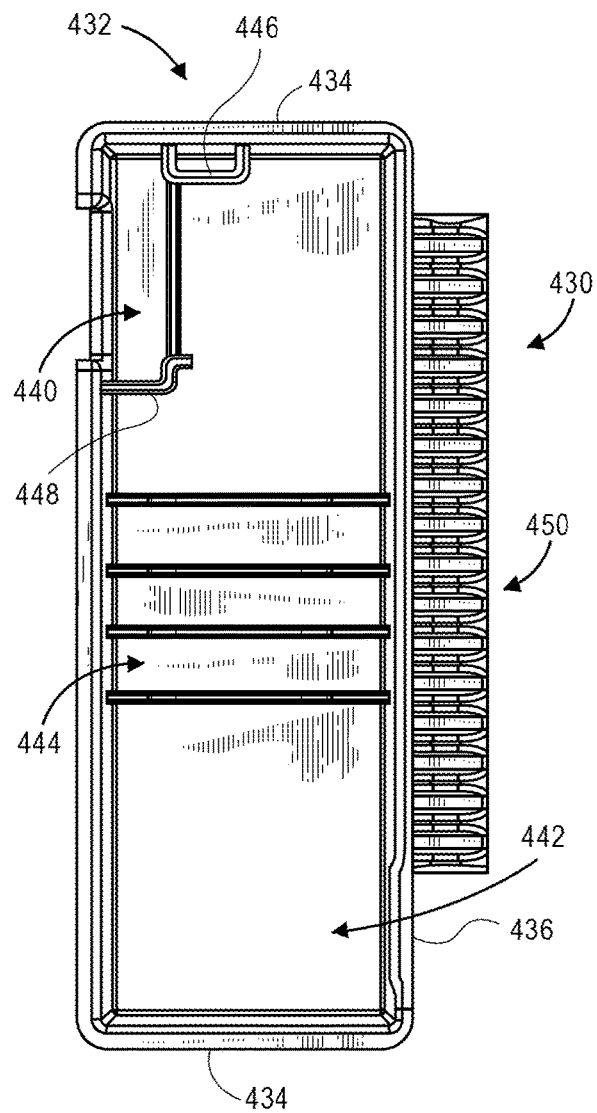
FIG. 4B  FIG. 4C

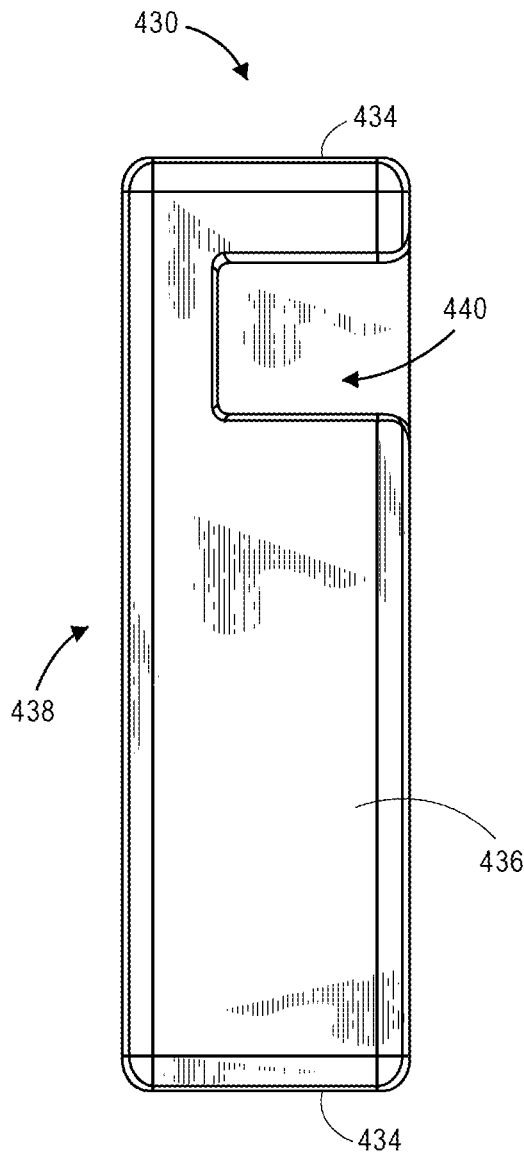
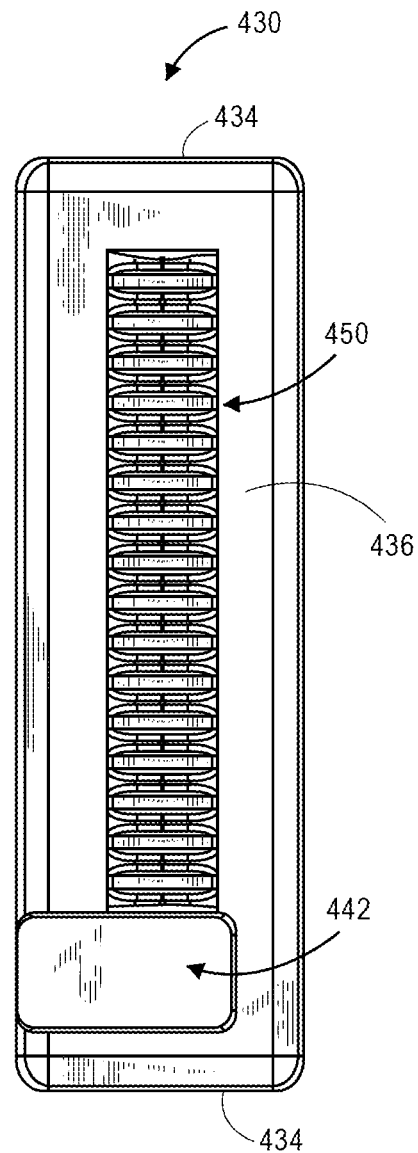
FIG. 4D   FIG. 4E

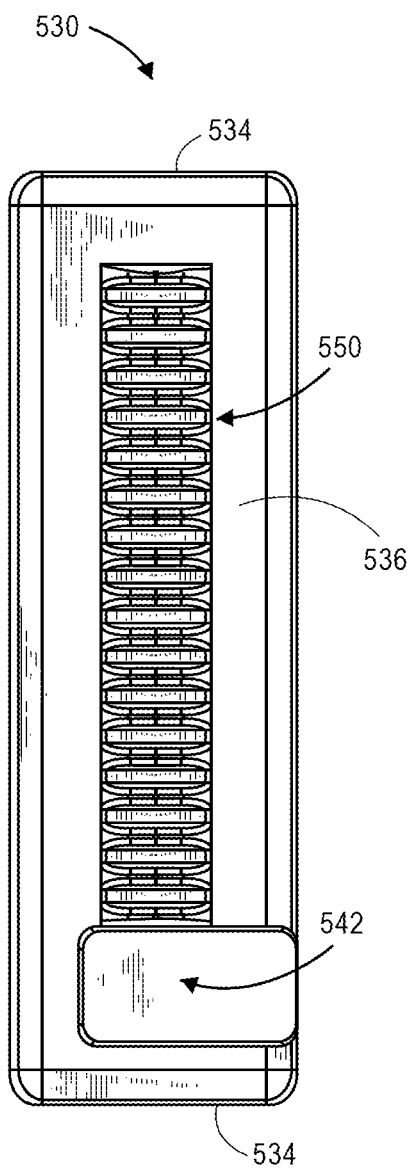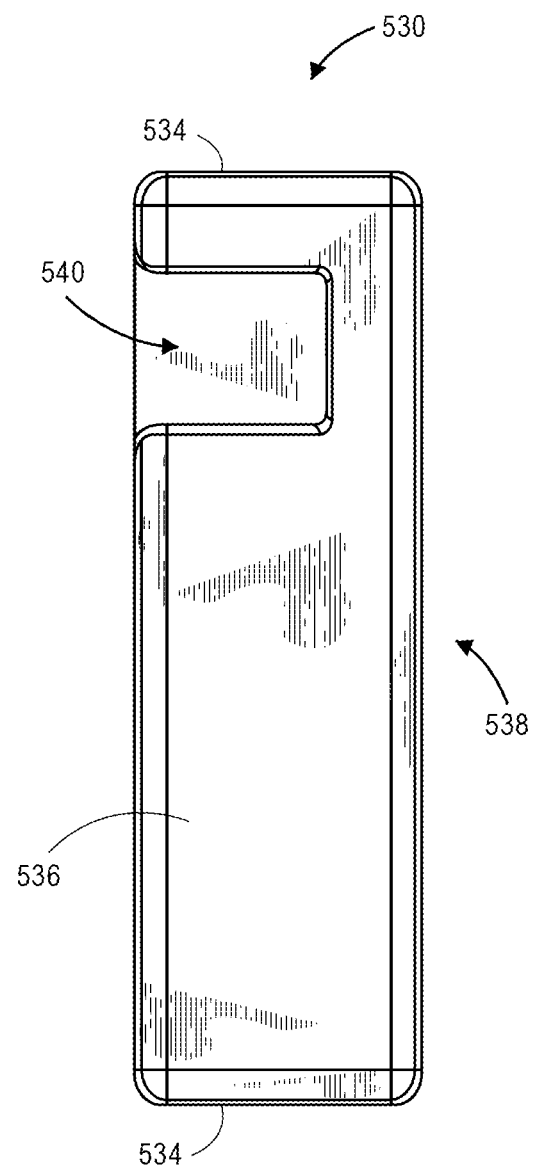
FIG. 5D  FIG. 5E

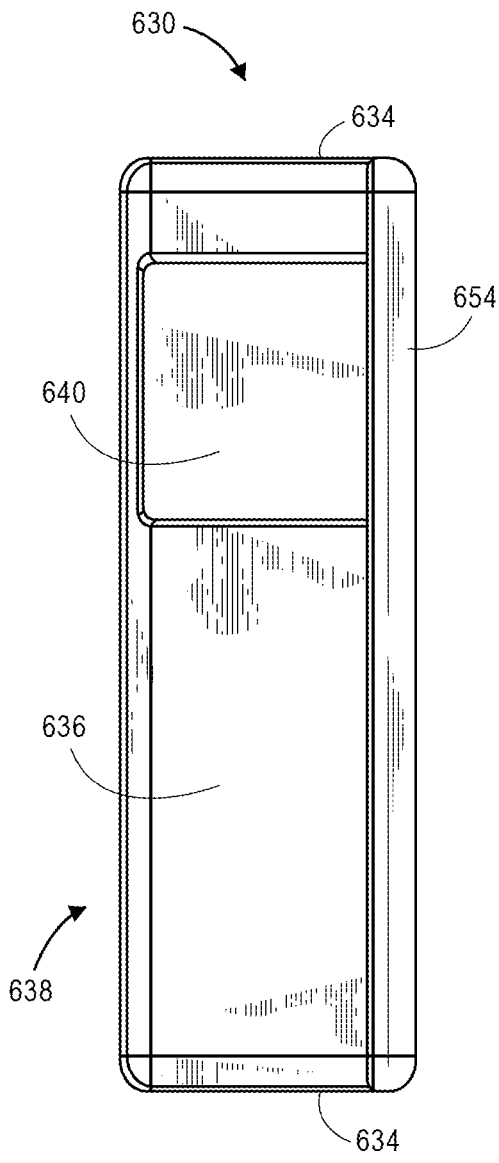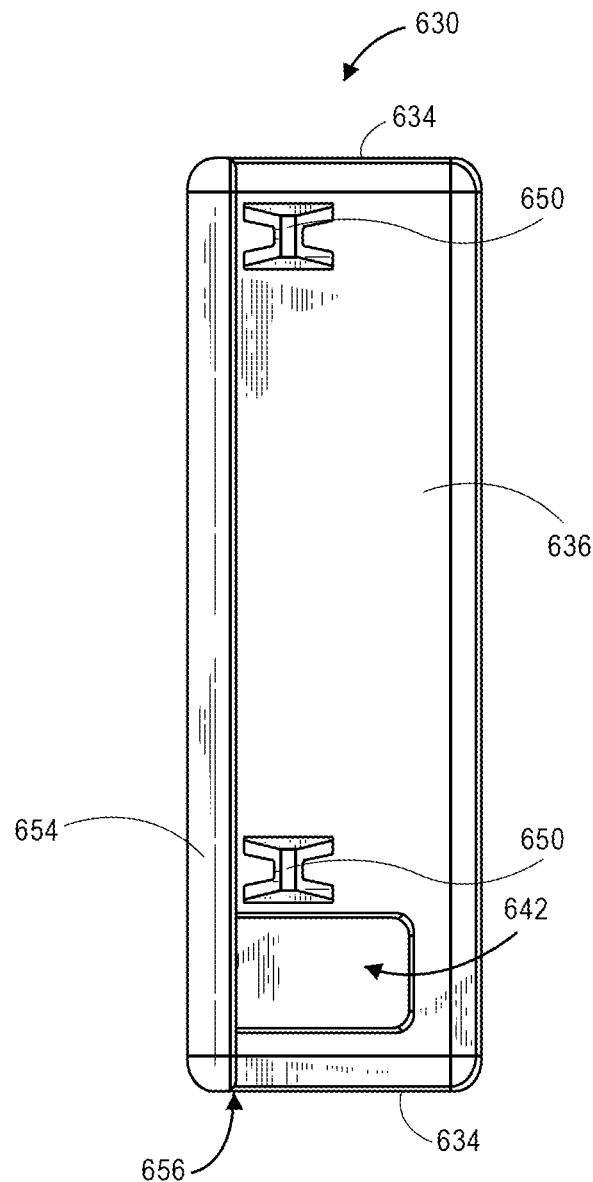
FIG. 6D  FIG. 6E

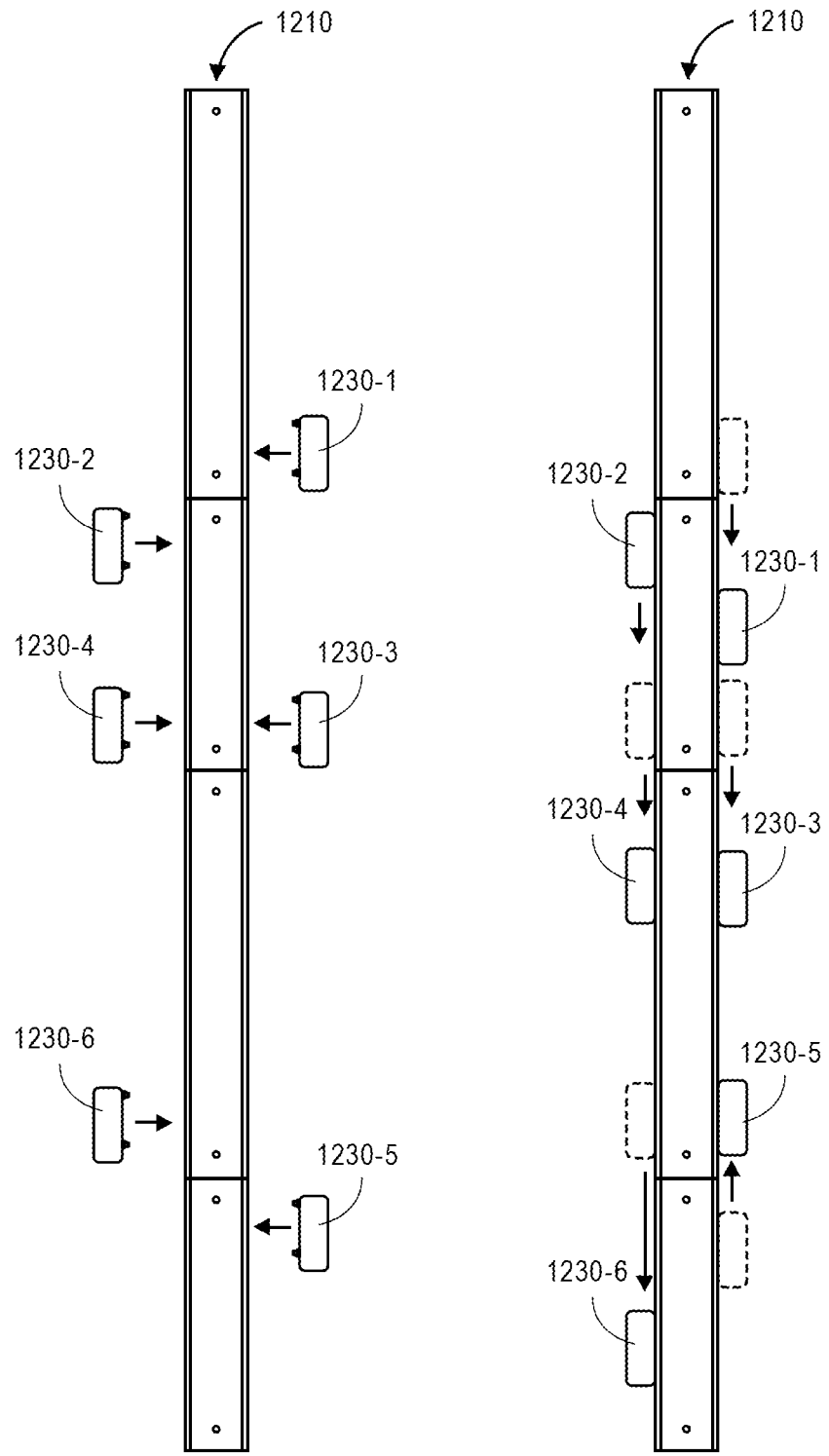
FIG. 12B   FIG. 12C

WALL-MOUNTED CABLE HOUSING ASSEMBLIES

BACKGROUND

Materials handling facilities such as warehouses or retail stores often store or display items on shelves. For example, a materials handling facility may include structural features such as walls, gondola racks or fixtures to which one or more shelves may be mounted or from which such shelves may be suspended, and available items may be disposed upon such shelves. Available items may remain on shelves on a temporary basis, until one or more of the items thereon is desired (e.g., in response to an order or a request from one or more users of the materials handling facility).

Storing items on shelves or like elements provides a number of advantages to users of a materials handling facility. For example, an item having one or more flat surfaces may be stored individually or collectively (e.g., along with other like or identical items), by placing one or more of the flat surfaces of such items on a corresponding flat surface of a shelf or like element. Furthermore, items may be stored in random locations on a shelf, or in predetermined areas or spaces of the shelf that are set aside for items of a specific type, group or category.

Increases in processing power and network connectivity, and reductions in component size, have enabled computer-based systems to be utilized in connection with nearly every aspect of our daily lives. In bricks-and-mortar commerce, computer-based systems having one or more sensors, such as imaging devices (e.g., digital cameras), have been integrated into traditional retail establishments in order to aid in theft prevention or inventory tracking.

Computer-based systems, however, traditionally require connections to power sources and communications systems or networks. In newly constructed retail establishments, storage units may be installed with embedded or native ports or connectors to which a computer-based system may be readily connected. In an existing retail establishment, however, where such storage units have already been constructed, providing electrical or communications connections to a computer-based system requires running cables along one or more shelves of a storage unit, attaching such cables to the storage unit by unsightly means such as adhesive tape, or other unfavorable measures to refit the storage unit for use with the computer-based system. Moreover, while network connectivity may be provided by wireless technologies, wireless communications (e.g., Wireless Fidelity technologies) remain substantially slower than wired communications (e.g., Ethernet connections), and are typically subject to greater interference, increased latency, more dropped signals and higher risks of hacking than wired communications.

BRIEF DESCRIPTION OF THE DRAWINGS

FIGS. 4A through 4G are views of components of one cable carrier in accordance with implementations of the present disclosure.

FIGS. 5A through 5G are views of components of one cable carrier in accordance with implementations of the present disclosure.

FIGS. 6A through 6G are views of components of one cable carrier in accordance with implementations of the present disclosure.

FIGS. 12A through 12C are components of one cable housing assembly in accordance with implementations of the present disclosure.

DETAILED DESCRIPTION

As is set forth in greater detail below, the present disclosure is directed to systems and methods for mounting cables or wires or other conductors in association with storage facilities, such as shelves or other storage units or apparatuses, in order to provide electrical or communications services to such shelves at various locations. More specifically, the systems and methods of the present disclosure are directed to cable housing assemblies that may be installed in narrow, low-clearance spaces between shelves and support structures for such shelves, along with carriers or other housings that may be releasably inserted into channels of the cable housing assemblies, and configured to slide or otherwise translate within such channels.

The cable housing assemblies may be formed from frames of aluminum or other materials having front and rear panels (or plates) that are aligned in parallel with one another, at least in part, by one or more spacers to define storage volumes for accommodating one or more cables therein. The storage volumes may be sized to accommodate standard low-voltage connectors, such as Ethernet cables, which may enter the storage volumes via openings above or below the cable housing assemblies and terminate at one of the carriers or housings.

Where the cables within the storage volumes have sufficient slack, the carriers or housings may be slid or translated along the lengths of the channels. Therefore, where one or more of the cable housing assemblies of the present disclosure are installed along a backerboard or another like surface, between the backerboard and a shelf, a carrier or housing may be repositioned, as necessary or desired, in order to make electrical or communications services available at selected positions.

Figure 1A:
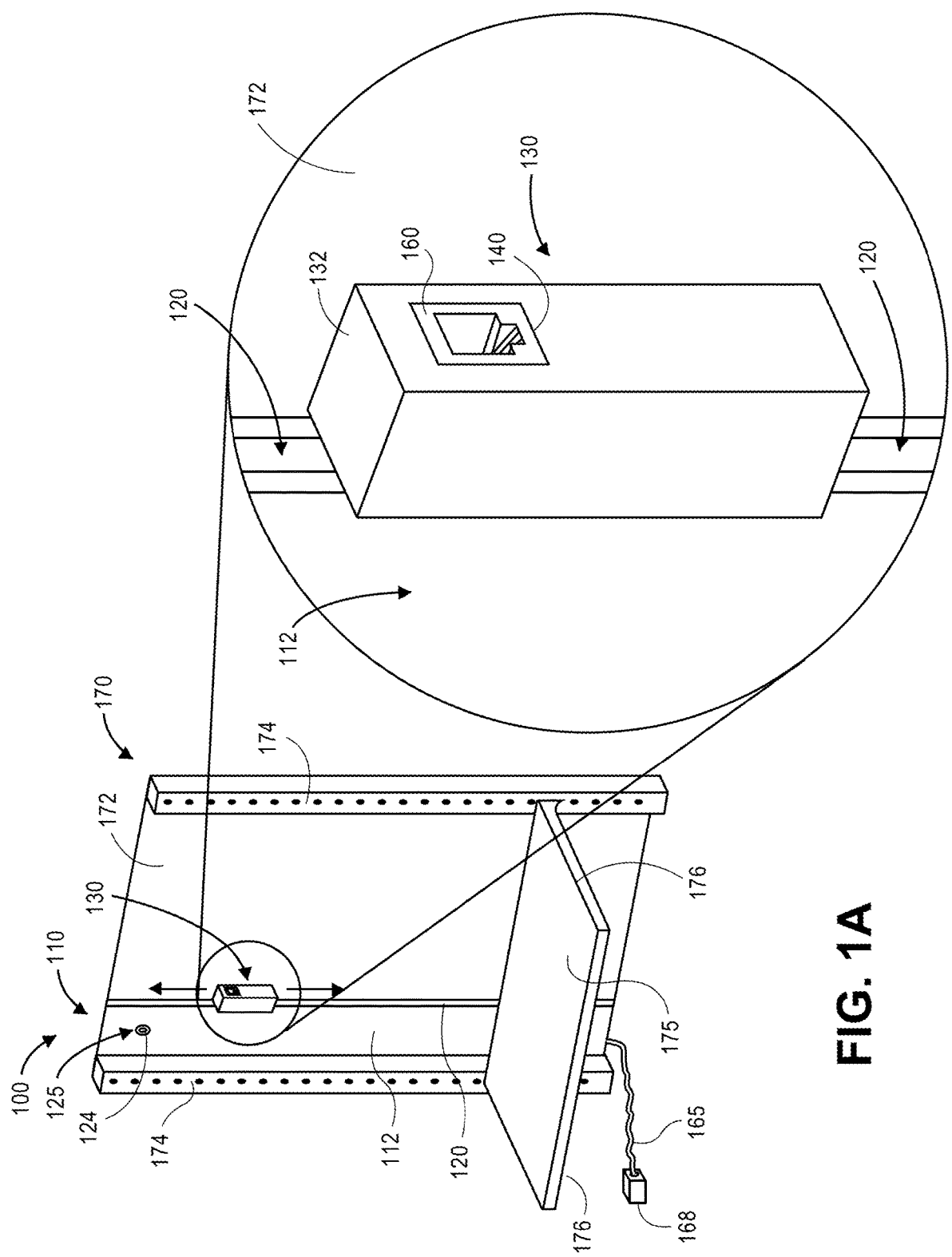
FIGS. 1A through 1F are views of components of one cable housing assembly in accordance with implementations of the present disclosure.

Referring to FIGS. 1A through 1F, views of components of one cable housing assembly in accordance with implementations of the present disclosure are shown. Referring to FIG. 1A, a perspective view of a storage system 100 having a cable housing assembly 110 mounted to a storage unit 170 is shown. The cable housing assembly 110 includes a frame 112 mounted to a backerboard 172 or other surface of the storage unit 170 by a fastener 125 which extends through a mounting bore 124 and into the backerboard 172. The storage unit 170 may be a gondola-type shelving unit having a pair of slotted shelf supports 174, a shelf 175 and a pair of brackets 176. Each of the brackets 176 is inserted into one of the shelf supports 174, which are aligned substantially in parallel with one another, and the shelf 175 rests on or is otherwise supported by the brackets 176. In some implementations, each of the shelf supports 174 may be mounted to the backerboard 172, e.g., by a rear face of the shelf support 174, and may include a plurality of vertically co-aligned slots, e.g., on a front face of the shelf support 174, with each of the first plurality of slots being separated by a predetermined vertical distance. In some other implementations, each of the brackets 176 may include one or more hooks that are configured to mate with one or more of such slots. For example, a bracket may include a pair of hooks that are separated by the same vertical distance as the slots on the shelf support 174, or by multiples of the vertical distance.

The frame 112 has a substantially flat shape and is mounted alongside one of the shelf supports 174, e.g., in parallel with each of the shelf supports 174, with a thickness that may be accommodated between a back edge of the shelf 175 and the backerboard 172. In some implementations, the frame 112 has a thickness that is less than a thickness of each of the shelf supports 174, thereby enabling the frame 112 to be installed between the back edge of the shelf 175 and the backerboard 172. The frame 112 may comprise one or more panels 114 formed from any type or form of materials, including but not limited to lightweight metals such as aluminum or lightweight steel alloys. In some implementations, the frame 112 may be formed by one or more extrusion processes. In some other implementations, however, the frame 112 may be formed in any manner. Additionally, the frame 112 may have any length, and may be specifically sized upon formation, or cut, ground, trimmed or otherwise modified, to correspond with a length of the storage unit 170. Although the frame 112 is shown as being in contact with one of the shelf supports 174, those of ordinary skill in the pertinent arts will recognize that the frame 112 need not contact the shelf support 174, nor be installed adjacent to the shelf support 174. For example, the frame 112 may be installed in a substantially central location between the shelf supports 174. Furthermore, the frame 112 need not be installed between the shelf supports 174, and may, in some implementations, be installed on either side of either of the shelf supports 174. Moreover, in some implementations, two or more of the frames 112 may be installed in association with the shelf supports, either in parallel to one another, or in series, e.g. stacked atop one another.

As is shown in FIG. 1A, a channel 120 is provided along one edge of the frame 112. A cable carrier 130 is slidably inserted into the channel 120, and configured to translate in either direction within the channel 120, e.g., up or down. The cable carrier 130 includes a housing (or a frame) 132 defined from a plurality of panels and having an external shape that is substantially rectangular. Additionally, as is also shown in FIG. 1A, a jack 160 (e.g., a keystone jack or module) disposed in the housing 132 has a female port that extends through an opening 140 in one face of the housing 132 of the cable carrier 130, and is configured to receive a male end of a cable inserted therein, e.g., by a snap fit. In some implementations, the jack 160 may be an adapter or port associated with a low-voltage power or communications signal, such as a telephone jack, an Ethernet jack, or any other type or form of jack. The jack 160 may have an outer face of any shape, e.g., rectangular, such as is shown in FIG. 1A, round, or any other shape, and the outer face of the jack 160 may be flush with the face of the housing 132 through which the jack 160 is inserted. Alternatively, the jack 160 may be extended from the face of the housing 132 by a predetermined distance, or recessed within the face of the housing 132 by a predetermined distance.

As is also shown in FIG. 1A, a cable 165 may be provided within a void (not shown) within the frame 112, extending from an underside of the cable housing assembly 110 to a location on the frame 112 where the cable carrier 130 is located. One end of the cable 165 is coupled with the jack 160 and another end extends freely below the cable housing assembly 110, with a male plug 168. Thus, the cable housing assembly 110 may make electrical or communications available at the cable carrier 130, by way of the jack 160, by inserting the male plug 168 into a port or module that is energized, or connected to a network source.

Figure 1B:
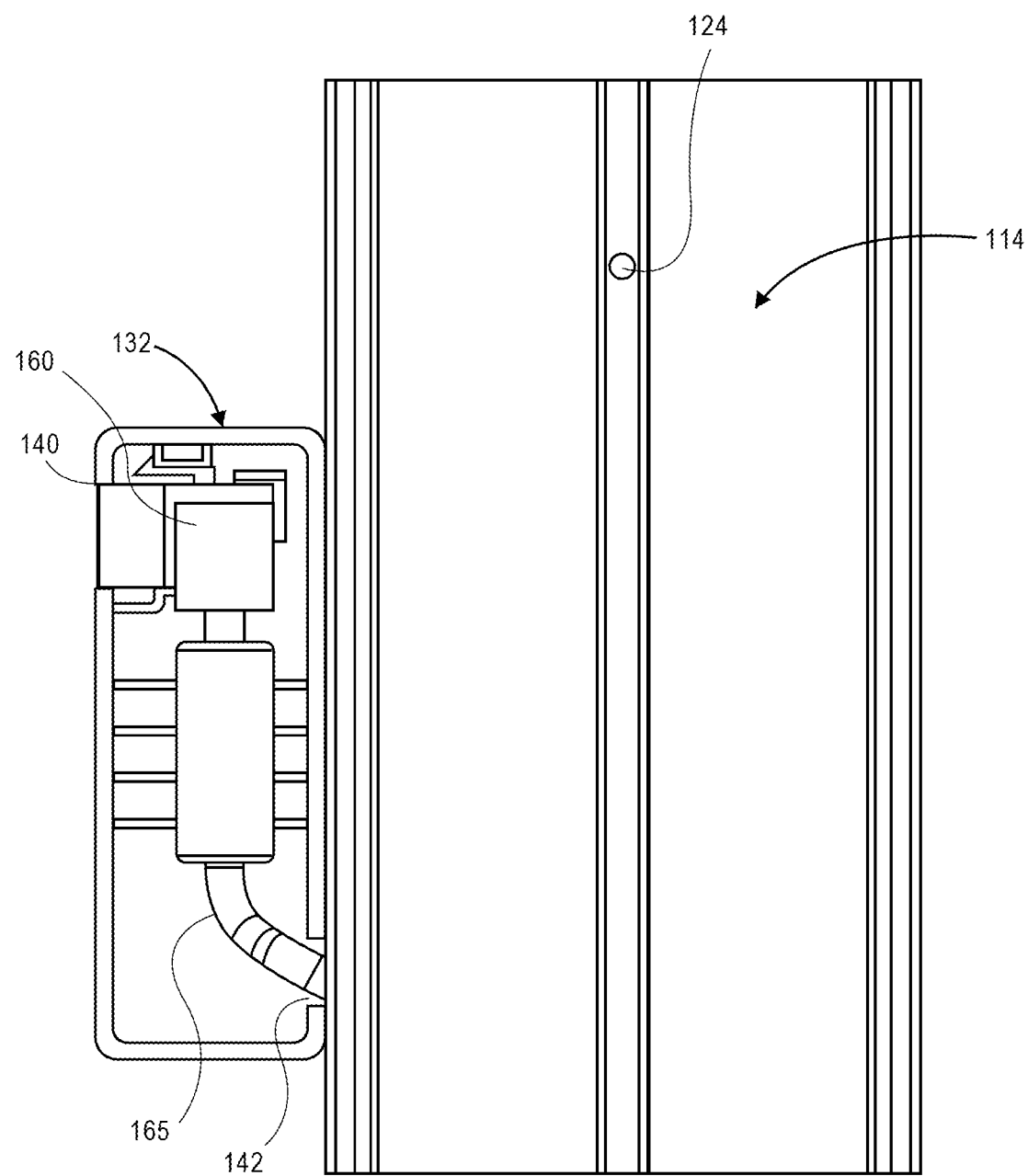

Referring to FIG. 1B, a rear view of a portion of the cable housing assembly 110 including a portion of the frame 112 and the cable carrier 130 is shown. As is shown in FIG. 1B, a portion of the cable 165 passes from a void within the frame 112 of the cable housing assembly 110 and into the housing 132 of the cable carrier 130 by way of a channel hole 142. The end of the cable 165 is coupled to the jack 160, which is mounted within the housing 132 of the cable carrier 130. Alternatively, in some implementations (not shown in FIG. 1B), the cable carrier 130 may further include an additional panel defining a rear face of the housing 132 and covering a cavity or opening within which the jack 160 is mounted. The panel defining the rear face may be hinged or otherwise connected to one or more of the panels defining the housing 132, enabling the housing 132 to be opened or closed, as necessary, such as to mount the jack 160 within the housing 132.

Figure 1C:
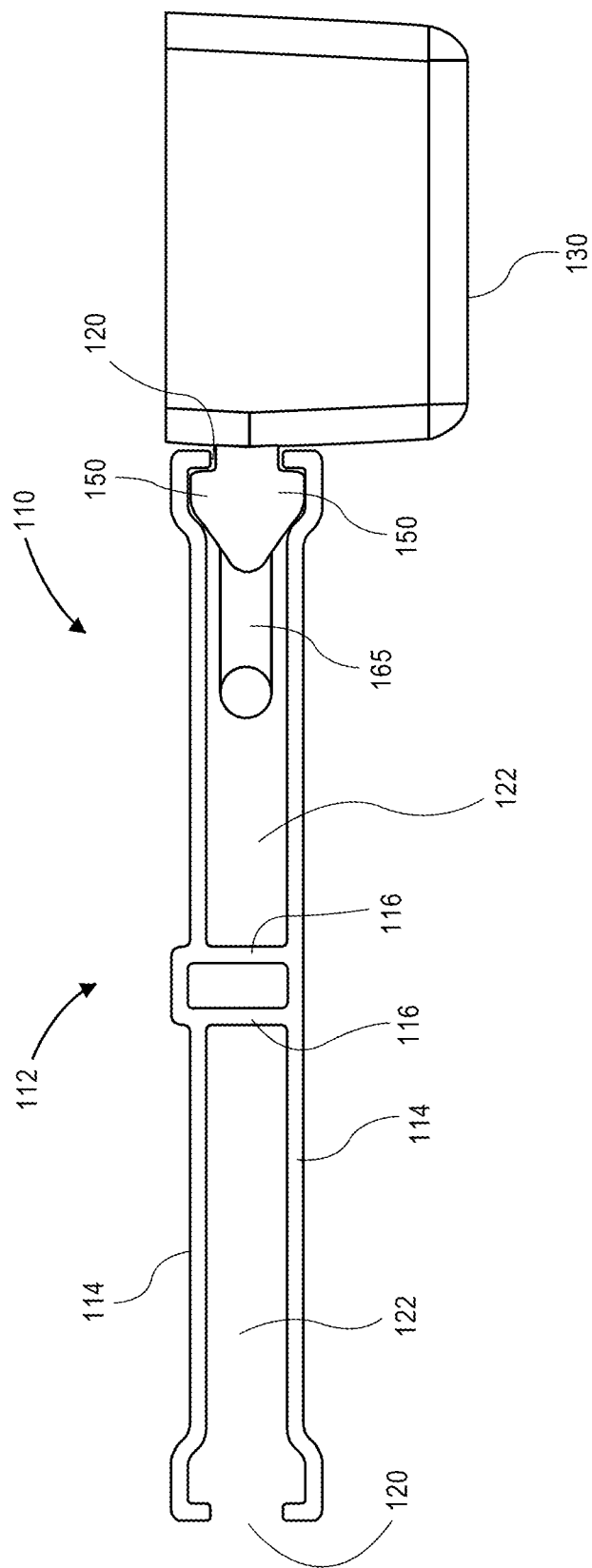

Referring to FIG. 1C, a top view of a portion of the cable housing assembly 110 and the cable carrier 130 are shown. As is shown in FIG. 1C, the frame 112 of the cable housing assembly 110 is formed from a pair of panels 114 and a pair of spacers 116, each of which is substantially parallel to one another. The panels 114 and the spacers 116 are coupled to one another in a substantially perpendicular (or normal) configuration. The distance between the panels 114 defines a pair of channels 120 on the respective long edges of the frame 112, and a pair of voids 122 on either sides of the spacers 116, between the spacers 116 and the channels 120. The voids 122 are sized to accommodate portions of one or more cables, e.g., the cable 165, to extend therethrough. The mounting bore 124 (not shown in FIG. 1C) thus extends through each of the panels 114, and between the spacers 116.

As is also shown in FIG. 1C, the cable carrier 130 comprises a plurality of tapered retention elements 150 which may be sized and shaped for insertion into either of the channels 120, and are joined to the housing 132 by necked extensions that are narrower than maximum widths (e.g., heads) of the tapered retention elements 150. For example, whereas the tapered retention elements 150 have a shape of a spade or triangle, the channels 120 defined by the ends of the panels 114 may be bent, rounded or otherwise formed into a shape that may snugly accommodate the tapered retention elements 150 therein. For example, as is shown in FIG. 1C, ends of the panels 114 are bent or otherwise rounded to encompass the heads of the tapered retention elements 150 within the channels 120.

In some implementations, friction between outer surfaces of the tapered retention elements 150 and inner surfaces of the panels 114 which define the channels 120 is sufficiently low to enable the cable carriers 130 to slide vertically within the channels 120 when an external force is imparted thereon, e.g., by hand, and yet sufficiently great to maintain the cable carriers 130 at desired vertical positions within the channels 120 when the external force is removed.

Figure 1D:
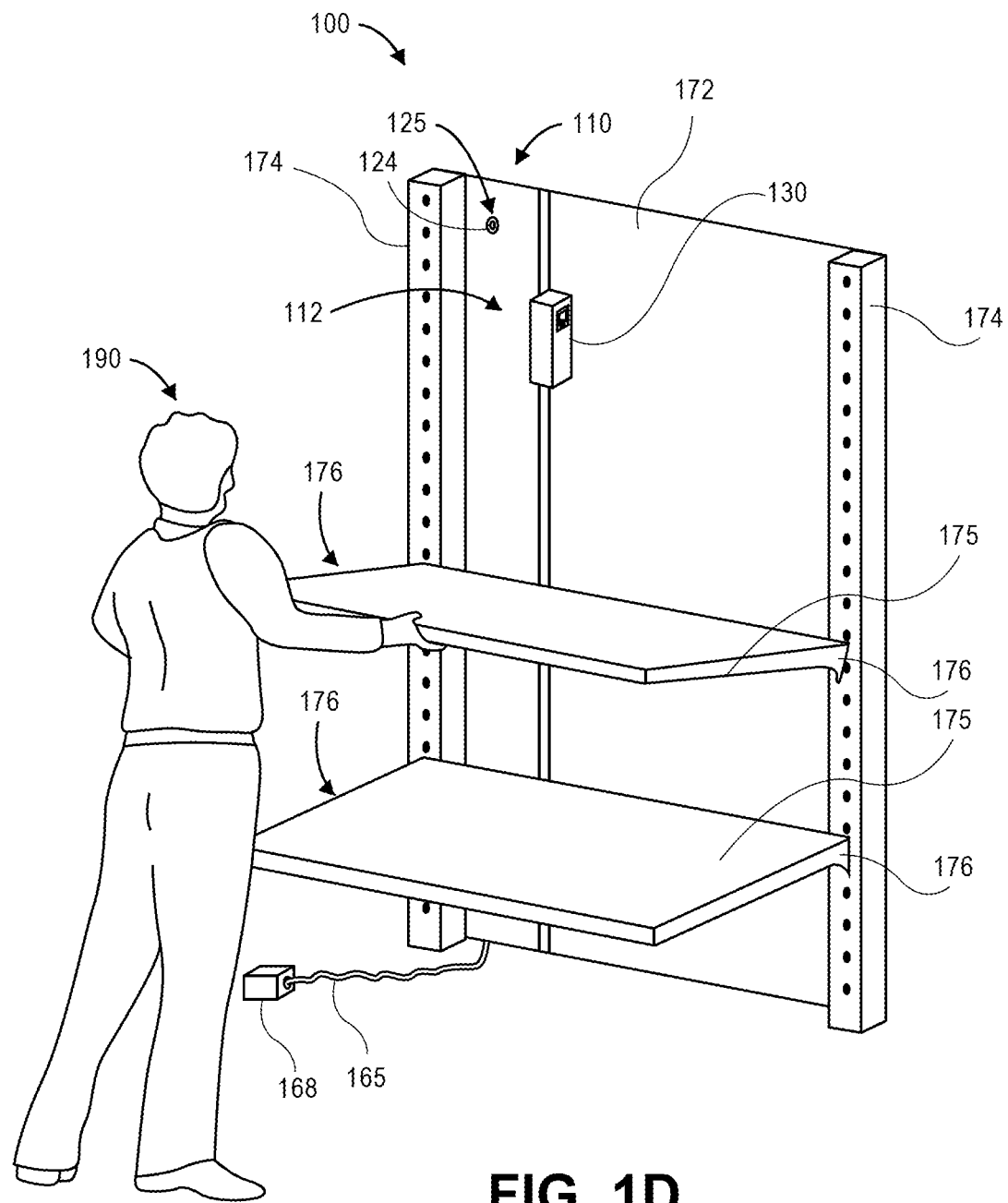
Figure 1E:
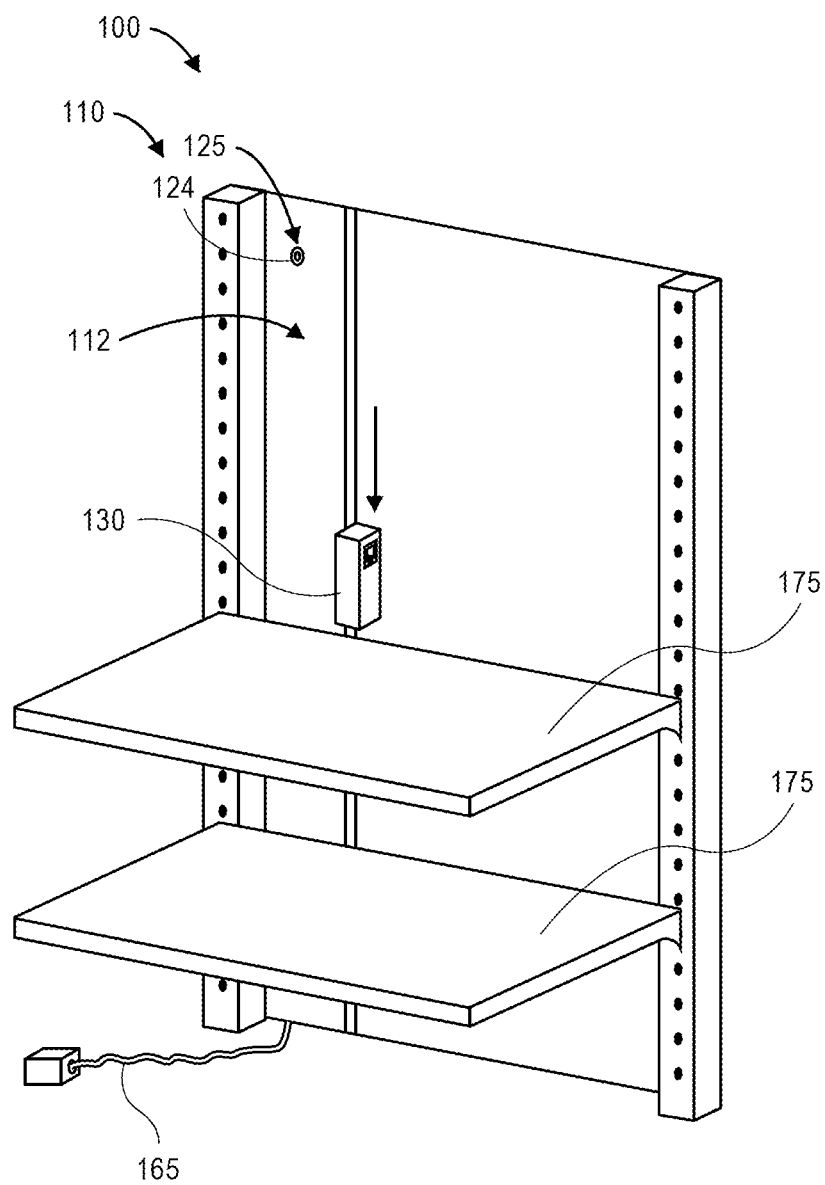

As is shown in FIG. 1D, another shelf 175 may be installed on the storage unit 170 by inserting another pair of brackets 176 into the shelf supports 174, and coupling the shelf 175 to the brackets 176. As is shown in FIG. 1E, after the shelf 175 has been installed on the storage unit 170, the cable carrier 130 may be positioned in a desired vertical position with respect to the cable housing assembly 110, in a manner that places the jack 160 at a desired height with respect to the shelf 175. The cable carrier 130 may be positioned in contact with the shelf 175, or at a selected distance from the shelf 175, e.g., within a range of a cable or connector of a system component to be placed thereon. Although the cable carrier 130 is shown as being positioned vertically above the shelf 175 that was installed on the storage unit 170, as shown in FIG. 1D, those of ordinary skill in the pertinent arts will recognize that a cable carrier, such as the cable carrier 130 of FIGS. 1A through 1F, may be positioned vertically below the shelf 175, and one or more cables or connectors of a system component to be placed thereon may extend below the shelf 175, e.g., through a space between the back edge of the shelf 175 and the backerboard 172.

In some implementations, the cable carrier 130 has a thickness that is less than the thicknesses of the shelf supports 174, thereby enabling the cable carrier 130 to slide freely to desired heights in either direction along a length of the channel 120 between the back edge of the shelf 175 and the backerboard 172. In some implementations, the cable carrier 130 has a thickness that is greater than a thickness of the shelf supports 174. In such implementations, the cable carrier 130 may slide freely to desired heights along a length of the channel 120 when the shelves 175 are not installed, and may slide freely along portions of the length of the channel 120 between the shelves 175 after the shelves 175 have been installed. Furthermore, in some implementations, the features of a shelf support may be combined with features of a cable housing assembly, such that shelves may be mounted to a first face of the combined assembly, e.g., in one or more of a plurality of vertically aligned slots, and cable carriers may be slidably installed in a second face of the combined assembly, e.g., in a channel defined by edges of two or more panels of the combined assembly.

Figure 1F:
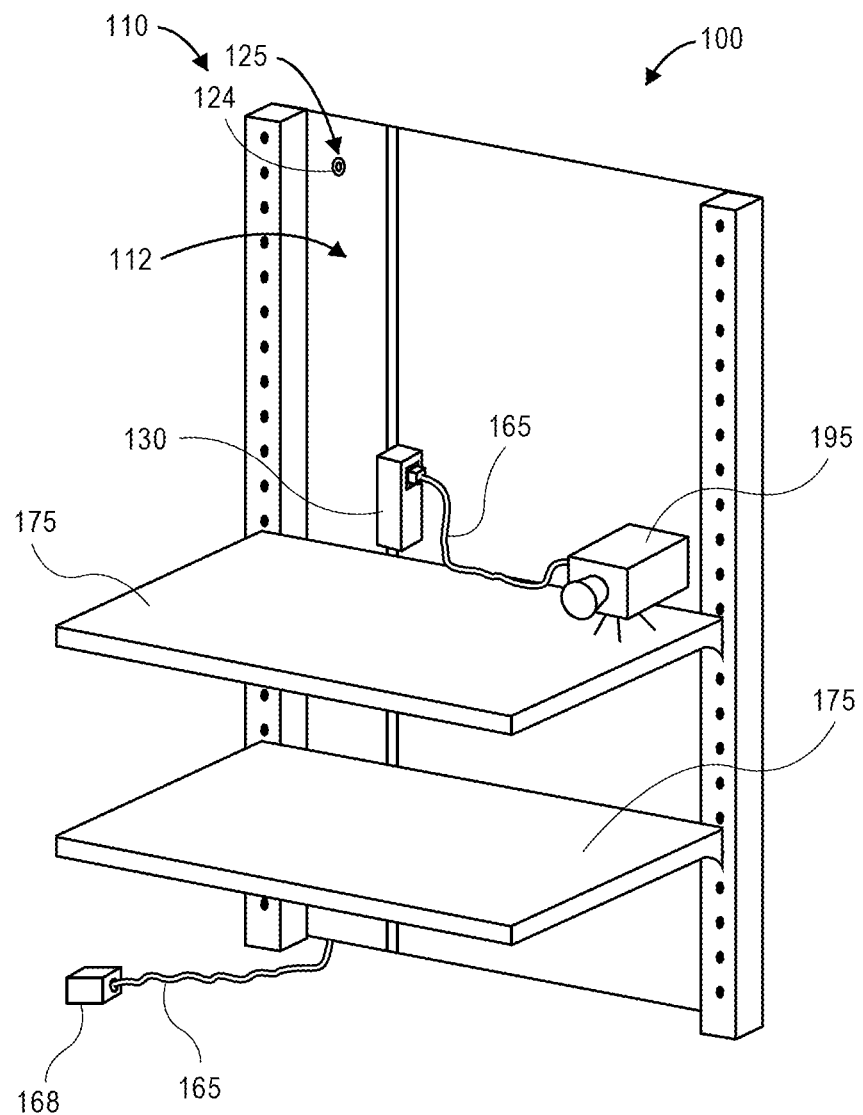

As is shown in FIG. 1F, with the jack 160 at the desired height, a networked component 195 (e.g., an imaging device having at least a portion of the shelf 175 within a field of view) may be installed on the shelf 175, or provided in association with the shelf 175, and connected to the jack 160 by a cable 165.

A shelf may be utilized to provide support for items of varying sizes, shapes or masses, where such items or their containers include one or more flat surfaces that may be safely rested upon surfaces of the shelf, so long as the shelf may properly accommodate each of the items' collective masses, volumes or surface areas. In some instances, a shelf may be releasably mounted to pegboards, panels or other structural features provided within a materials handling facility (e.g., within one or more inventory areas therein) in a releasable manner that enables the shelf to be quickly and easily removed from a structural feature and installed in different locations on the structural feature, or on one or more other structural features throughout the materials handling facility. Some structural features may be configured to accommodate shelves in any number of predetermined locations in three-dimensional space within a materials handling facility.

Shelves are widely used for storing items on a short-term or a long-term basis. Shelves are commonly found in residences (e.g., within living spaces or storage areas such as closets in homes or apartments or condominiums), commercial settings (e.g., warehouses, fulfillment centers or retail establishments) or industrial facilities (e.g., factories), and are particularly beneficial based on their simplicity of design and ease of access.

As is discussed above, the present disclosure is directed to systems and methods for mounting cables or wires or other conductors in association with storage facilities, such as shelves or other storage units or apparatuses, in order to provide electrical or communications services to such shelves at various locations. More specifically, the systems and methods of the present disclosure are directed to cable housing assemblies that may be installed in narrow, low-clearance spaces between shelves and support structures for such shelves, along with cable housings that may be releasably inserted into channels of the cable housing assemblies, and configured to slide or otherwise translate within such channels.

In some implementations, a cable housing assembly (or cable management systems) enables cables to be routed vertically along a mounting surface of a shelving system or other storage unit. The cable housing assembly may be utilized in connection with adjustable or modular storage units having shelves at varying heights and which require connections to one or more power or communications services. In some implementations, a frame of a cable housing assembly may include vertical channels that are sized to accommodate the routing of one or more cables therethrough, including but not limited to low-voltage cables such as Ethernet cables, telephone cables, coaxial cables or the like. The frame may be installed between a backerboard or other mounting surface and one or more shelves. Cables may be routed through voids within the frame to carriers that are slidably mounted in channels of the frame and include jacks, ports, sockets or other modules for enabling power or network connectivity by way of such cables. Thus, in some implementations, the cable housing assemblies of the present disclosure may be retroactively installed, e.g., back-fitted, into existing shelves or storage units in order to provide power or network connectivity to such shelves or units. Alternatively, the cable housing assemblies of the present disclosure may be incorporated into shelves or storage units upon their initial construction.

The cable housing assemblies of the present disclosure may include frames and cable carriers that are formed from any material of sufficient strength, rigidity or durability, and in any manner. In some implementations, the frames may be formed from aluminum or aluminum alloys, e.g., aluminum 6063 (or A6063), or from metals other than aluminum, such as steels. The metals may be anodized or otherwise treated in any manner. In some other implementations, the frames may be formed from plastics (e.g., thermosetting plastics such as epoxy or phenolic resins, polyurethanes or polyesters, as well as polyethylenes, polypropylenes or polyvinyl chlorides), wood (e.g., woods with sufficient strength properties such as ash), composites or any other combinations of materials. The frames may be formed by extrusion (e.g., hot or cold), rolling, forging, drawing, bending or shearing, or any other processes. Additionally, the frames may include voids that are sized, shaped or configured to accommodate any number of cables therein, and channels on edges of such frames that are sized, shaped or configured to receive one or more cable carriers slidably mounted therein.

In some implementations, the cable carriers may be formed from plastics of any kind, e.g., acrylonitrile butadiene styrenes (or "ABS"), and may be formed with a plurality of panels of any size or shape. For example, in some implementations, the cable carriers may take the form of substantially rectangular cavities or hollows having one or more open sides. Alternatively, in some other implementations, the cable carriers may have shapes that are substantially round, conic, parabolic, oblong or others. The cable carriers may also be formed by any process, e.g., injection molding, or by any other form of forming or molding (e.g., rotational molding, extrusion molding, vacuum casting, thermoforming, compression molding).

The cable carriers may further include one or more openings for receiving jacks, sockets, ports or other modules that are configured to provide connections to power or communications systems external to such carriers, along with one or more mounting components for securing such jacks, sockets, ports or modules within such carriers. The cable carriers may also include one or more openings for receiving cables or other connectors that are coupled to such power or communications systems. Such openings may be aligned with a channel of a cable housing assembly frame, such that a cable may be extended from a jack, a socket, a port or another module of a cable carrier into the channel, and ultimately to a connection with one or more power or communications systems. The cable carriers may further include cable guides that are aligned to provide support for cables extending from cable carriers into channels, thereby reducing the extent to which slack or other unused length of cables within voids of frames may come into contact with one another, or may otherwise impede the translation of cable carriers within such channels.

The cable housing assemblies of the present disclosure may be utilized to make connections to any type or form of power or communication systems available to any number of shelves or storage units, within substantially narrow spaces, e.g., between a backerboard or surface to which a storage unit is mounted, and a back edge of one or more shelves of the storage unit, such as is shown in FIG. 1A. The cable housing assemblies may be sized, shaped and configured to accommodate any type or form of cable or connector for providing power or communications connections to any type or form of systems, including audio systems (e.g., speakers, including but not limited to "smart speakers"), video systems (e.g., cameras or other visual sensors, or flat panel monitors or other displays), telephone systems (e.g., landline handsets, cordless telephone bases, fax machines), network communication systems (e.g., modems, routers or network switches), which may be placed on shelves or other storage units within a vicinity of one or more cable carriers of the present disclosure and connected thereto.

For example, in some implementations, the cable housing assemblies may be sized, shaped and configured to accommodate one or more network cables, such as Ethernet cables, including but not limited to Category 3, Category 5, Category 5e, Category 6, Category 6a or Category 7 cables, which may be unshielded twisted pair cables, shielded twisted pair cables, or any other type or form of cables. In some implementations, the cable housing assemblies may also be sized, shaped and configured to accommodate audio or video cables, including but not limited to telephone cables, fiber optic cables, speaker wires (of any gauge or length), RCA cables, F-pin cables, S-video cables, Y/C-cables, coaxial cables, Digital Visual Interface (or "DVI") cables, High Definition Multimedia Interface (or "HDMI") cables, or others. In some other implementations, the cable housing assemblies may also be sized, shaped and configured to accommodate any type of power cables or connectors, including not only low-voltage cables having any number of cores and any type of insulation, but also cables having standard or nominal voltage capacities, e.g., one hundred ten volt (110 V) or two hundred twenty volt (220 V) cables. Such cables may be grounded or ungrounded, and may feature plugs and/or sockets having any number of pins, voltage ratings or current ratings. For example, in some implementations, the cables may have any male ends or plugs (e.g., 8P8C plugs, 6P6C plugs, 6P4C plugs, 4P4C plugs, or any other type of male ends of plugs) and/or any female jacks, sockets, ports or modules (e.g., RJ11, RJ14, RJ25, RJ45S, RJ49, RJ61, or any other type of female jacks, sockets, ports or modules).

The type or form of cables that may be provided in a cable housing assembly of the present disclosure are not limited. Rather, any cable having a male or female connector that may be supported within a cable carrier, e.g., a jack, a socket, a port, a module, a plug or another component, and a portion that may extend through the cable carrier and into a frame by way of a channel into which the cable carrier is mounted, may be provided in a cable housing assembly in accordance with the present disclosure.

Additionally, in some implementations, such as the cable carrier 130 of FIGS. 1A through 1F, a cable carrier of a cable housing assembly may be configured to provide support for a female-type connector, e.g., a jack, a socket, a port, or another module, into which a male-type connector, e.g., a plug or an end, associated with a system provided on a shelf or other storage unit associated with the cable housing assembly may be inserted. Alternatively, in some implementations, a cable carrier may be configured to provide support for a male-type end which may be inserted into a female-type connector associated with a system provided on a shelf or other storage unit associated with the cable housing assembly. Moreover, although some of the implementations disclosed herein include cable carriers having a single jack, socket port or other module coupled to a single cable for providing a connection to a single power source or communications system via the cable carriers, those of ordinary skill in the pertinent arts will recognize that a cable carrier may have multiple jacks, sockets, ports or modules, each coupled to a cable for providing connections to multiple power sources or communications systems via the cable carrier.

Referring to FIGS. 2A through 2G, views of components of one cable housing assembly frame 212 in accordance with implementations of the present disclosure are shown. Except where otherwise noted, reference numerals preceded by the number "2" shown in FIGS. 2A through 2G indicate components or features that are similar to components or features having reference numerals preceded by the number "1" shown in FIGS. 1A through 1F.

Figure 2A:
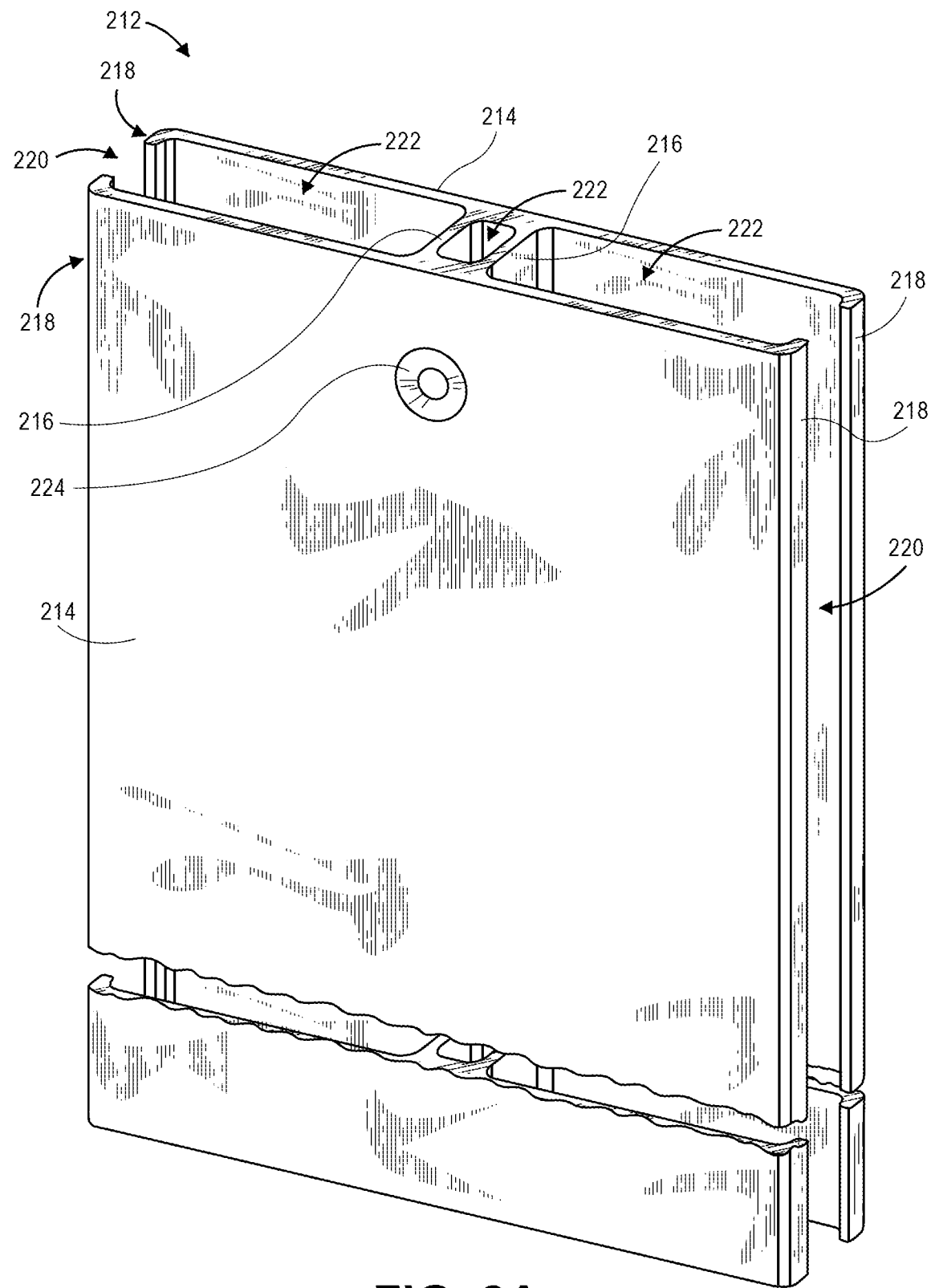
FIGS. 2A through 2G are views of components of one cable housing assembly frame in accordance with implementations of the present disclosure.

Referring to FIG. 2A, a front perspective view of the frame 212 is shown. The frame 212 comprises a pair of panels 214 and a pair of spacers 216. The panels 214 are substantially smooth and continuous, and aligned substantially parallel to one another. The panels 214 are coupled to one another by the spacers 216, which maintain the panels 214 at a substantially fixed distance with respect to one another.

The frame 212 further comprises a pair of channels 220, one on a left side of the frame 212 and one on a right side of the frame 212. The channels 220 are sized to accommodate one or more retention elements of cable carriers, such as the tapered retention elements 150 of the cable carrier 130 of FIGS. 1A through 1F. Such retention elements may be releasably inserted into one or both of the channels 220, thereby enabling a cable carrier to be slidably maintained in place therebetween. Additionally, as is shown in FIG. 2A, each of the panels 214 has edges 218 that are rounded or otherwise bent inwardly toward one another. Thus, when retention elements of a cable carrier having a head of a maximum width and a necked extension, e.g., the tapered retention elements 150 of the cable carrier 130 shown in FIG. 1C, are inserted into one of the channels 220, the panels 214 act as flexures, and temporarily widen in order to accommodate such retention elements. After portions of such retention elements have been sufficiently inserted into the channels 220, the panels 214 will contract, and the edges 218 will elastically return to form after enveloping the heads of such retention elements.

As is also shown in FIG. 2A, the panels 214 and the spacers 216 define a plurality of voids 222 within a cross-section of the frame 212. For example, as is shown in FIG. 2A, the frame 212 includes a single void 222 between the spacers 216, e.g., in a central region of the frame 212, as well as a pair of voids between one of the channels 220 and one of the spacers 216. A mounting bore 224 extends through a first one of the panels 214 (e.g., a front panel), into the one of the voids 222 in the central region of the frame 212 and through a second one of the panels 214 (e.g., a rear panel).

Figure 2B:
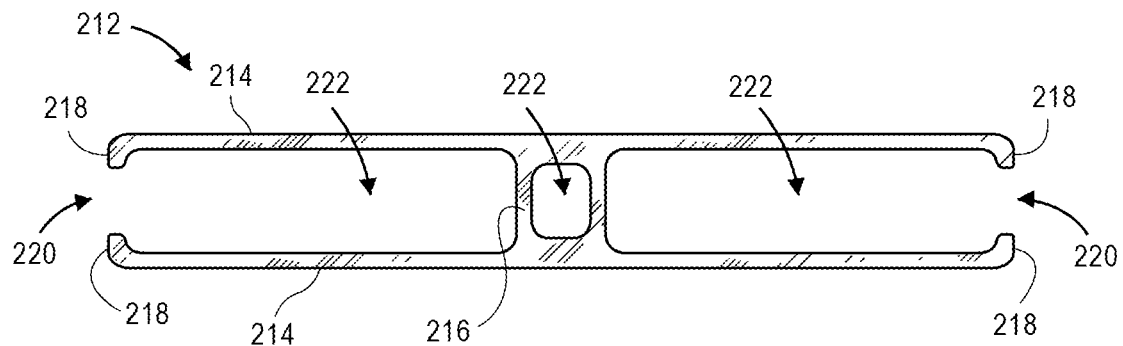

Referring to FIG. 2B, a top view of the frame 212 is shown. The top view of the frame 212 shows the voids 222 provided between the channels 220 and the spacers 216, and the void 222 provided between the spacers 216. The lengths of the spacers 216 define the maximum widths of the voids 222, and may be selected based on a dimension of a cable to be accommodated therein, e.g., a Category 6 Ethernet cable having an average diameter of approximately 0.250 inches (or 6.10 millimeters), a coaxial cable having an average diameter of approximately 0.332 inches (or 8.43 millimeters), an audio speaker wire having average dimensions of approximately 0.307×0.146 inches (or 7.80×3.70 millimeters), or a smoke alarm cable having an average diameter of approximately 0.208 inches (or 5.28 millimeters). Additionally, the widths of the panels 214 define the maximum lengths of the voids 222, and may be selected based on a number of cables to be accommodated therein. In some implementations, the panels 214 may be sized to accommodate a single cable within one of the voids 222. In some other implementations, however, the panels 214 may be sized to accommodate any number of cables within one of the voids 222, e.g., two or more of such cables.

Figure 2C:
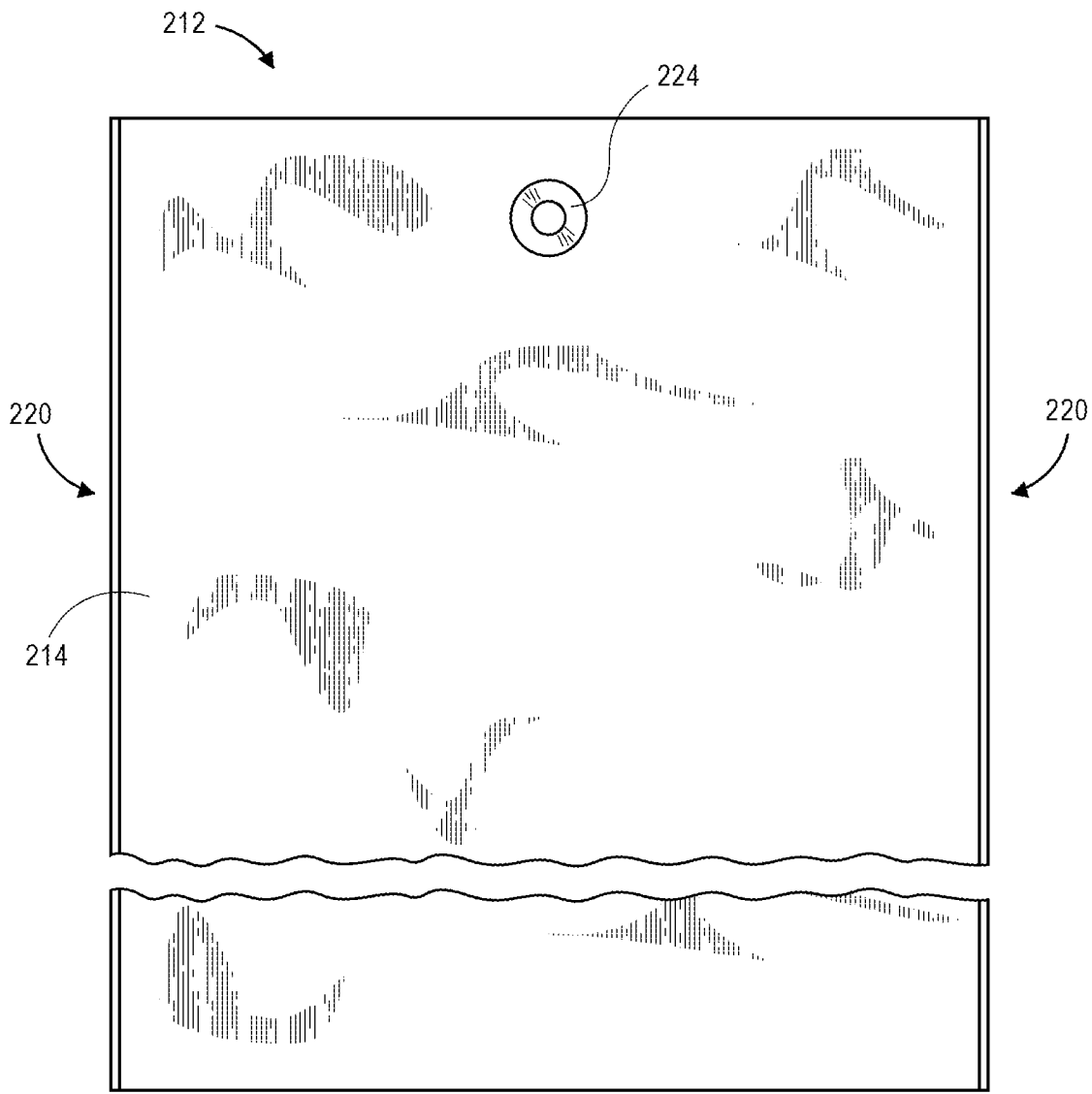

Referring to FIG. 2C, a front view of the frame 212 is shown. The frame 212 may be formed from any material of sufficient strength, rigidity or durability. For example, in some implementations, the frame 212 may be formed from aluminum or aluminum alloys, e.g., aluminum 6063 (or A6063), that may be anodized or treated in any manner. In some other implementations, however, the frame 212 may be formed from plastics (e.g., thermosetting plastics such as epoxy or phenolic resins, polyurethanes or polyesters, as well as polyethylenes, polypropylenes or polyvinyl chlorides), wood (e.g., woods with sufficient strength properties such as ash), metals other than aluminum (e.g., metals of heavier weights such as alloys of steel), composites or any other combinations of materials. In some implementations, the components of the frame 212 (e.g., the panels 214 and the spacers 216) may be integrally formed from a common material in a homogenous manner. Alternatively, in some other implementations, the components of the frame 212 may be formed from different materials, e.g., in a heterogeneous manner, either integrally or as discrete components that are subsequently joined to one another. Additionally, the frame 212 may also be formed by any suitable process. For example, the frame 212 may be formed by extrusion (e.g., hot or cold), rolling, forging, drawing, bending or shearing, or any other processes.

Figure 2D:
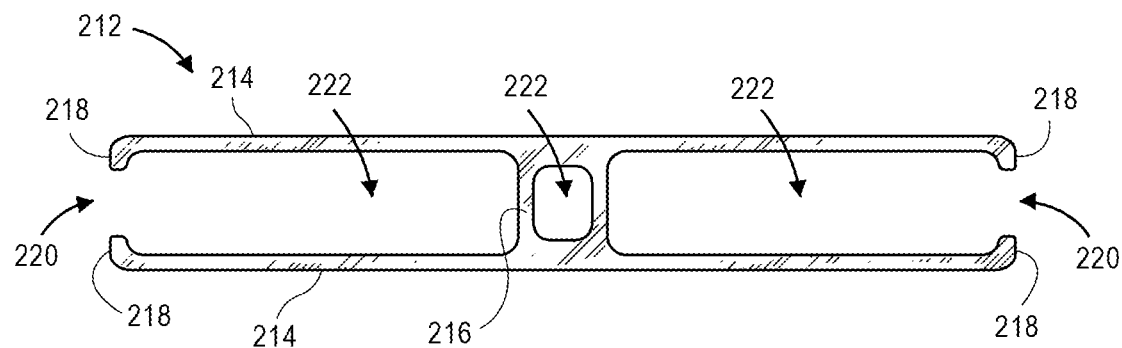

Referring to FIG. 2D, a bottom view of the frame 212 is shown. As is shown in FIG. 2D, the frame 212 has a substantially constant cross-section along its length, and the voids 222 extend unimpeded between a top of the frame 212, as shown in FIG. 2B, and the bottom of the frame 212.

Figure 2E:
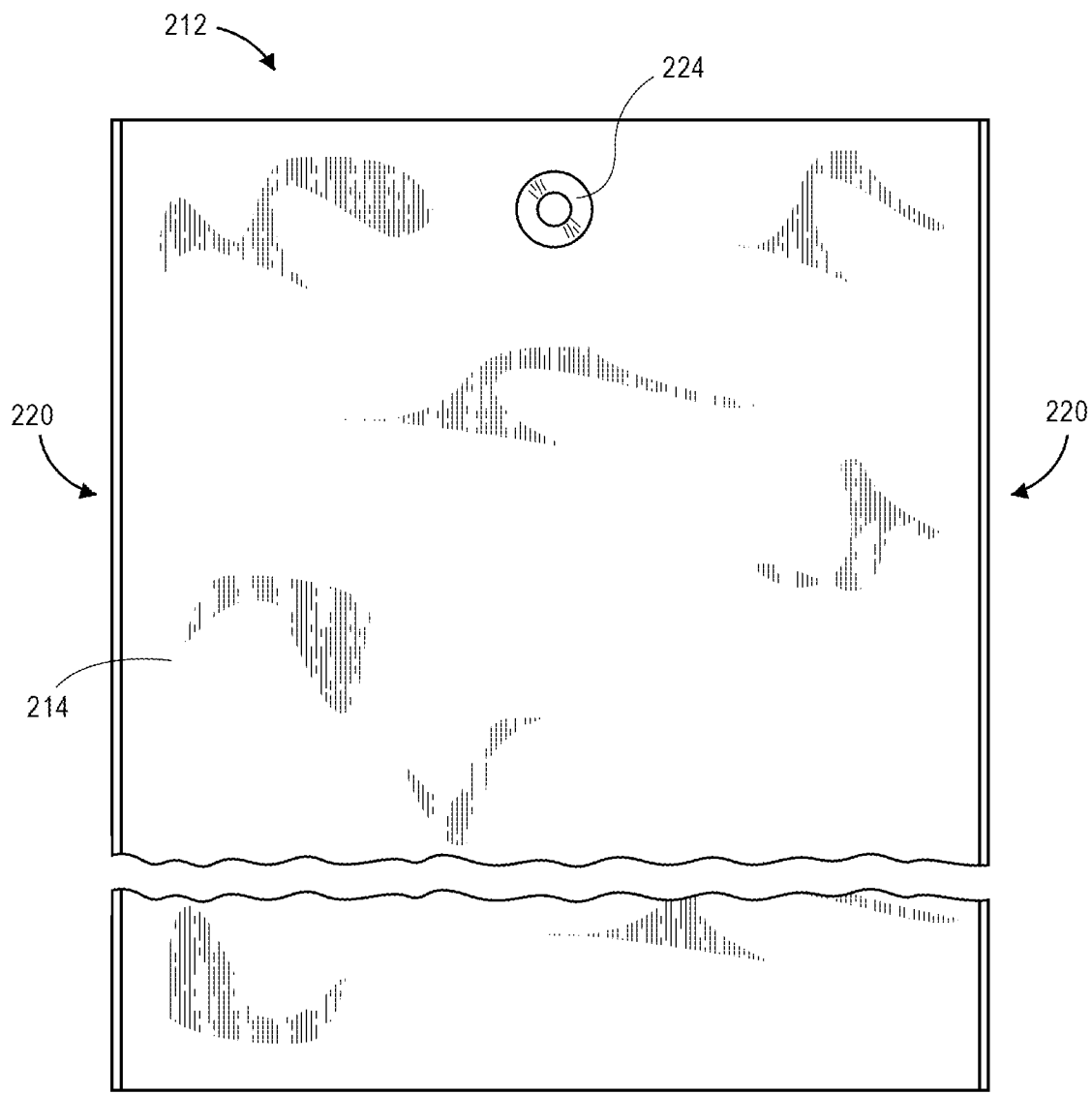

Referring to FIG. 2E, a rear view of the frame 212 is shown. As is shown in FIG. 2E, the mounting bore 224 extends through the front panel 214, one of the voids 222, and the rear panel 214. Although the frame 212 of FIGS. 2A through 2G includes a single mounting bore 224, those of ordinary skill in the pertinent arts will recognize that frames of the cable housing assemblies disclosed herein may include any number of mounting bores or other features for mounting such frames or such housing assemblies to a backerboard or other surface associated with a storage unit, or in any other locations.

Figures 2F, 2G:
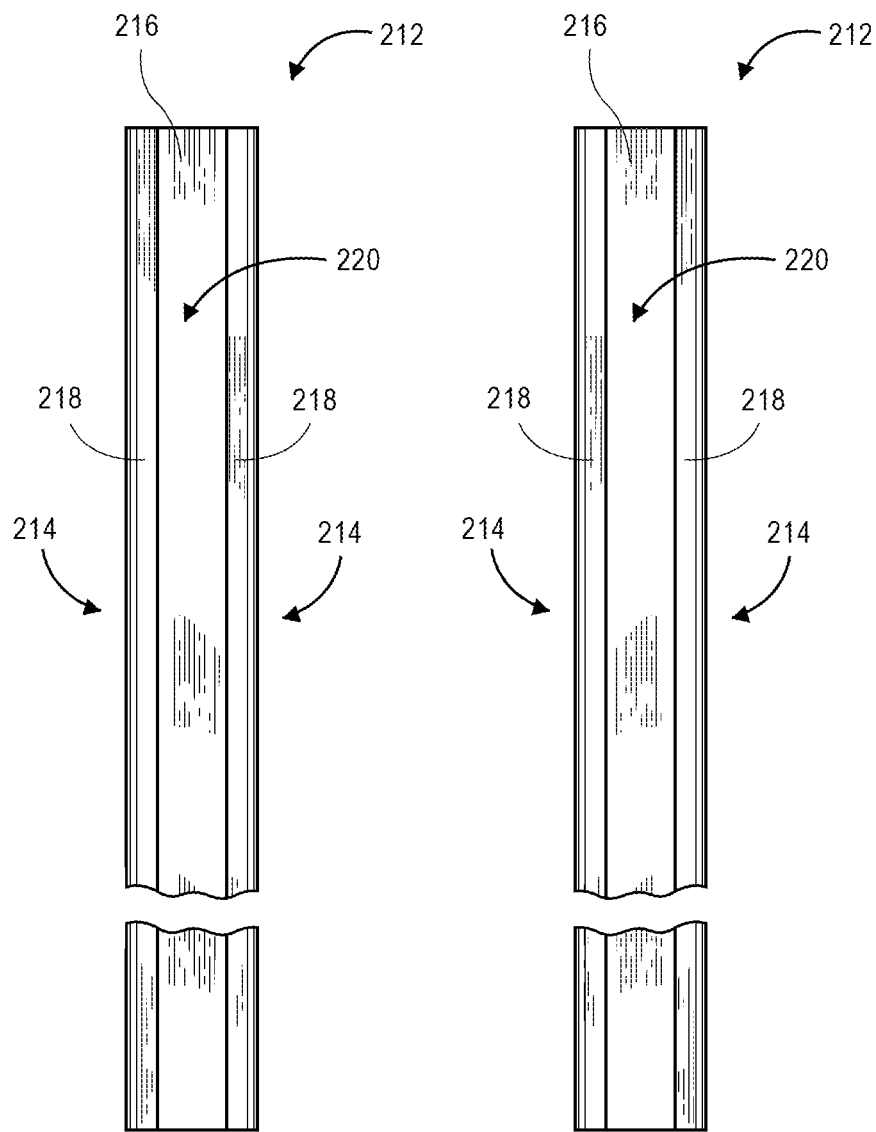

Referring to FIG. 2F, a left side view of the frame 212 is shown. Referring to FIG. 2G, a right side view of the frame 212 is shown. The frame 212 is substantially symmetrical, with channels 220 for accommodating cable carriers and voids 222 for accommodating wires of equal size, provided on either side of the frame 212. Alternatively, in some other implementations, a frame may be asymmetrical, with channels or voids of different sizes, or with a channel provided on one side of the frame, and with a closed end, e.g., one or more spacers, provided on another side of the frame.

Components of the cable housing assemblies of the present disclosure, including but not limited to the frame 212 of FIGS. 2A through 2G, may have any size or shape, or dimensions having any relation or proportion to one another. In some implementations, the cable housing assemblies disclosed herein may be formed in nominal lengths, such as ninety inches (90"), or fifty-four inches (54"). In some other implementations, the cable housing assemblies disclosed herein may be formed in any other lengths, or, once formed, shortened based on requirements or restrictions in one or more locations. For example, a frame, such as the frame 212 of FIGS. 2A through 2G, may be cut, trimmed, ground, bent or otherwise altered, as necessary, prior to installation on a backerboard of a storage unit or any other surface. Alternatively, two or more frames may be joined, e.g., by axial coalignment, in a manner that causes channels and voids of such frames to be functionally connected to one another. In such implementations, a cable carrier may be translated from one frame to another frame, and one or more cables may be extended from one void to another void.

Surfaces of the cable housing assembly frames of the present disclosure may be smooth or continuous, such as the panels 214 of the frame 212 of FIGS. 2A through 2G, or may have any other surface features or textures. Referring to FIGS. 3A through 3G, views of components of one cable housing assembly frame 312 in accordance with implementations of the present disclosure are shown. Except where otherwise noted, reference numerals preceded by the number "3" shown in FIGS. 3A through 3G indicate components or features that are similar to components or features having reference numerals preceded by the number "2" shown in FIGS. 2A through 2G or by the number "1" shown in FIGS. 1A through 1F.

Figure 3A:
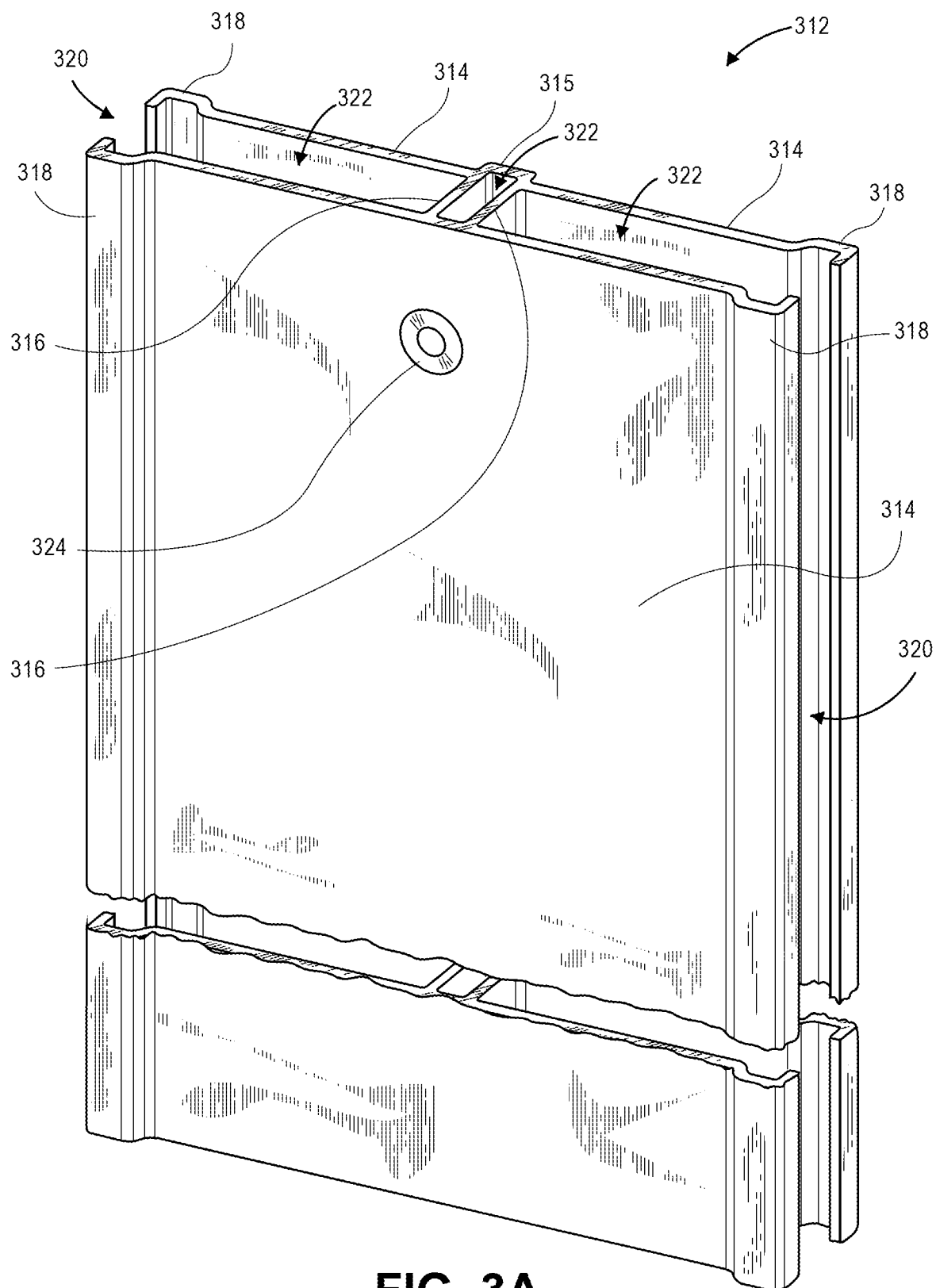
FIGS. 3A through 3G are views of components of one cable housing assembly frame in accordance with implementations of the present disclosure.

Referring to FIG. 3A, a front perspective view of the frame 312 is shown. The frame 312 comprises a pair of panels 314 and a pair of spacers 316. A mounting bore 324 extends through a first one of the panels 314 (e.g., a front panel), into a void 322 in a central portion of the frame 312, and through a second one of the panels 314 (e.g., a rear panel), e.g., at a protrusion 315 on the rear panel 314. The panels 314 are joined to one another by the spacers 316, which maintain the panels 314 at a substantially fixed distance with respect to one another except at edges 318 of such panels 314, which are each bent away from one another and tapered to define expanded channels 320 between them. The channels 320 have a width that is greater than a width of the voids 322 provided the channels 320 and the spacers 316. As is shown in FIG. 3A, the mounting bore 324 is countersunk on the front panel 314. Alternatively, in some implementations (not shown), the mounting bore 324 may be counterbored on the front panel 314.

Additionally, as is also shown in FIG. 3A, the panels 314 and the spacers 316 define a plurality of voids 322 within a cross-section of the frame 312. For example, as is shown in FIG. 3A, the frame 312 includes a single void 322 between the spacers 316, e.g., in a central region of the frame 312, as well as a pair of voids between one of the channels 320 and one of the spacers 316.

Figure 3B:
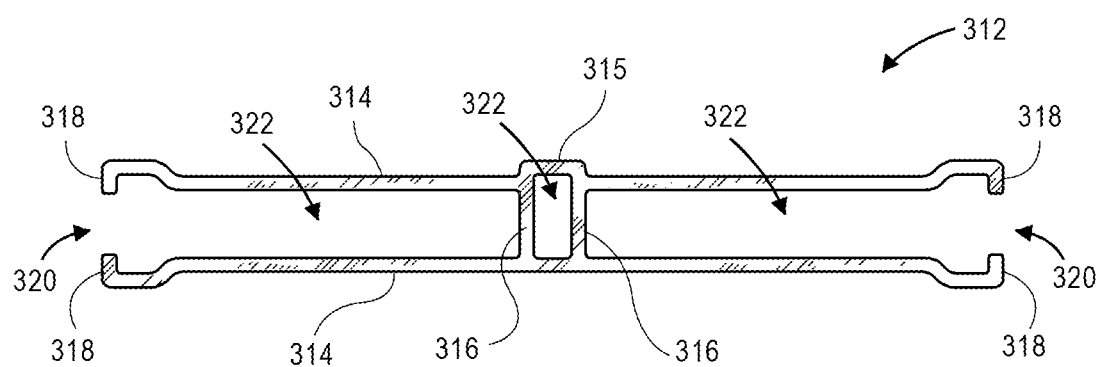

Referring to FIG. 3B, a top view of the frame 312 is shown. The top view of the frame 312 shows the voids 322 provided between the channels 320 and the spacers 316, and the void 322 provided between the spacers 316. As is discussed above with regard to the frame 212 of FIGS. 2A through 2G, the lengths of the spacers 316 define the maximum widths of the voids 322, and may be selected based on a dimension of a cable to be accommodated therein, while the widths of the panels 314 define the maximum lengths of the voids 322, and may be selected based on a number of cables (e.g., one or more) to be accommodated therein. For example, in some implementations, the voids 322 provided between the channels 320 and the spacers 316 may be sized to accommodate up to six low-voltage cables in parallel within the voids 322, with limited clearance between the cables and/or the panels 314 or the spacers 316.

Moreover, the tapered edges 318 may be bent, formed or otherwise shaped in any manner with respect to the front panel 314 or the rear panel 314, in accordance with the present disclosure. For example, as is shown in FIG. 3B, the tapered edges 318 may be angled away from one another by an angle of forty-five degrees (45°) before being bent toward one another by an angle of forty-five degrees (45°), e.g., the same angle in an opposite direction, before being bent toward one another again by an angle of ninety degrees (90°). Alternatively, edges of the front panel 314 and the rear panel 314 may be bent, formed or shaped at any angle with respect to one another in accordance with the present disclosure.

As is also shown in FIG. 3B, the protrusion 315 is present on the rear panel 314, and is not present on the front panel 314. The protrusion 315 is aligned substantially parallel to or along a longitudinal axis of the rear panel 314, and extends beyond a surface of the rear panel 314 by approximately the same distance or extent as the tapered edges 318. Thus, when the frame 312 is mounted in contact with a backerboard or other surface, e.g., by extending a fastener such as a wood screw or any other fastener into the mounting bore 324 at the front panel 314 and through the protrusion 315 on the rear panel 314, the portions of the tapered edges 318 that are parallel to the rear panel 314, and the protrusion 315, will come into contact with the backerboard or other surface.

Figure 3C:
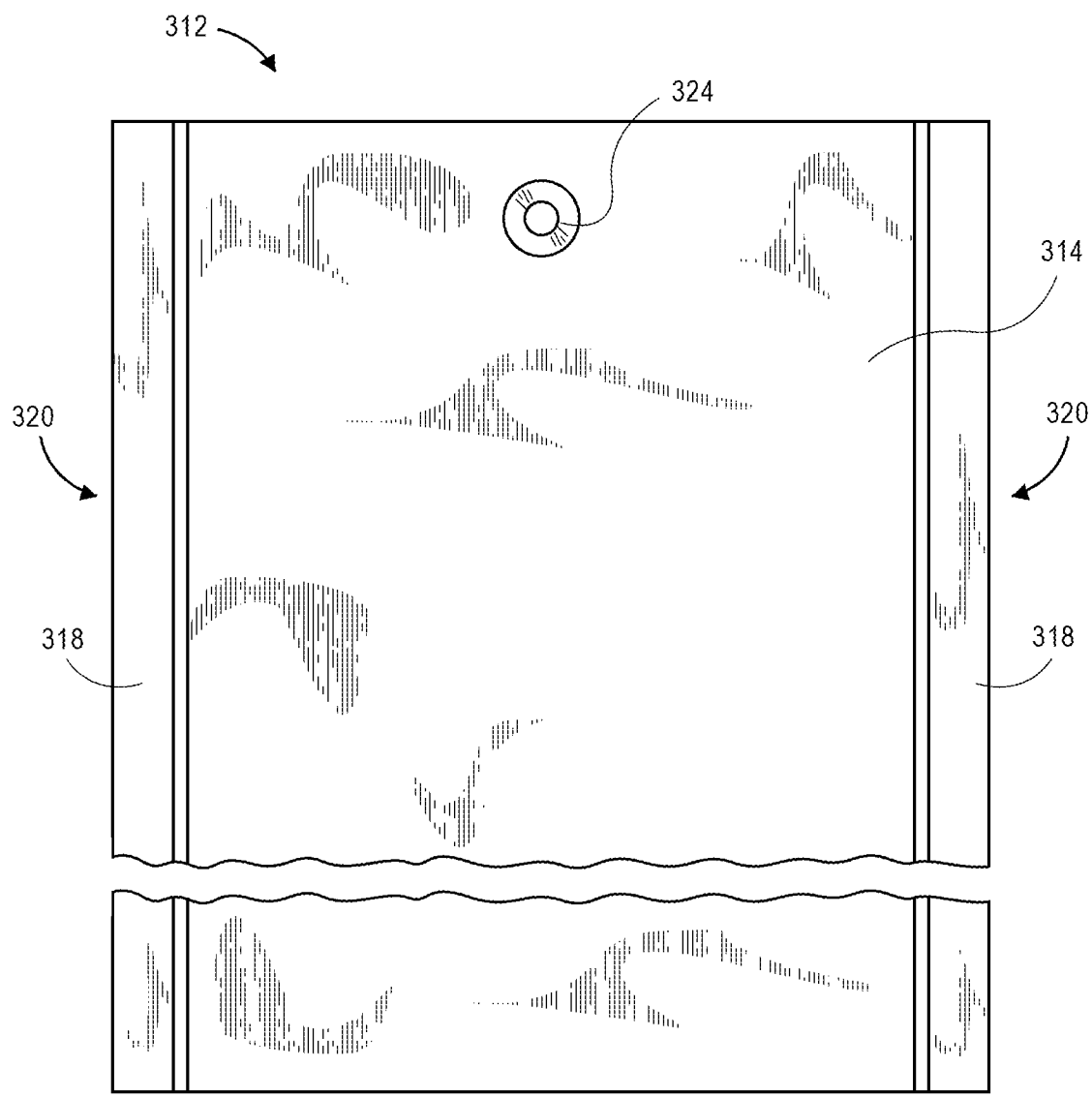

Referring to FIG. 3C, a front view of the frame 312 is shown. The front view of FIG. 3C shows the front panel 314 of the frame 312, as well as the bending of the tapered edges 318 with respect to the front panel 314 and the rear panel 314 (not shown in FIG. 3C). Additionally, FIG. 3C also shows the mounting bore 324, which is countersunk into the front panel 314.

Figure 3D:
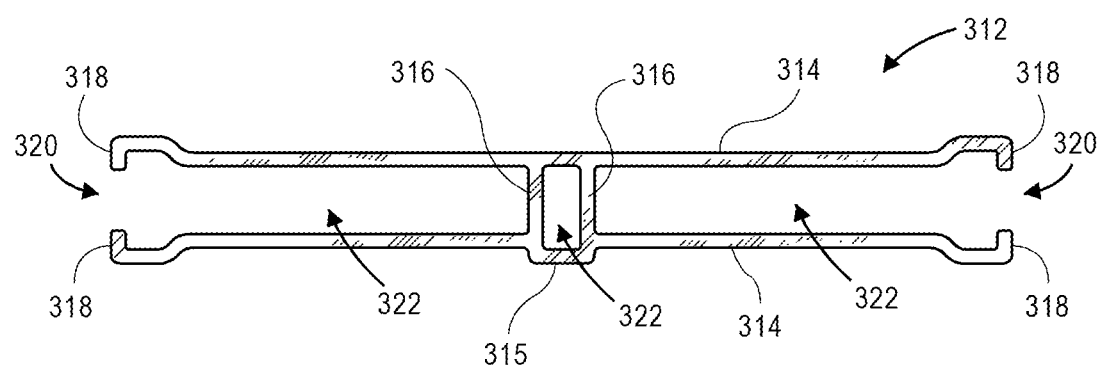

Referring to FIG. 3D, a bottom view of the frame 312 is shown. Like the top view of FIG. 3B, the bottom view of FIG. 3D shows the voids 322 provided between the channels 320 and the spacers 316, and between the spacers 316. The bottom view of FIG. 3D also shows the angles at which the tapered edges 318 of the front panel 314 and the rear panel 314 are bent, formed or shaped with respect to one another, as well as the dimensions of the channel 320 formed thereby. The bottom view of FIG. 3D further shows the dimensions of the protrusion 315 with respect to the tapered edges 318.

Figure 3E:
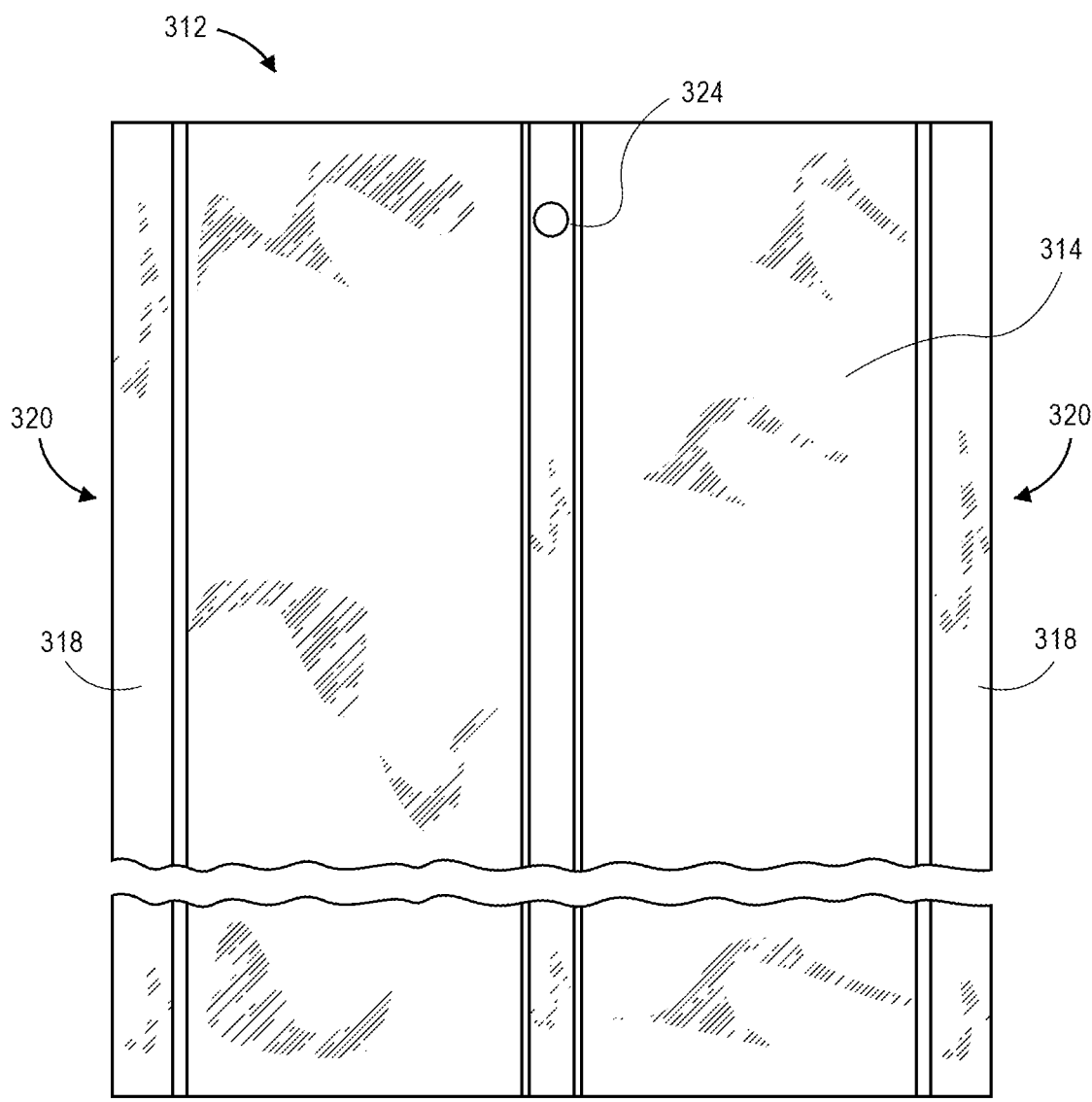

Referring to FIG. 3E, a rear view of the frame 312 is shown. As is shown in FIG. 3E, the protrusion 315 extends outwardly from the rear panel by a distance that is approximately equal to a distance by which each of the tapered edges 318 is bent outward from the rear panel 314. Thus, when the frame 312 is mounted in contact with a backerboard or other surface, the portions of the tapered edges 318 that are parallel to the rear panel 314, and the protrusion 315, will come into contact with the backerboard or other surface. As is also shown in FIG. 3E, the mounting bore 324 extends through the rear panel 314 at the protrusion 315.

Figures 3F, 3G:
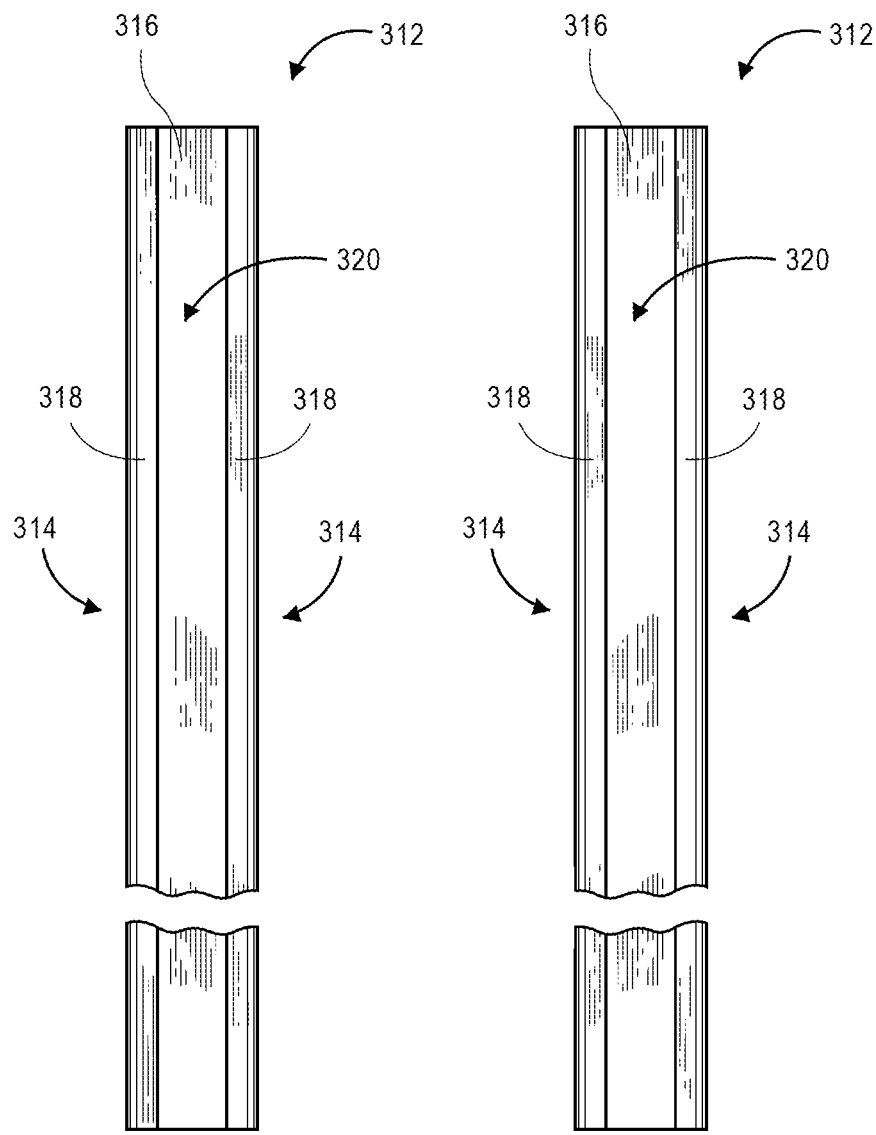

Referring to FIG. 3F, a left side view of the frame 312 is shown. Referring to FIG. 3G, a right side view of the frame 312 is shown. As with the frame 212 of FIGS. 2A through 2G, the frame 312 is substantially symmetrical, with channels 320 for accommodating cable carriers and voids 322 for accommodating wires of equal size, provided on either side of the frame 312. Alternatively, in some other implementations, a frame may be asymmetrical, with channels or voids of different sizes, or with a channel provided on one side of the frame, and with a closed end, e.g., one or more spacers, provided on another side of the frame.

As is discussed above, the cable housing assemblies of the present disclosure feature one or more cable carriers that may be releasably inserted into a channel of a frame, and are configured to travel in a direction defined by the channel of the frame. In some implementations, the cable carriers may include jacks, ports or one or more other termini of cables (e.g., low-voltage connectors) that extend into channels of frames and are connected to energized ports or modules, or to network sources. By placing the cable carriers in selected positions within the channels, the cable housing assemblies may make power, utility, communications or other services available at such selected positions. Computer-based systems, sensors or other devices may be connected to such services by way of the cable carriers.

Referring to FIGS. 4A through 4G, views of components of one cable carrier 430 in accordance with implementations of the present disclosure are shown. Except where otherwise noted, reference numerals preceded by the number "4" shown in FIGS. 4A through 4G indicate components or features that are similar to components or features having reference numerals preceded by the number "3" shown in FIGS. 3A through 3G, by the number "2" shown in FIGS. 2A through 2G or by the number "1" shown in FIGS. 1A through 1F.

Figure 4A:
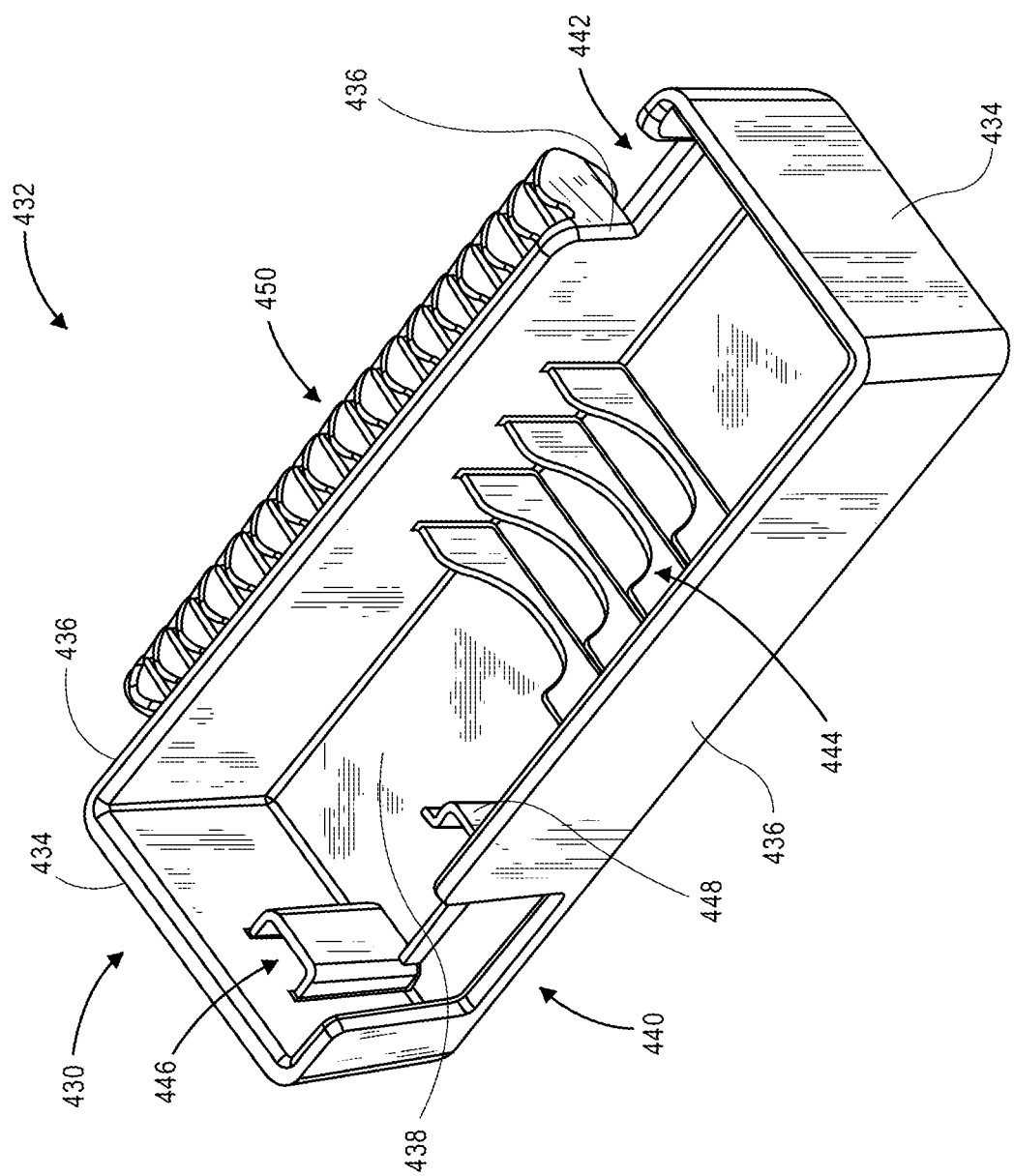

Referring to FIG. 4A, a rear perspective view of the cable carrier 430 is shown. The cable carrier 430 comprises a housing (or frame) 432 that is substantially hollow, and includes a pair of short panels 434 (e.g., at a top and a bottom of the housing 432), a pair of long panels 436 (e.g., on a left side and a right side of the housing 432), and a main panel 438. The housing 432 is the form of a substantially hollow open cavity having a rectangular shape defined by the short panels 434, the long panels 436, and a bottom defined by the main panel 438. Each of the short panels 434, the long panels 436 and the main panel 438 has a substantially rectangular shape. Each of the short panels 434 has an edge in contact with edges of the long panels 436. The main panel 438 has edges in contact with each of the short panels 434 and each of the long panels 436.

As is shown in FIG. 4A, the housing 432 further includes an opening 440 in one of the long panels 436 on a right side of the housing 432. The opening 440 is provided in the housing 432 to enable a jack, a socket, a port or another module, e.g., the jack 160 of FIG. 1A, to be installed therein. The jack, the port or the other module may have an outer face in a shape that corresponds to a shape of the opening 440, or any other shape, and the outer face of the jack may be flush with the long panel 436, or extended or recessed by a predetermined distance. An interior of the housing 432 further includes clips, blocks or other mounting components 446, 448 that enable the jack, the port or the other module to be secured therein.

As is also shown in FIG. 4A, the housing 432 further includes an opening 442 extending through another of the long panels 436 on a left side of the housing 432. The opening 442 is provided in the housing 432 to enable a portion of a cable or other connector (e.g., a low-voltage connector), e.g., the cable 165 of FIG. 1B, to enter into the housing 432 and to contact or otherwise be connected to a jack, a socket, a port or a module installed in or near the opening 440. The housing 432 also includes a plurality of retention elements 450 aligned in parallel to one another above the opening 442.

Each of the short panels 434, the long panels 436 and the main panel 438 of the housing 432 may have any dimensions, sizes or thicknesses, or be formed from any materials. For example, as is shown in FIG. 4A, lengths of each of the long panels 436 are greater than lengths of each of the short panels 434. Alternatively, lengths of each of the long panels 436 may be substantially equal to lengths of each of the short panels 434. In some embodiments, the opening 440 and/or the opening 442 may be provided within panels of the housing 432 having lengths that are less than lengths of other panels of the housing 432. For example, one or more of the opening 440 and/or the opening 442 may be provided within the short panels 434 of the housing 432, rather than the long panels 436.

The retention elements 450 are components extending from the housing 432 that are defined by broad sections (e.g., heads) at distal ends of the retention elements 450, and necked extensions at proximal ends of the retention elements 450, for coupling the broad sections to the housing 432 on the external surface of the long panel 436 on the left side of the housing 432. The retention elements 450 are sized, shaped and configured for releasable insertion into a channel of a cable housing assembly frame, e.g., one of the channels 220 of the frame 212 of FIGS. 2A through 2G, or one of the channels 320 of the frame 312 of FIGS. 3A through 3G, to enable the housing 432 to be slidably mounted to the cable housing assembly frame. In some implementations, the retention elements 450 may have ends (e.g., heads) that are broader than a minimum width of a channel of a cable housing assembly frame. Inserting the retention elements 450 into such a channel may cause edges of the channel to widen, at least temporarily, to accommodate the retention elements 450. After the retention elements 450 have been sufficiently inserted, the edges of the channel contract around the ends, and releasably secure such ends in place therein.

Although the retention elements 450 are shown as having substantially flat shapes that are similar to spades, those of ordinary skill in the pertinent arts will recognize that the retention elements 450 may have any shape in accordance with the present disclosure, e.g., round or spherical, square or cubic, triangular or conic, or the like. Additionally, although the housing 432 includes a plurality of the retention elements 450 having substantially planar constructions that are aligned in parallel to one another, those of ordinary skill in the pertinent arts will recognize that the cable carrier 430 may be slidably mounted to a cable housing assembly frame by a single retention element 450, or by fewer or more retention elements 450 than are shown in FIG. 4A, e.g., two retention elements 450, in accordance with the present disclosure.

As is further shown in FIG. 4A, the cable carrier 430 includes a plurality of internal supports 444 within the housing 432. The internal supports 444 extend laterally across the housing 432, parallel to the short panels 434, and perpendicular to and in contact with each of the long panels 436 and with the main panel 438. The internal supports 444 may provide supports to one or more components of a jack, a socket, a port or another module, or a cable, and may have any dimensions, sizes or thicknesses, or be formed from any materials, that are selected in order to minimize the mass or weight of the cable carrier 430, to allow for any resistive heat generated within such components to be properly dissipated therein, or for any other purpose.

Referring to FIG. 4B, a front view of the cable carrier 430 is shown. Referring to FIG. 4C, a rear view of the cable carrier 430 is shown. The front view of the cable carrier 430 of FIG. 4B and the rear view of the cable carrier 430 of FIG. 4C show the main panel 438, and the retention elements 450 coupled to one of the long panels 436 on a left side of the housing 432. The retention elements 450 are shown as joined to the long panel 436 above the opening 442. Additionally, as is shown in FIG. 4B, edges of the short panels 434, the long panels 436 and the main panel 438 are joined at rounded connections to define the housing 432. Alternatively, in some other implementations, short panels, long panels and a main panel may be joined at straight connections (e.g., corners), or by any other connection.

Referring to FIG. 4D, a right side view of the cable carrier 430 is shown. As is shown in FIG. 4D, the opening 440 has a substantially square shape and is sized to enable a jack, a socket, a port or another module, e.g., the jack 160 of FIG. 1A, to be installed therein. Referring to FIG. 4E, a left side view of the cable carrier 430 is shown. As is shown in FIG. 4E, the opening 442 has a substantially rectangular shape and is sized to enable a cable, e.g., the cable 165 of FIG. 1B, to pass therethrough, from a jack, a socket, a port or another module installed in the opening 440 to a channel into which the cable carrier 430 is mounted. Although each of the opening 440 and the opening 442 has a substantially square or rectangular shape, those of ordinary skill in the pertinent arts will recognize that the cable carrier 430 may include openings of any shape, including an opening sized to accommodate a jack, a socket, a port or another module having any cross-sectional shape or area, and an opening sized to accommodate a cable having any cross-sectional shape or area, in accordance with the present disclosure.

Figure 4F:
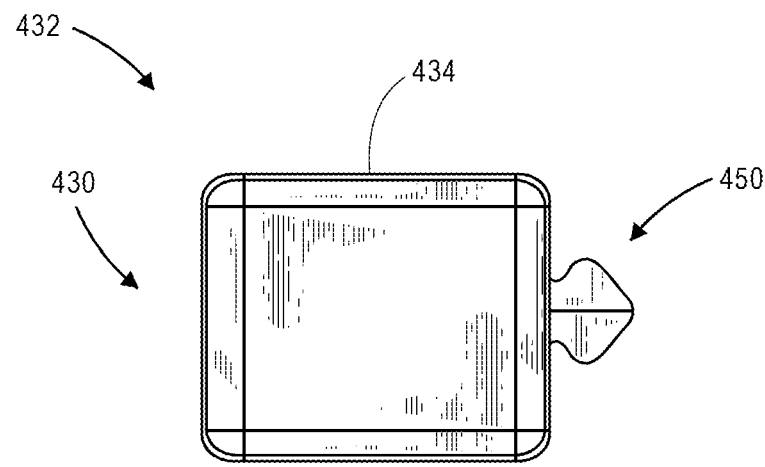
Figure 4G:
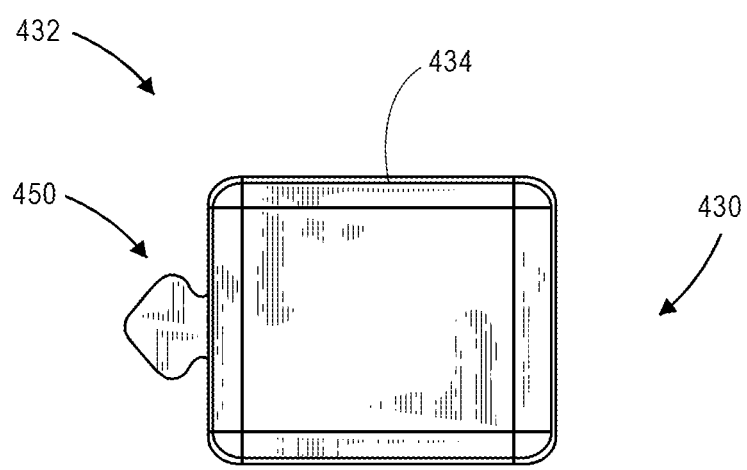

Referring to FIG. 4F, a top view of the cable carrier 430 is shown. As is shown in FIG. 4F, the retention elements 450 are defined by broad sections (e.g., heads) at distal ends of the retention elements 450, and necked extensions at proximal ends of the retention elements 450, for coupling the broad sections to the housing 432 on the external surface of the long panel 436. Referring to FIG. 4G, a bottom view of the cable carrier 430 is shown.

The cable carrier 430 may be formed from any materials, including but not limited to lightweight, durable materials such as plastics, woods, metals, composites or other durable materials that provide sufficient structural support and protection for jacks, ports, modules, cables or other components therein. For example, in some implementations, the cable carrier 430 may be formed from one or more types of thermoplastics or thermosetting plastics such as epoxy or phenolic resins, polyurethanes or polyesters, as well as polyethylenes, polypropylenes or polyvinyl chlorides (or "PVC"), or acrylonitrile butadiene styrenes (or "ABS"). Alternatively, the cable carrier 430 may be formed from one or more recycled plastics, bioplastics, cellulose or compostable plastics, natural plastics, or any other like materials. The cable carrier 430 may be formed by any process, e.g., injection molding, or by any other form of forming or molding (e.g., rotational molding, extrusion molding, vacuum casting, thermoforming, compression molding). Components such as a jack, a socket, a port or another module, as well as a cable, may be fixedly or releasably installed within the cable carrier 430, which may be formed in a single-piece construction or from multiple pieces.

Although the cable carrier 430 of FIGS. 4A through 4G is shown as being configured for installation in a cable housing assembly frame in a vertical alignment, those of ordinary skill in the pertinent arts will recognize that the cable carrier 430 may be slidably mounted within a channel in a vertical alignment, a horizontal alignment, or in any other alignment (e.g., at any angle with respect to the channel). For example, although the retention elements 450 are shown as being coupled to one long panel 436, and the opening 440 for installing a jack, a socket, a port or another module therein is formed in another long panel 436, the retention elements 450 may be provided in any panel from which the housing 432 is defined. In some implementations, one or more retention elements may be coupled to a short panel of a housing, or in any other panel of the housing, and an opening for accommodating a jack, a socket, a port or another module may be provided in another short panel of the housing, or in any other panel of the housing.

Referring to FIGS. 5A through 5G, views of components of one cable carrier 530 in accordance with implementations of the present disclosure are shown. Except where otherwise noted, reference numerals preceded by the number "5" shown in FIGS. 5A through 5G indicate components or features that are similar to components or features having reference numerals preceded by the number "4" shown in FIGS. 4A through 4G, by the number "3" shown in FIGS. 3A through 3G, by the number "2" shown in FIGS. 2A through 2G or by the number "1" shown in FIGS. 1A through 1F.

The cable carrier 530 of FIGS. 5A through 5G includes similar attributes, qualities and/or features as the cable carrier 430 of FIGS. 4A through 4G, and has a reciprocal construction, with retention elements 550 coupled to a long panel 536 on a left side of a housing (or frame) 532, and an opening 542 for accommodating a cable, e.g., the cable 165 of FIG. 1B, extending through the long panel 536 below the retention elements 550 on the left side of the housing 532. Conversely, an opening 540 for accommodating a jack, a socket, a port or another module extends through the long panel 536 on a right side of the housing 532.

Figure 5A:
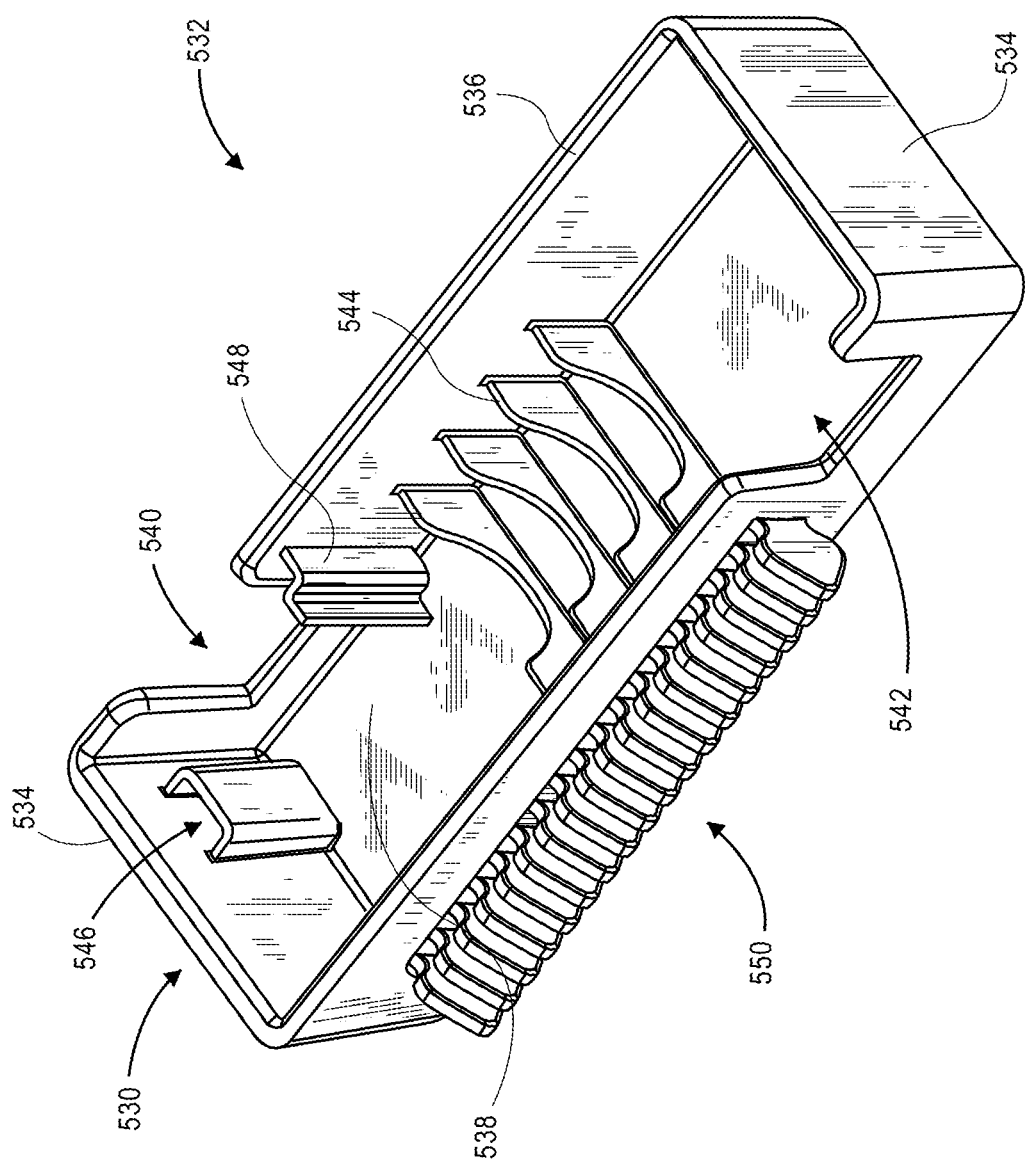

Referring to FIG. 5A, a rear perspective view of the cable carrier 530 is shown. Like the cable carrier 430 of FIGS. 4A through 4G, the cable carrier 530 comprises a housing 532 that is substantially hollow, and includes a pair of short panels 534 (e.g., at a top and a bottom of the housing 532), a pair of long panels 536 (e.g., on a left side and a right side of the housing 532), and a main panel 538. The housing 532 is an open cavity in the form of a substantially rectangular hollow defined by the short panels 534, the long panels 536 and the main panel 538, each of which has a substantially rectangular shape. Each of the short panels 534 has an edge in contact with edges of the long panels 536. The main panel 538 has edges in contact with each of the short panels 534 and each of the long panels 536.

As is shown in FIG. 5A, the housing 532 further includes an opening 540 in one of the long panels 536 on a right side of the housing 532. The opening 540 is provided in the housing 532 to enable a jack, a socket, a port or another module, e.g., the jack 160 of FIG. 1A, to be installed therein. The jack, the port or the other module may have an outer face in a shape that corresponds to a shape of the opening 540, or any other shape, and the outer face of the jack may be flush with the long panel 536, or extended or recessed by a predetermined distance. An interior of the housing 532 further includes clips, blocks or other mounting components 546, 548 that enable the jack, the port or the other module to be secured therein.

As is also shown in FIG. 5A, the housing 532 further includes an opening 542 extending through another of the long panels 536 on a left side of the housing 532. The opening 542 is provided in the housing 532 to enable a cable or other connector (e.g., a low-voltage connector), e.g., the cable 165 of FIG. 1B, to enter into the housing 532 and to contact or otherwise be connected to a jack, a socket, a port or a module installed in or near the opening 540.

As is also shown in FIG. 5A, the housing 532 also includes a plurality of retention elements 550 aligned in parallel to one another on the left side of the housing 532, e.g., below the opening 542. The retention elements 550 are defined by broad sections (e.g., heads) at distal ends and necked extensions at proximal ends, for coupling the broad sections to the housing 532 on the external surface of the long panel 536 on the right side of the housing 532. The retention elements 550 are sized, shaped and configured for releasable insertion into a channel of a cable housing assembly frame to enable the housing 532 to be slidably mounted to the cable housing assembly frame. In some implementations, the retention elements 550 may have ends (e.g., heads) that are broader than a minimum width of a channel of a cable housing assembly frame. As is further shown in FIG. 5A, the cable carrier 530 includes a plurality of internal supports 544 within the housing 532. The internal supports 544 extend laterally across the housing 532, parallel to the short panels 534, and perpendicular to and in contact with each of the long panels 536 and with the main panel 538.

Figure 5B:
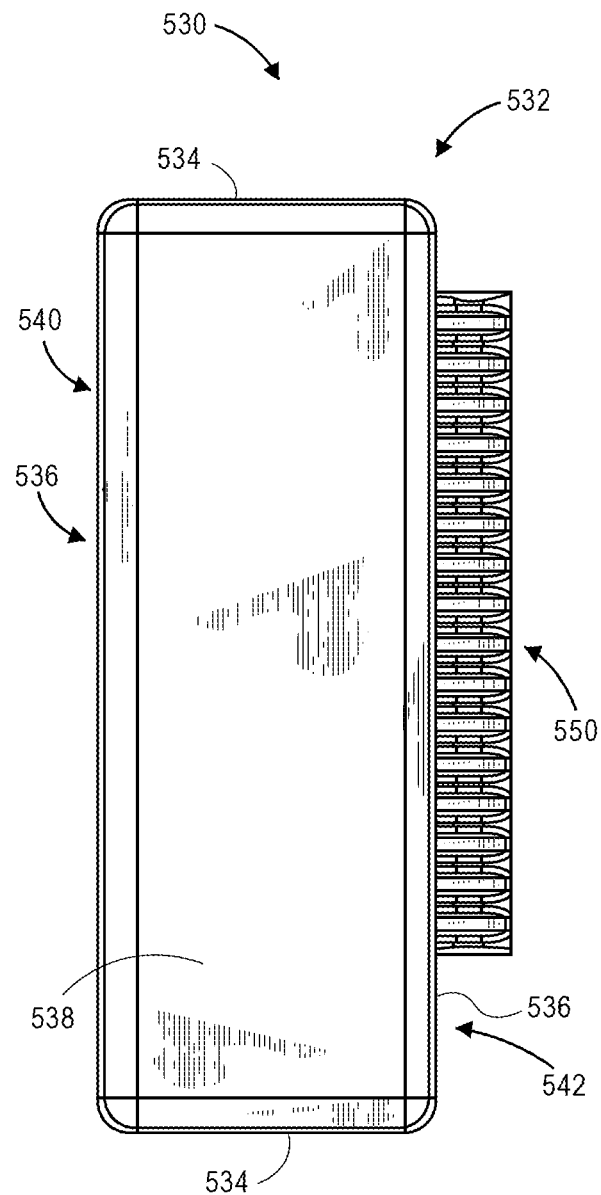
Figure 5C:
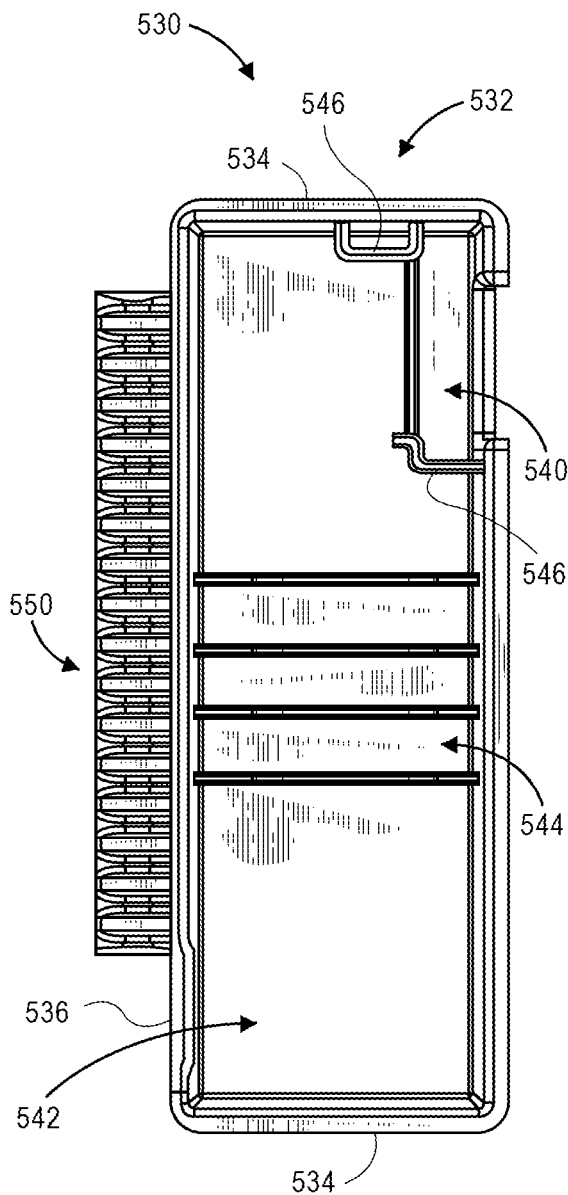
Figure 5F:
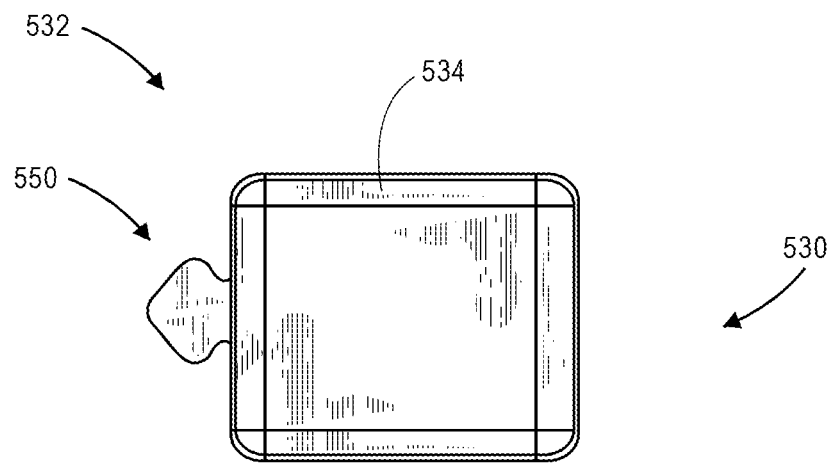
Figure 5G:
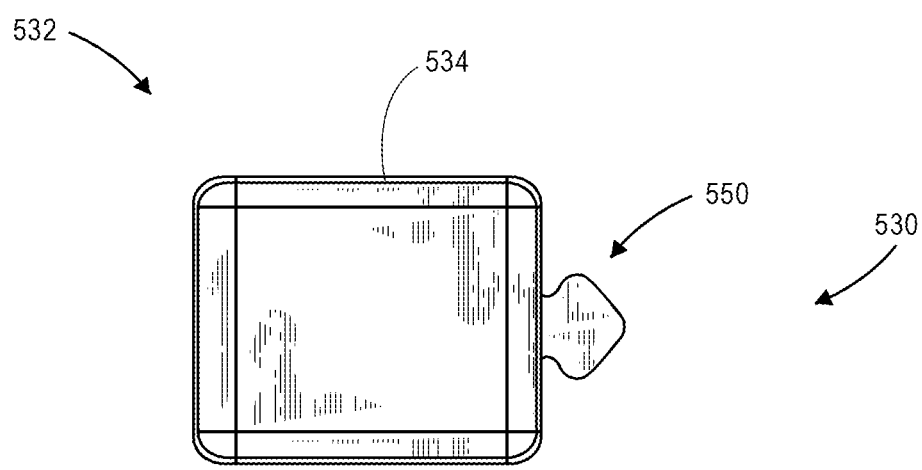

Referring to FIG. 5B, a front view of the cable carrier 530 is shown. Referring to FIG. 5C, a rear view of the cable carrier 530 is shown. Referring to FIG. 5D, a right side view of the cable carrier 530 is shown. Referring to FIG. 5E, a left side view of the cable carrier 530 is shown. Referring to FIG. 5F, a top view of the cable carrier 530 is shown. Referring to FIG. 5G, a bottom view of the cable carrier 530 is shown.

As is discussed above, a cable carrier may be formed from a panel that defines a cavity for mounting one or more components (e.g., jacks, ports, modules, cables or other components) therein and may further include a hinged panel that acts as a removable cover for the cavity. The hinged panel may be opened to mount one or more components within the cavity, and closed prior to installation in order to ensure that the components mounted therein remain undisturbed during installation and use. Referring to FIGS. 6A through 6E, views of components of one cable carrier 630 in accordance with implementations of the present disclosure are shown. Except where otherwise noted, reference numerals preceded by the number "6" shown in FIGS. 6A through 6G indicate components or features that are similar to components or features having reference numerals preceded by the number "5" shown in FIGS. 5A through 5G, by the number "4" shown in FIGS. 4A through 4G, by the number "3" shown in FIGS. 3A through 3G, by the number "2" shown in FIGS. 2A through 2G or by the number "1" shown in FIGS. 1A through 1F.

The cable carrier 630 of FIGS. 6A through 6G includes similar attributes, qualities and/or features as the cable carrier 530 of FIGS. 5A through 5G or the cable carrier 430 of FIGS. 4A through 4G, and is constructed in a similar manner. The cable carrier 630 includes a pair of retention elements 650 coupled to a long panel 636 on a left side of a housing (or frame) 632, and an opening 642 for accommodating a cable or other connector (e.g., a low-voltage connector), e.g., the cable 165 of FIG. 1B, extends through the long panel 636 below the retention elements 650 on the left side of the housing 632. Conversely, an opening 640 for accommodating a jack, a socket, a port or another module extends through the long panel 636 on a right side of the housing 632. The cable carrier 630 further includes a hinged panel 654 coupled to the long panel 636 on the left side of the housing 632. The hinged panel 654 includes a pair of tabs 658, each having a corresponding receptacle 635 (e.g., a notch or a slot) in the long panel 636 on the right side of the housing 632.

Figure 6A:
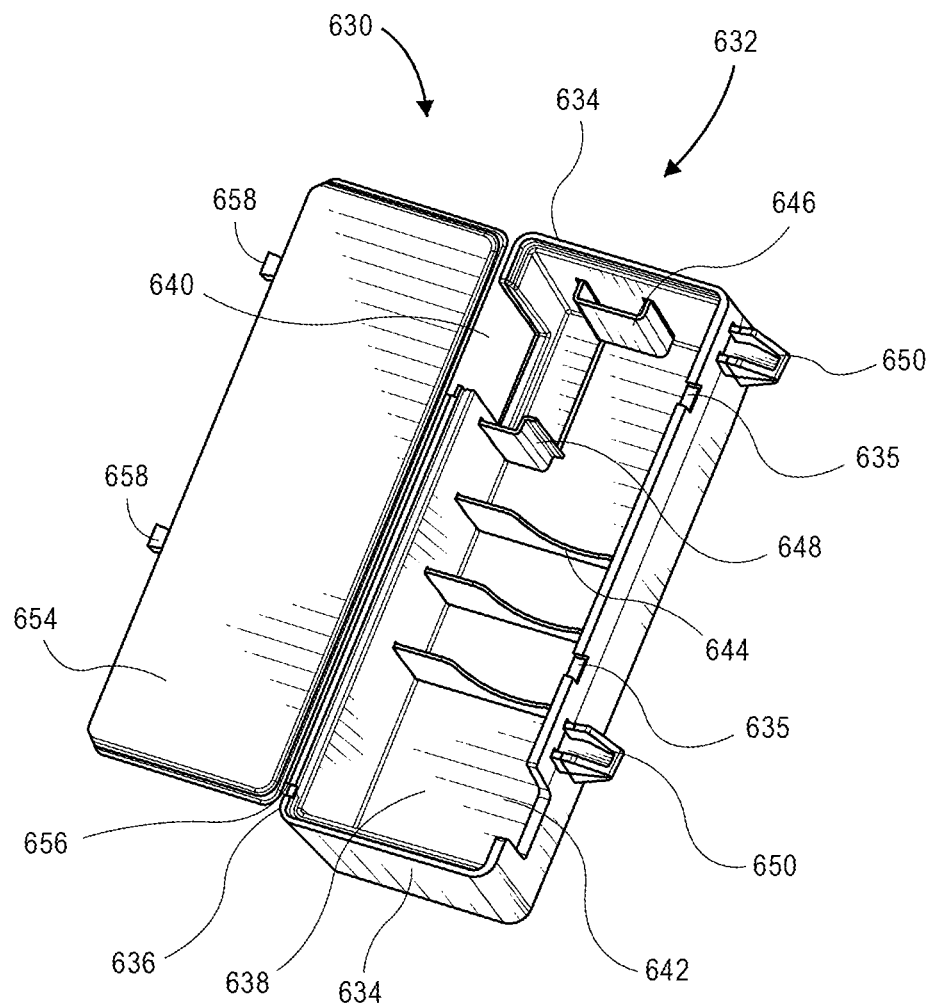

Referring to FIG. 6A, a rear perspective view of the cable carrier 630 is shown. Like the cable carrier 530 of FIGS. 5A through 5G and the cable carrier 430 of FIGS. 4A through 4G, the cable carrier 630 comprises a housing 632 that is substantially hollow, and includes a pair of short panels 634 (e.g., at a top and a bottom of the housing 632), a pair of long panels 636 (e.g., on a left side and a right side of the housing 632), and a main panel 638.

The housing 632 includes a cavity in the form of a substantially rectangular hollow defined by the short panels 634, the long panels 636 and the main panel 638, each of which has a substantially rectangular shape. Each of the short panels 634 has an edge in contact with edges of the long panels 636. The main panel 638 has edges in contact with each of the short panels 634 and each of the long panels 636. Additionally, the hinged panel 654 is coupled to an edge of the long panel 636 on the left side of the housing 632 by a hinge 656. With the hinged panel 654 in the position shown in FIG. 6A, the housing 632 is open, and able to accommodate the installation of a jack, a socket, a port or another module, e.g., the jack 160 of FIG. 1A, into the opening 640, or the extension of a cable, e.g., the cable 165 of FIG. 1A, through the opening 642. The jack, the port or the other module may have an outer face in a shape that corresponds to a shape of the opening 640, or any other shape, and the outer face of the jack may be flush with the long panel 636, or extended or recessed by a predetermined distance. An interior of the housing 632 further includes clips, blocks or other mounting components 646, 648 that enable the jack, the port or the other module to be secured therein.

Alternatively, the housing 632 may be closed by rotating the hinged panel 654 about the hinge 656, in order to cause the hinged panel 654 to come into contact with edges of the short panels 634 and the long panel 636 on the right side of the housing 632. With the housing 632 closed, each of the tabs 658 may be inserted (e.g., snap-fit) into the corresponding receptacles 635 in the long panel 636 on the right side of the housing 632.

As is also shown in FIG. 6A, the housing 632 also includes a pair of retention elements 650 aligned in parallel to one another on the left side of the housing 632, e.g., below the opening 642. The retention elements 650 are defined by broad sections (e.g., heads) at distal ends and necked extensions at proximal ends, for coupling the broad sections to the housing 632 on the external surface of the long panel 636 on the right side of the housing 632. The retention elements 650 are sized, shaped and configured for releasable insertion into a channel of a cable housing assembly frame to enable the housing 632 to be slidably mounted to the cable housing assembly frame. In some implementations, the retention elements 650 may have ends (e.g., heads) that are broader than a minimum width of a channel of a cable housing assembly frame. As is further shown in FIG. 6A, the cable carrier 630 includes a plurality of internal supports 644 within the housing 632. The internal supports 644 extend laterally across the housing 632, parallel to the short panels 634, and perpendicular to and in contact with each of the long panels 636 and with the main panel 638.

Figure 6B:
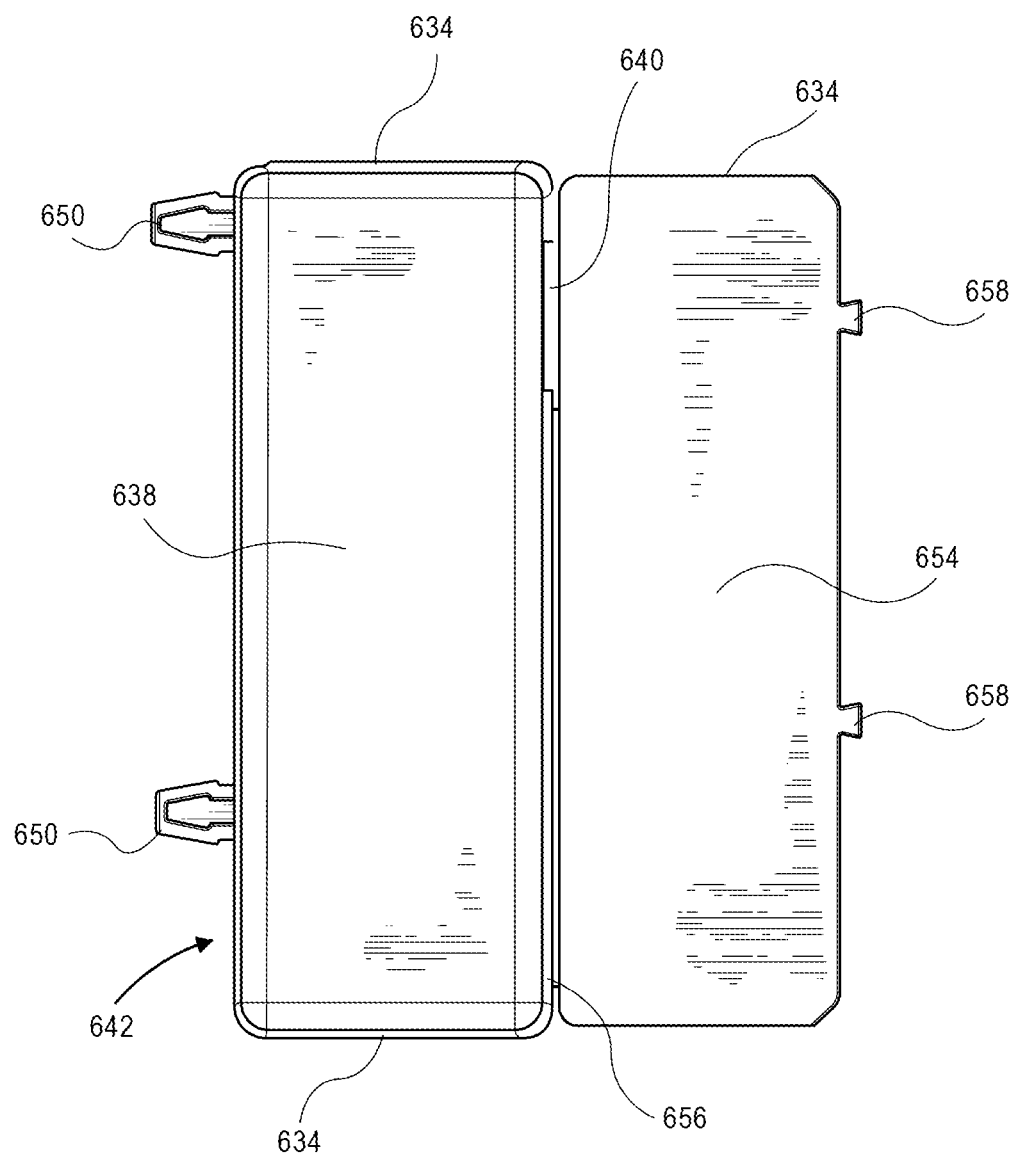
Figure 6C:
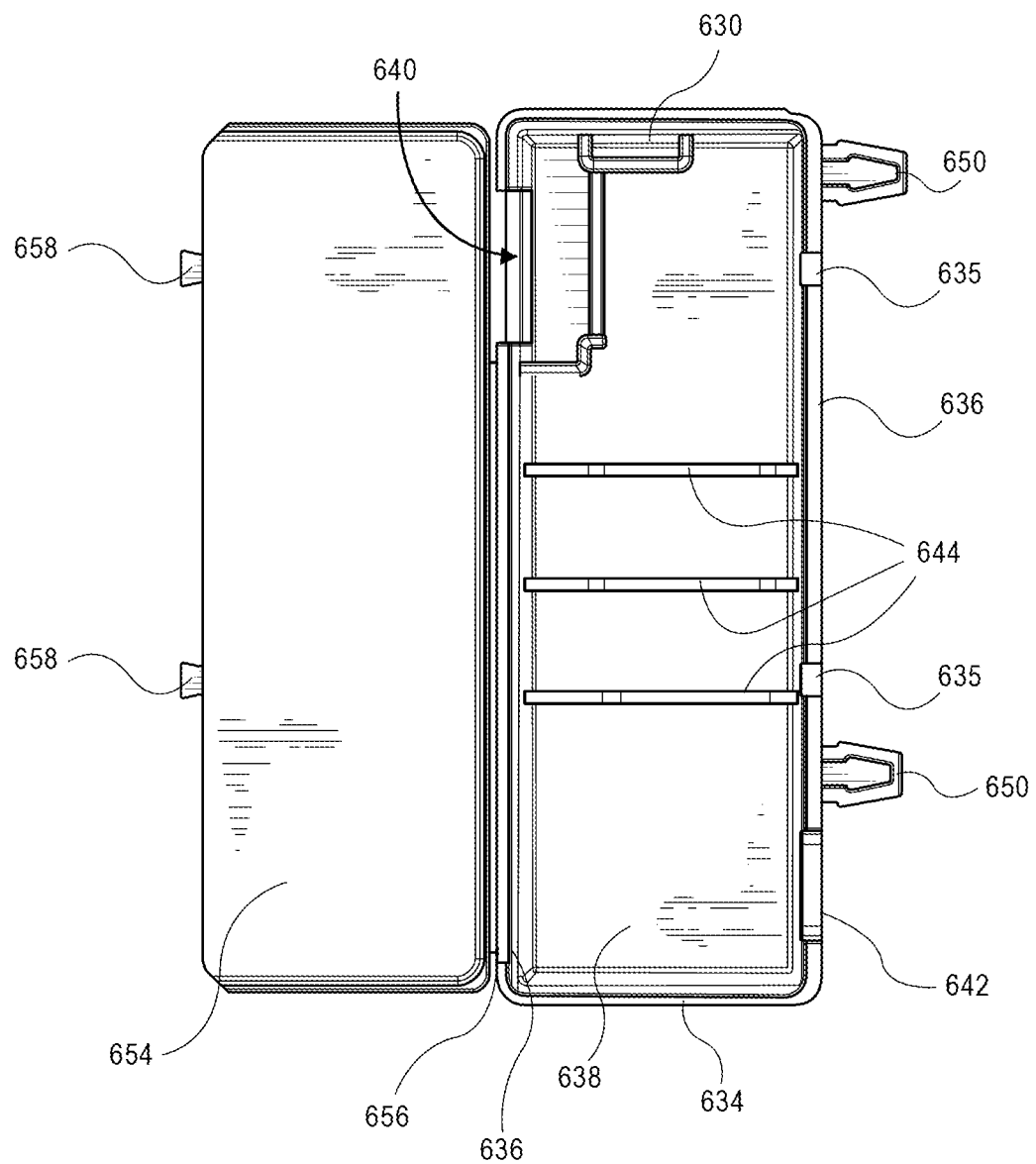

Referring to FIG. 6B, a front view of the cable carrier 630 is shown. Referring to FIG. 6C, a rear view of the cable carrier 630 is shown. The front view of the cable carrier 630 of FIG. 6B and the rear view of the cable carrier 630 of FIG. 6C show the main panel 638 and the hinged panel 654, the retention elements 650 coupled to one of the long panels 636 on a left side of the housing 632, and the tabs 658 on an edge of the hinged panel 654 opposite the hinge 656. The retention elements 650 are shown as joined to the long panel 636 on the left side of the housing 632, above the opening 642. Additionally, as is shown in FIG. 6B, edges of the short panels 634, the long panels 636 and the main panel 638 are joined at rounded connections to define the housing 632, and the hinged panel 654 has a substantially rectangular shape with edges having rounded intersections corresponding to the rounded connections of the housing 632. Alternatively, in some other implementations, short panels, long panels and a main panel may be joined at straight connections (e.g., corners), or by any other connection, and a hinged panel may have a substantially rectangular shape that corresponds to such connections.

Referring to FIG. 6D, a right side view of the cable carrier 630 is shown. As is shown in FIG. 6D, the opening 640 has a substantially square shape and is sized to enable a jack, a socket, a port or another module, e.g., the jack 160 of FIG. 1A, to be installed therein. Referring to FIG. 6E, a left side view of the cable carrier 630 is shown. As is shown in FIG. 6E, the opening 642 has a substantially rectangular shape and is sized to enable a cable, e.g., the cable 165 of FIG. 1B, to pass therethrough, from a jack, a socket, a port or another module installed in the opening 640 to a channel into which the cable carrier 630 is mounted. Although each of the opening 640 and the opening 642 has a substantially square or rectangular shape, those of ordinary skill in the pertinent arts will recognize that the cable carrier 630 may include openings of any shape, including an opening sized to accommodate a jack, a socket, a port or another module having any cross-sectional shape or area, and an opening sized to accommodate a cable having any cross-sectional shape or area, in accordance with the present disclosure. As is also shown in FIG. 6E, the retention elements 650 extend substantially normal to the long panel 636 on the left side of the cable carrier 630. Additionally, as is shown in FIGS. 6D and 6E, the hinged panel 654 is substantially parallel to the main panel 638.

Figure 6F:
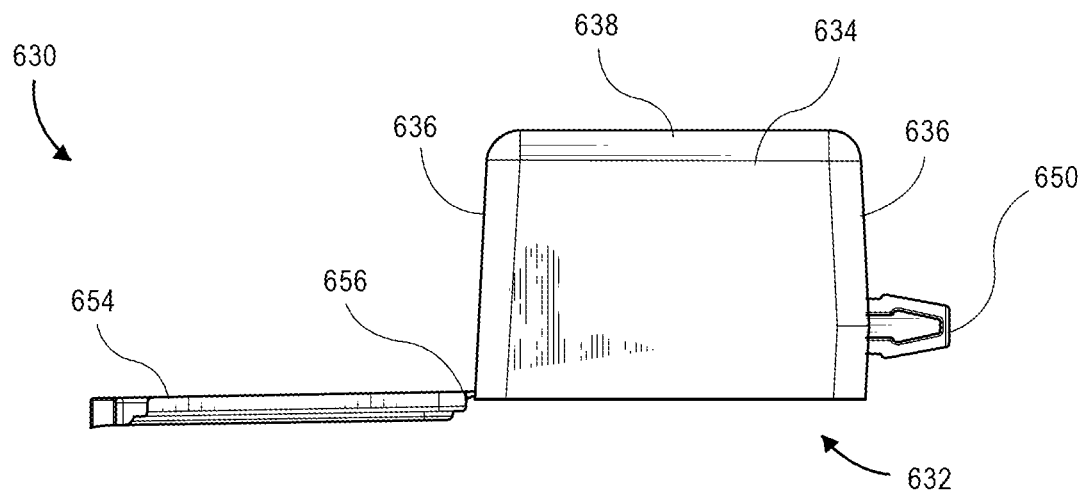
Figure 6G:
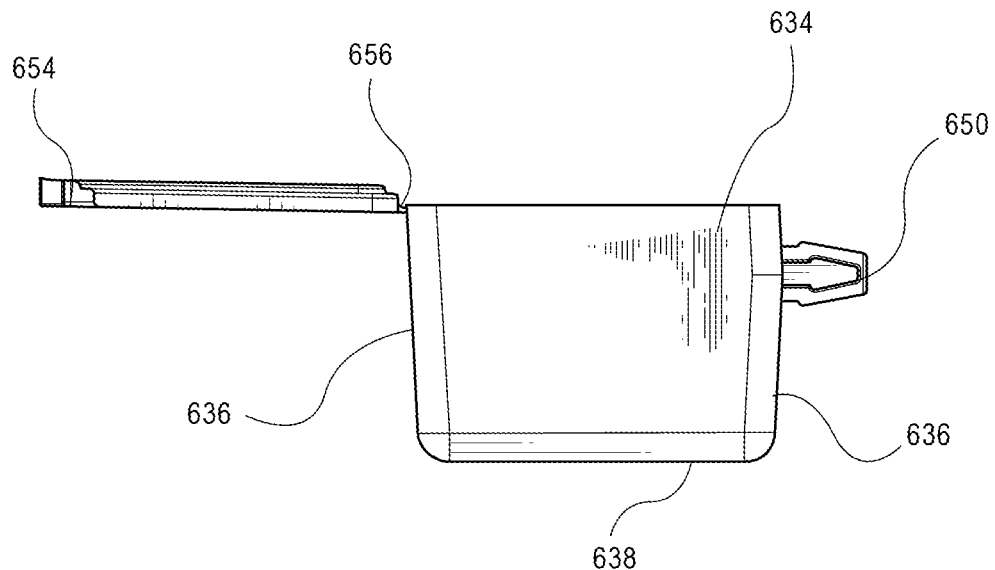

Referring to FIG. 6F, a top view of the cable carrier 630 is shown. Referring to FIG. 6G, a bottom view of the cable carrier 630 is shown. As is shown in FIGS. 6F and 6G, the retention elements 650 are defined by broad sections (e.g., heads) at distal ends of the retention elements 650, and necked extensions at proximal ends of the retention elements 650, for coupling the broad sections to the housing 632 on the external surface of the long panel 636. Additionally, as is shown in FIGS. 6F and 6G, the hinged panel 654 is substantially parallel to the main panel 638.

The cable carrier 630 may be formed from any materials, including but not limited to lightweight, durable materials such as plastics, woods, metals, composites or other durable materials that provide sufficient structural support and protection for jacks, ports, modules, cables or other components therein. For example, in some implementations, the cable carrier 630 may be formed from one or more types of thermoplastics or thermosetting plastics such as epoxy or phenolic resins, polyurethanes or polyesters, as well as polyethylenes, polypropylenes or polyvinyl chlorides (or "PVC"), or acrylonitrile butadiene styrenes (or "ABS"). Alternatively, the cable carrier 630 may be formed from one or more recycled plastics, bioplastics, cellulose or compostable plastics, natural plastics, or any other like materials. The cable carrier 630 may be formed by any process, e.g., injection molding, or by any other form of forming or molding (e.g., rotational molding, extrusion molding, vacuum casting, thermoforming, compression molding). Components such as a jack, a socket, a port or another module, as well as a cable, may be fixedly or releasably installed within the cable carrier 630, which may be formed in a single-piece construction or from multiple pieces.

Figure 7A:
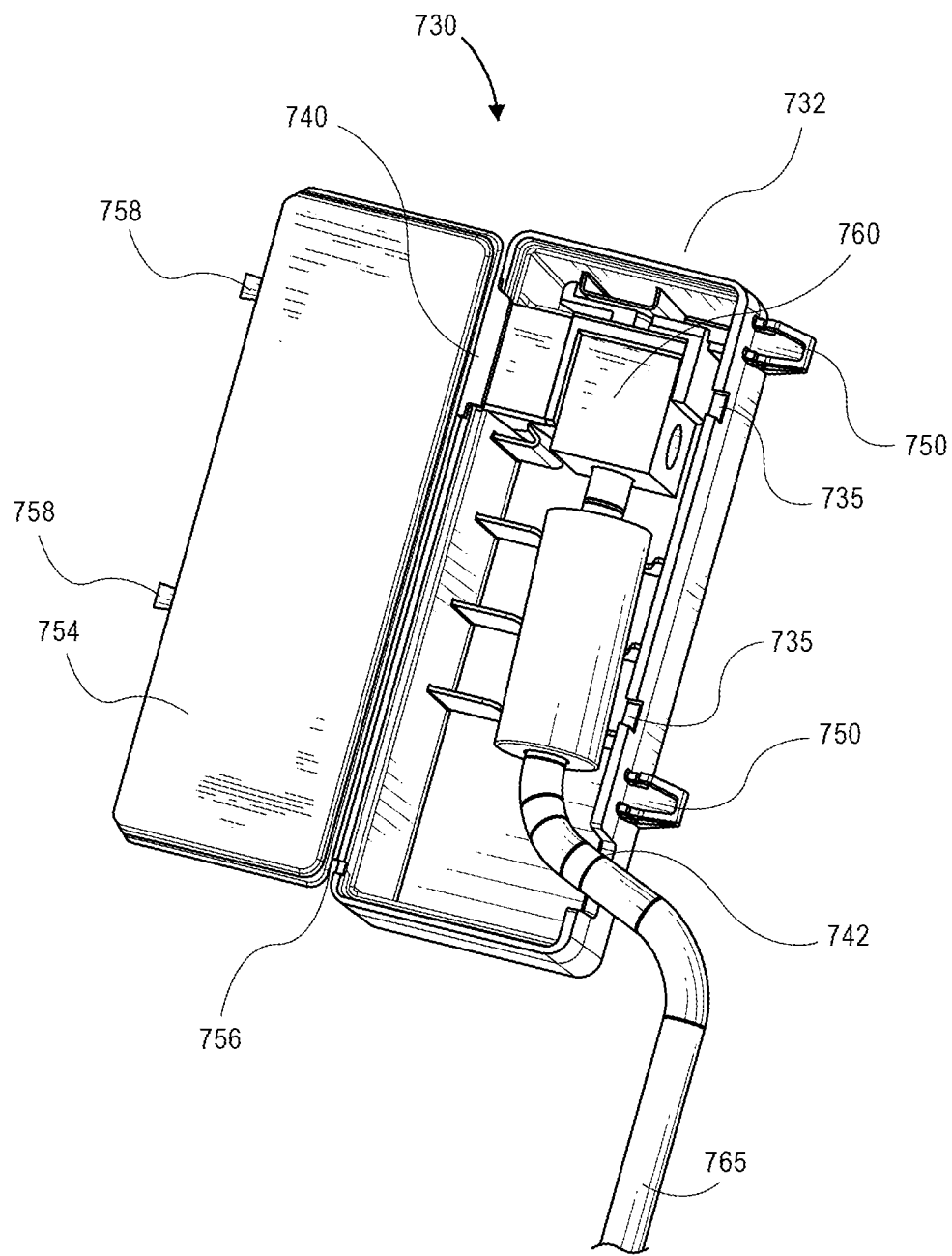
FIGS. 7A and 7B are views of components of one cable housing assembly in accordance with implementations of the present disclosure.
Figure 7B:
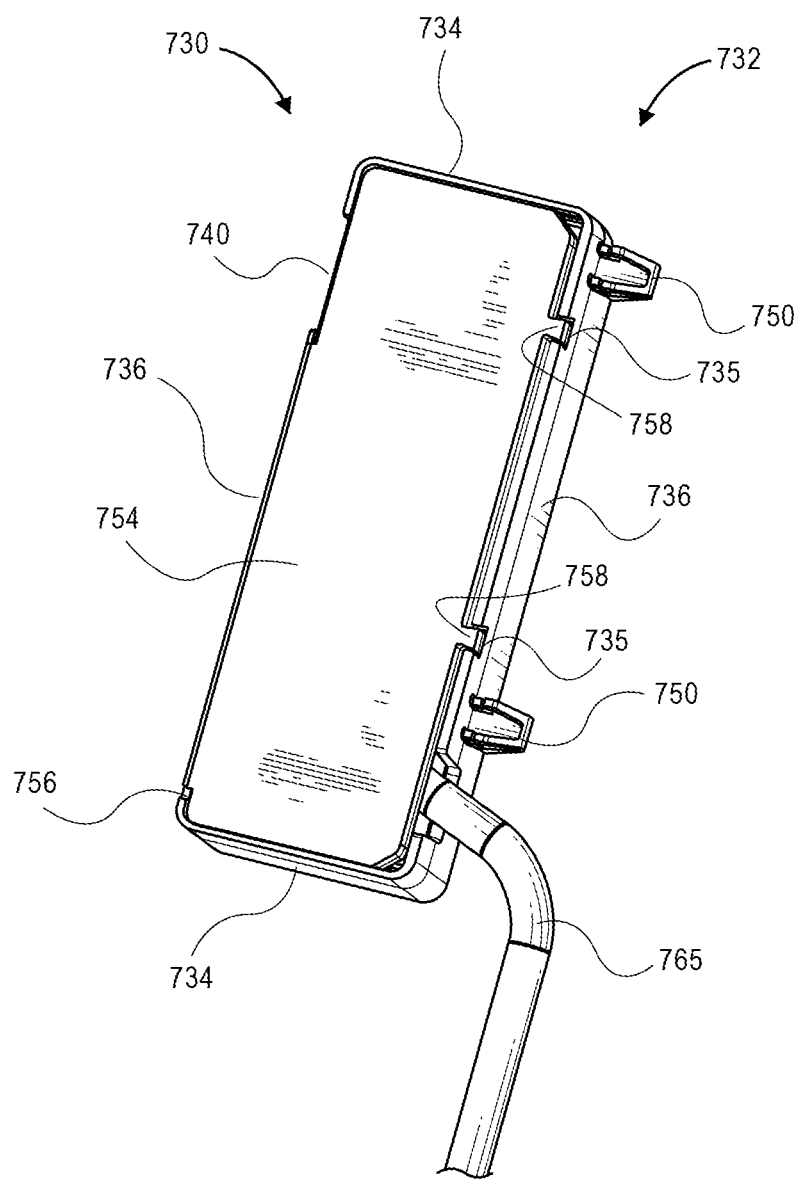

As is discussed above, cable carriers may include one or more hinged panels that may be opened to install one or more jacks, ports, sockets or other modules within the cable carriers and closed prior to mounting the cable carriers within one or more channels of a cable housing assembly. Referring to FIGS. 7A and 7B, views of components of one cable carrier 730 in accordance with implementations of the present disclosure are shown. Except where otherwise noted, reference numerals preceded by the number "7" shown in FIGS. 7A and 7B indicate components or features that are similar to components or features having reference numerals preceded by the number "6" shown in FIGS. 6A through 6G, by the number "5" shown in FIGS. 5A through 5G, by the number "4" shown in FIGS. 4A through 4G, by the number "3" shown in FIGS. 3A through 3G, by the number "2" shown in FIGS. 2A through 2G or by the number "1" shown in FIGS. 1A through 1F.

Referring to FIG. 7A, the cable carrier 730 includes a housing 732, an opening 740 in the housing 732, an opening 742 in the housing 732, a pair of retention elements 750, a hinged panel 754, a hinge 756, a jack 760 and a cable 765. The cable carrier 730 includes similar attributes, qualities and/or features as the cable carrier 630 of FIGS. 6A through 6G, and is constructed in a similar manner.

The housing 732 is formed from a plurality of panels, including a pair of short panels 734, a pair of long panels 736 and a main panel 738 and has an external shape that is substantially rectangular. The jack 760 is mounted to the opening 740 within the housing 732, e.g., with a female connection (not shown) that may be accessed, e.g., with a male connector, from outside of the housing 732. The cable 765 is connected to the jack 760 and extends through the opening 742, out of the cable carrier 730. The retention elements 750 extend from the housing 732 on the same side as the opening 742, and are vertically co-aligned. The hinged panel 754 includes a pair of tabs 758 and is coupled to one panel of the housing 732 by the hinge 756. Another panel of the housing 732 includes a pair of receptacles 735. As is shown in FIG. 7A, the housing 732 is in an open configuration, with the hinged panel 754 rotated about the hinge 756, away from the housing 732.

Referring to FIG. 7B, the cable carrier 730 of FIG. 7A is shown. As is shown in FIG. 7B, the housing 732 is in a closed configuration, with the hinged panel 754 rotated toward the housing 732, and the tabs 758 inserted into the receptacles 735. With the housing 732 in the closed configuration, the cable carrier 730 may be slidably mounted into a channel of a cable housing assembly, and the components mounted therein will remain undisturbed during installation and use.

In accordance with the present disclosure, cable carriers may be slidably mounted to cable housing assemblies in any manner. Referring to FIGS. 8A through 8D, views of components of one cable housing assembly in accordance with implementations of the present disclosure are shown. Except where otherwise noted, reference numerals preceded by the number "8" shown in FIGS. 8A through 8D indicate components or features that are similar to components or features having reference numerals preceded by the number "7" shown in FIGS. 7A and 7B, by the number "6" shown in FIGS. 6A through 6G, by the number "5" shown in FIGS. 5A through 5G, by the number "4" shown in FIGS. 4A through 4G, by the number "3" shown in FIGS. 3A through 3G, by the number "2" shown in FIGS. 2A through 2G or by the number "1" shown in FIGS. 1A through 1F.

Figure 8A:
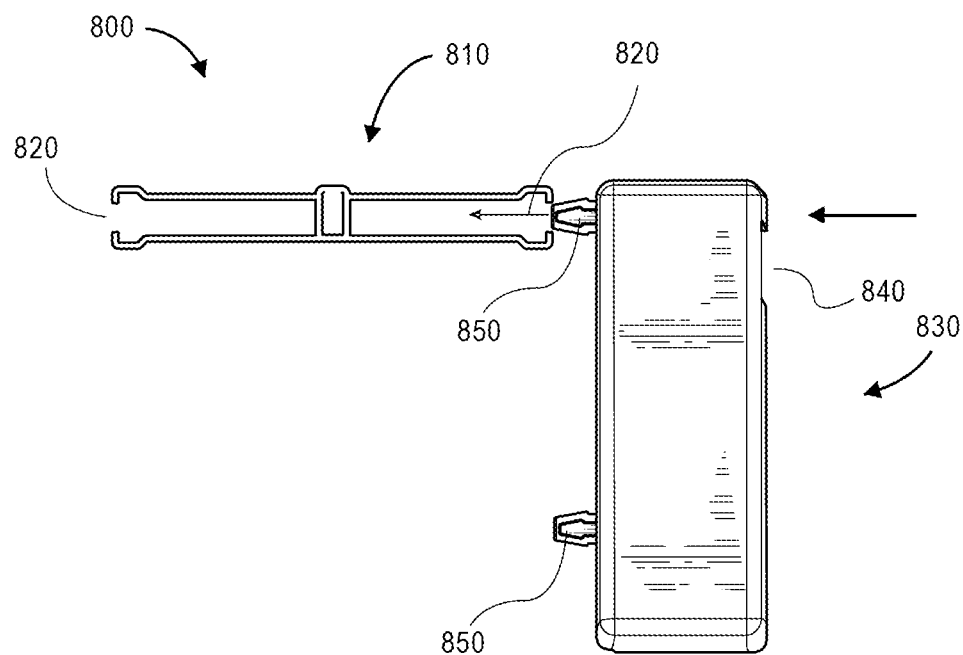
FIGS. 8A through 8D are views of components of one cable housing assembly in accordance with implementations of the present disclosure.
Figure 8B:
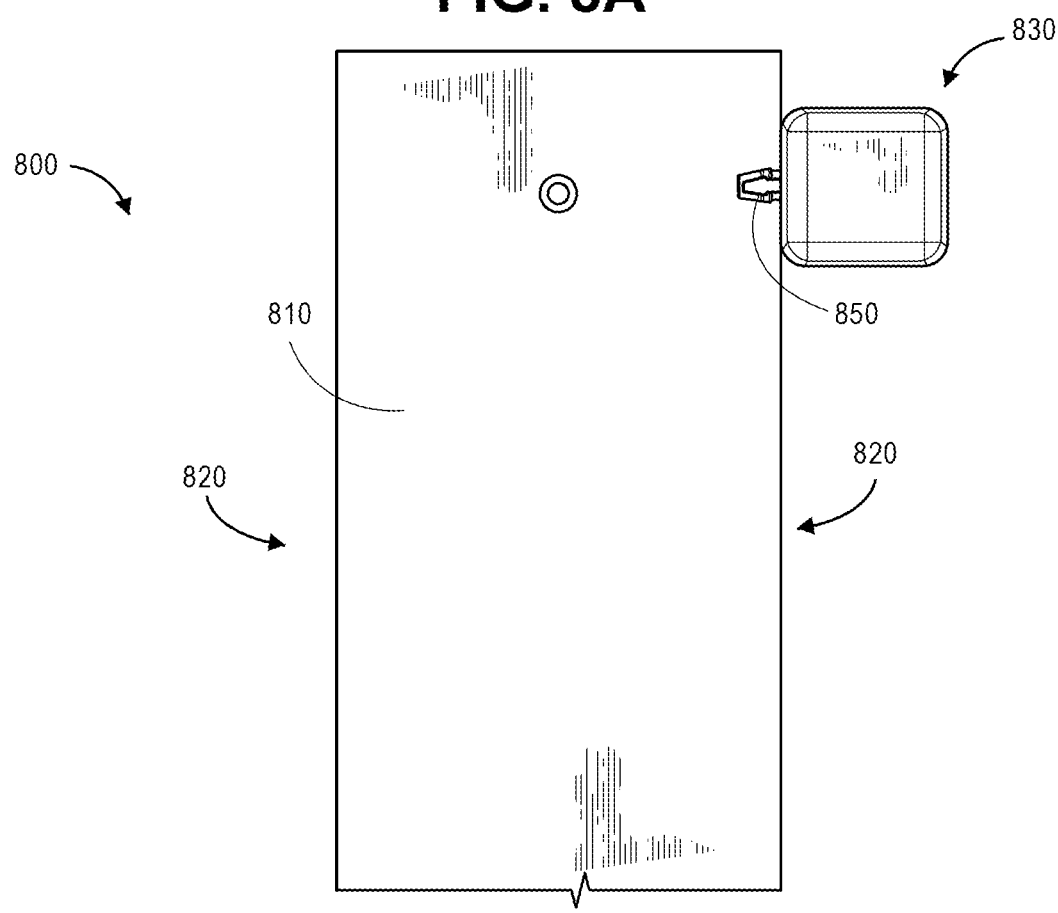

Referring to FIG. 8A, a top view of a system 800 including a cable housing assembly 810 and a cable carrier 830 is shown. Referring to FIG. 8B, a front view of the system 800 is shown.

The cable housing assembly 810 includes a frame 812 having a pair of channels 820 defined by edges of panels. The cable carrier 830 includes a housing 832 defined by a plurality of panels. The housing 832 includes an opening 840 on a first panel for mounting a jack, a socket, a port or another module therein and a pair of retention elements 850 extending from a second panel, opposite the first panel. The cable carrier 830 includes similar attributes, qualities and/or features as the cable carrier 630 of FIGS. 6A through 6G or the cable carrier 730 of FIGS. 7A and 7B, and is constructed in a similar manner. As is shown in FIGS. 8A and 8B, the cable carrier 830 is aligned substantially perpendicular to the frame 812. A first one of the retention elements 850 is aligned substantially normal to one of the channels 820 of the frame 812 for insertion therein, e.g., by applying an external force to the cable carrier 830 on the first panel in which the opening 840 is provided.

Figure 8C:
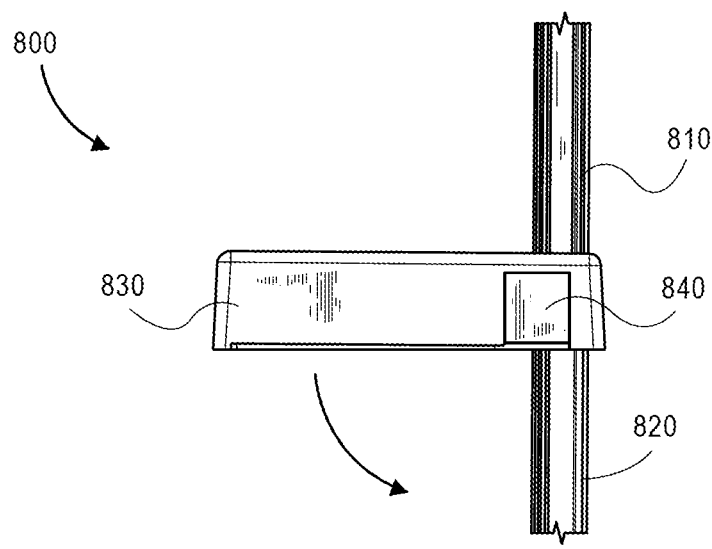
Figure 8D:
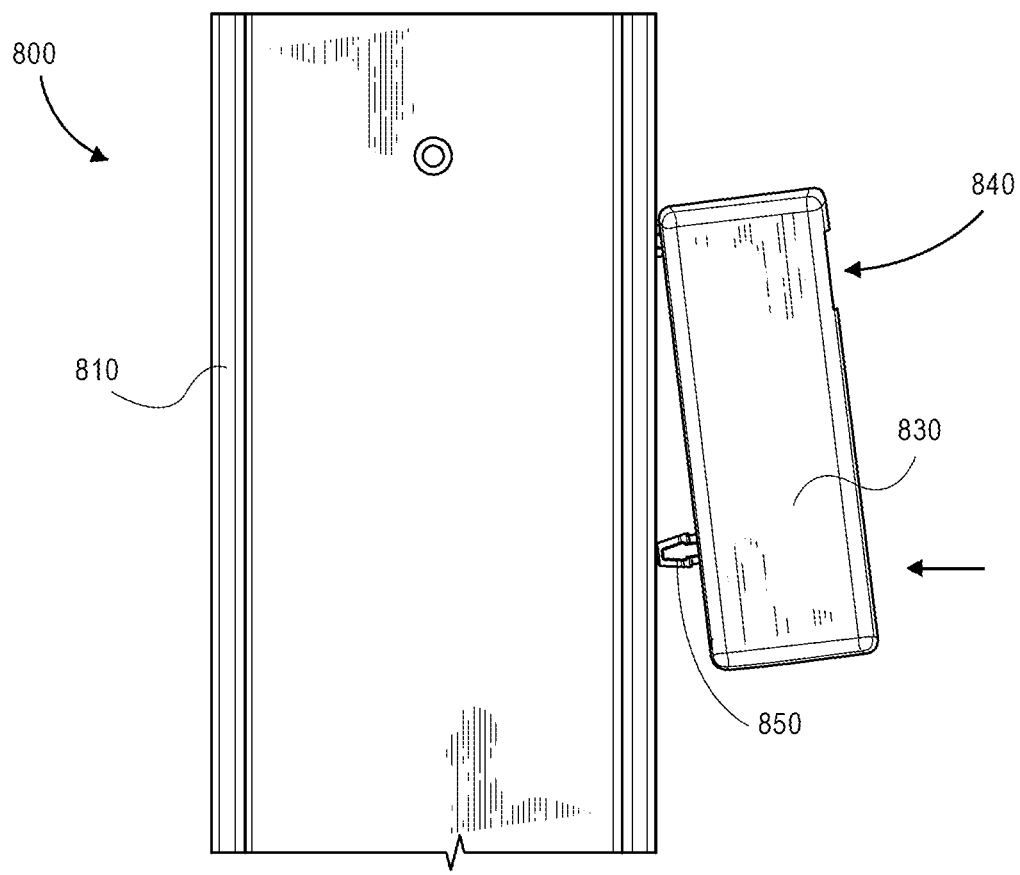

Referring to FIG. 8C, a side view of the system 800 is shown. With the first one of the retention elements 850 of the cable carrier 830 inserted into the channel 820, the cable carrier 830 may be rotated downward until the cable carrier 830 is aligned substantially parallel to the frame 812, and a second one of the retention elements 850 is aligned with the one of the channels 820 into which the first one of the retention elements 850 has been inserted. Referring to FIG. 8D, a front view of the system 800 is shown. With the cable carrier 830 aligned substantially parallel to the frame 812, the slidable mounting of the cable carrier 830 to the frame 812 may be completed by applying another external force to the cable carrier 830 to insert the second one of the retention elements 850 therein. After the second one of the retention elements 850 is inserted into the channel 820, the cable carrier 830 may be translated along the frame 812 in vertical directions A cable housing assembly may be formed by mounting a frame to a surface where power, communications or other connections are desired at one or more varying heights. Referring to FIGS. 9A through 9E, views of components of one cable housing assembly in accordance with implementations of the present disclosure are shown. Except where otherwise noted, reference numerals preceded by the number "9" shown in FIGS. 9A through 9E indicate components or features that are similar to components or features having reference numerals preceded by the number "8" shown in FIGS. 8A through 8D, by the number "7" shown in FIGS. 7A and 7B, by the number "6" shown in FIGS. 6A through 6G, by the number "5" shown in FIGS. 5A through 5G, by the number "4" shown in FIGS. 4A through 4G, by the number "3" shown in FIGS. 3A through 3G, by the number "2" shown in FIGS. 2A through 2G or by the number "1" shown in FIGS. 1A through 1F.

Figure 9A:
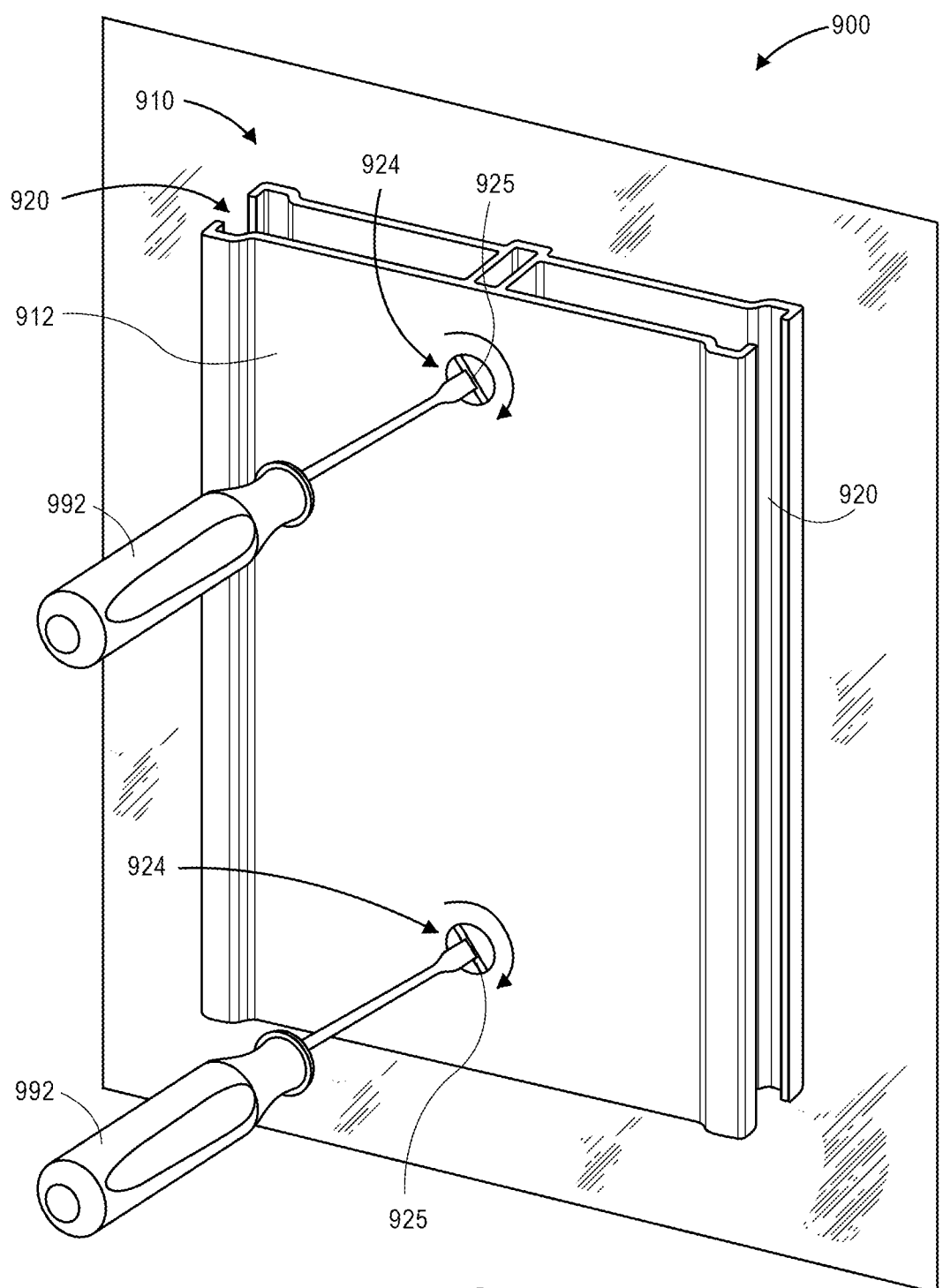
FIGS. 9A through 9E are views of components of one cable housing assembly in accordance with implementations of the present disclosure.

As is shown in FIG. 9A, a cable housing assembly frame 912 is mounted to a surface 972 where connections to one or more power or communications sources or systems are desired, such as a backerboard of a storage unit, or any other surface. As is shown in FIG. 9A, the frame 912 is mounted to the surface 972 by inserting screws 925 into mounting bores 924 extending through the frame 912, and causing the screws 925 to be inserted into the surface 972 by tools 992. In some implementations, the frame 912 may be mounted to the surface 972 using bolts, rivets, nails or other like fasteners. In some other implementations, the frame 912 may be joined to the surface 972 using belts, straps, bands, clamps, clips or any other tension or compression members, as well as any number of glues, straps, or other adhesives (e.g., sufficiently durable tapes that may be backed with one or more natural or artificial liners, as well as one or more hook-and-loop fasteners).

Figure 9B:
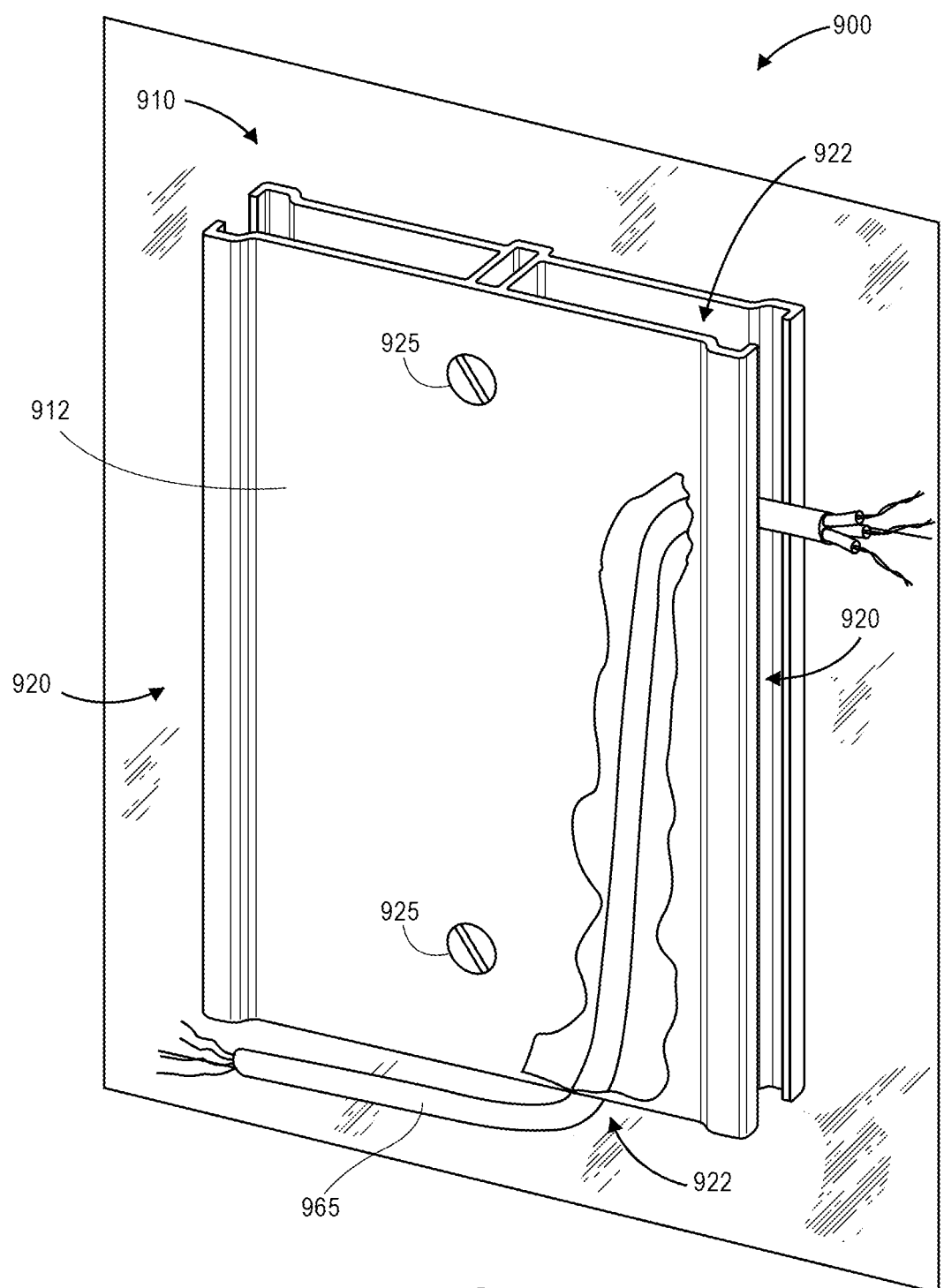

As is shown in FIG. 9B, a cable 965 may be extended into a void 922 within the frame 912, e.g., from below the frame 912, and out of a channel 920 on one edge of the frame 912. In some implementations, the void 922 may be sized and shaped to enable the cable 965, e.g., an Ethernet cable, a coaxial cable, a telephone cable or the like, to be inserted into the void 922 from below the frame 912 and pulled through the channel 920, or vice versa, without a plug (e.g., a male plug) or a keystone jack (e.g., a female port) on either end of the cable 965. Alternatively, in some implementations, the cable 965 may be extended into the void 922 from above the frame 912. Alternatively, in still other implementations, the cable 965 may be extended into a void on another edge (e.g., a left edge) of the frame 912, and pulled through a channel on that edge.

Figure 9C:
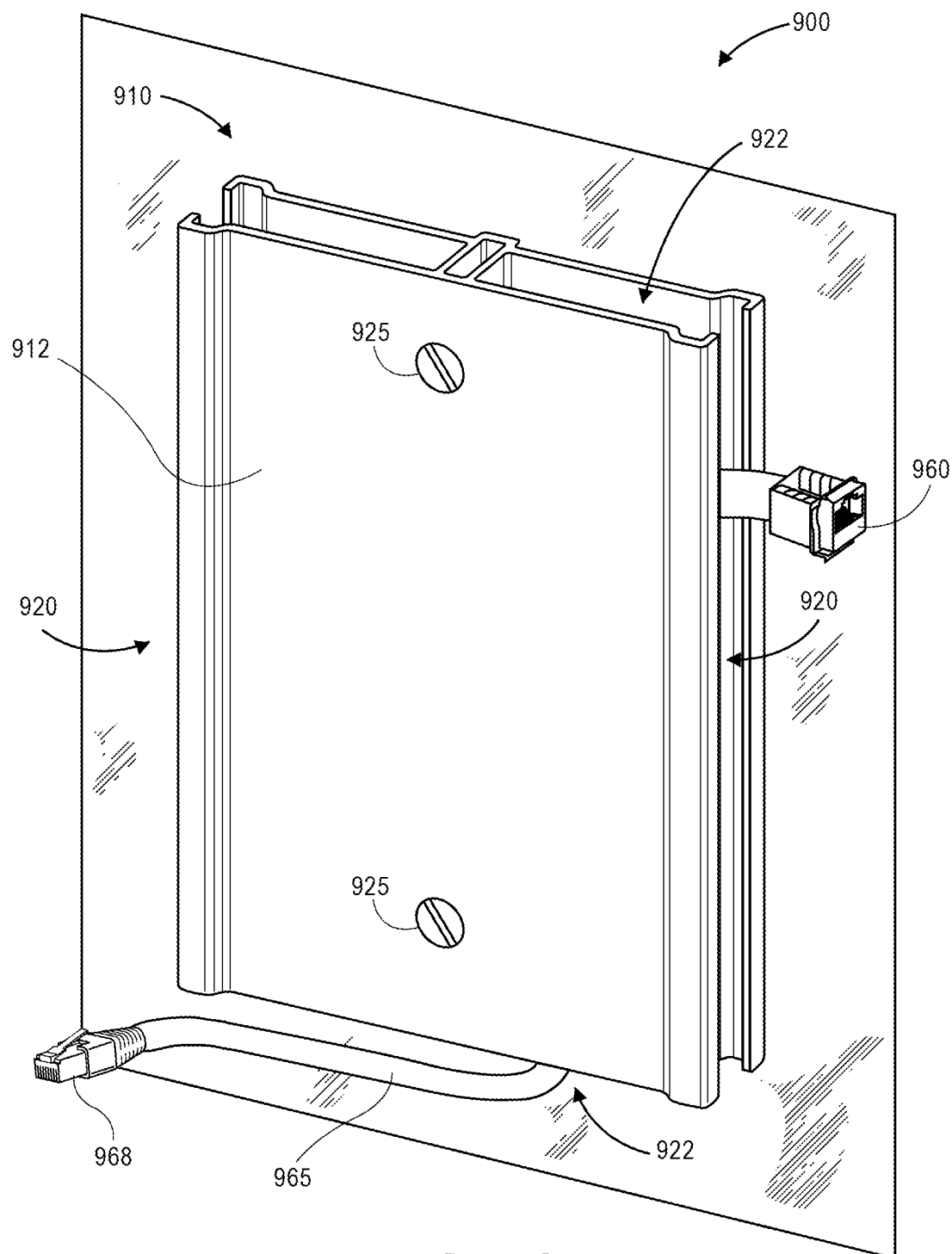

As is shown in FIG. 9C, after the cable 965 has been extended into the void 922 from below the frame 912, and out of the channel 920, the cable 965 may be configured to connect with one or more power or network sources by installing a female port 960 at an end of the cable 965 extending through the channel and a male plug 968 at an end of the cable 965 below the frame 912.

Figure 9D:
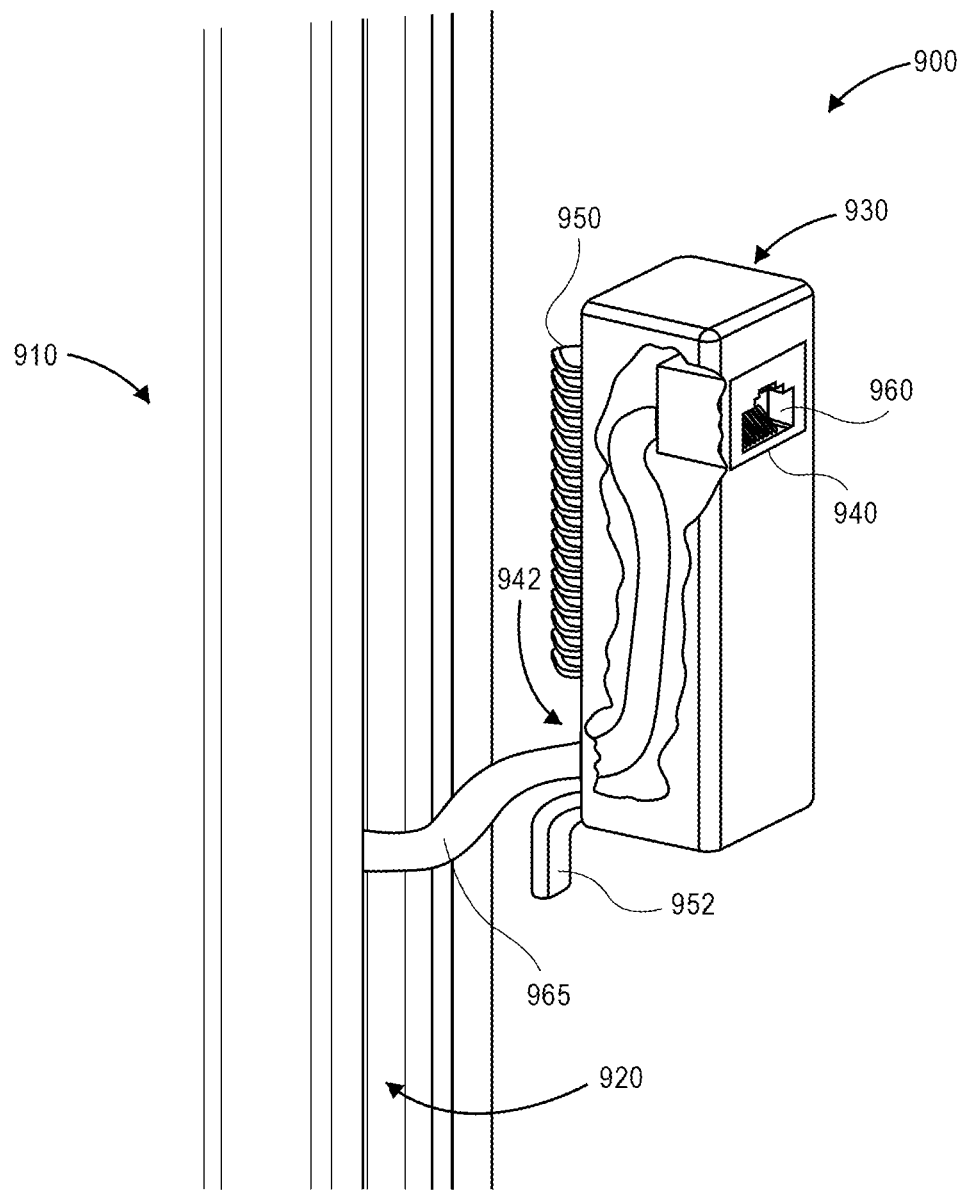

As is shown in FIG. 9D, after the female port 960 has been installed at the end of the cable 965, the female port 960 may be installed within a cable carrier 930. For example, the female port 960 may be installed in a manner that causes a front face of the female port 960 to be flush with an outer surface of one panel of the cable carrier 930 or, alternatively, extended from or recessed into the panel of the cable carrier 930. The cable 965 may be passed into the cable carrier 930 through an opening 942 provided between a plurality of retention elements 950 and a cable guide 952 on one panel of the cable carrier 930, either after an end of the cable 965 has been coupled to the female port 960, such as is shown in FIG. 9C, or, alternatively, prior to coupling the end of the cable 965 to the female port 960. For example, the female port 960 may be installed into an opening 940 in the cable carrier 930 before inserting the end of the cable 965 into the opening 942 and guiding the end of the cable 965 to the female port 960, wherein the cable 965 may be coupled thereto.

The cable guide 952 is a curved extension coupled to the cable carrier 930 at or near an edge of the opening 942. The cable guide 952 is curved between a proximal end that is coupled to and extends substantially normal from the cable carrier 930, and a distal end of the cable guide that is aligned substantially parallel to the cable carrier 930. As is discussed above, a portion of a cable or other connector (e.g., a low-voltage connector, not shown in FIG. 9A) may extend into the cable carrier 930 by way of the opening 942, and a terminus of the cable may be coupled to a jack, a socket, a port or another module installed therein at the opening 940. When slidably mounting the cable carrier 930 to a cable housing assembly frame, the retention elements 950, a portion of the cable and the cable guide 952 are inserted into a channel of the cable housing assembly frame, preferably with the cable guide 952 oriented vertically below the opening 942. Thus, the cable guide 952 may urge a portion of the cable away from the channel of the cable housing assembly frame as the cable carrier 930 slides up or down the channel, thereby reducing the risk of snags or tangles between portions of the cable and the channel.

Figure 9E:
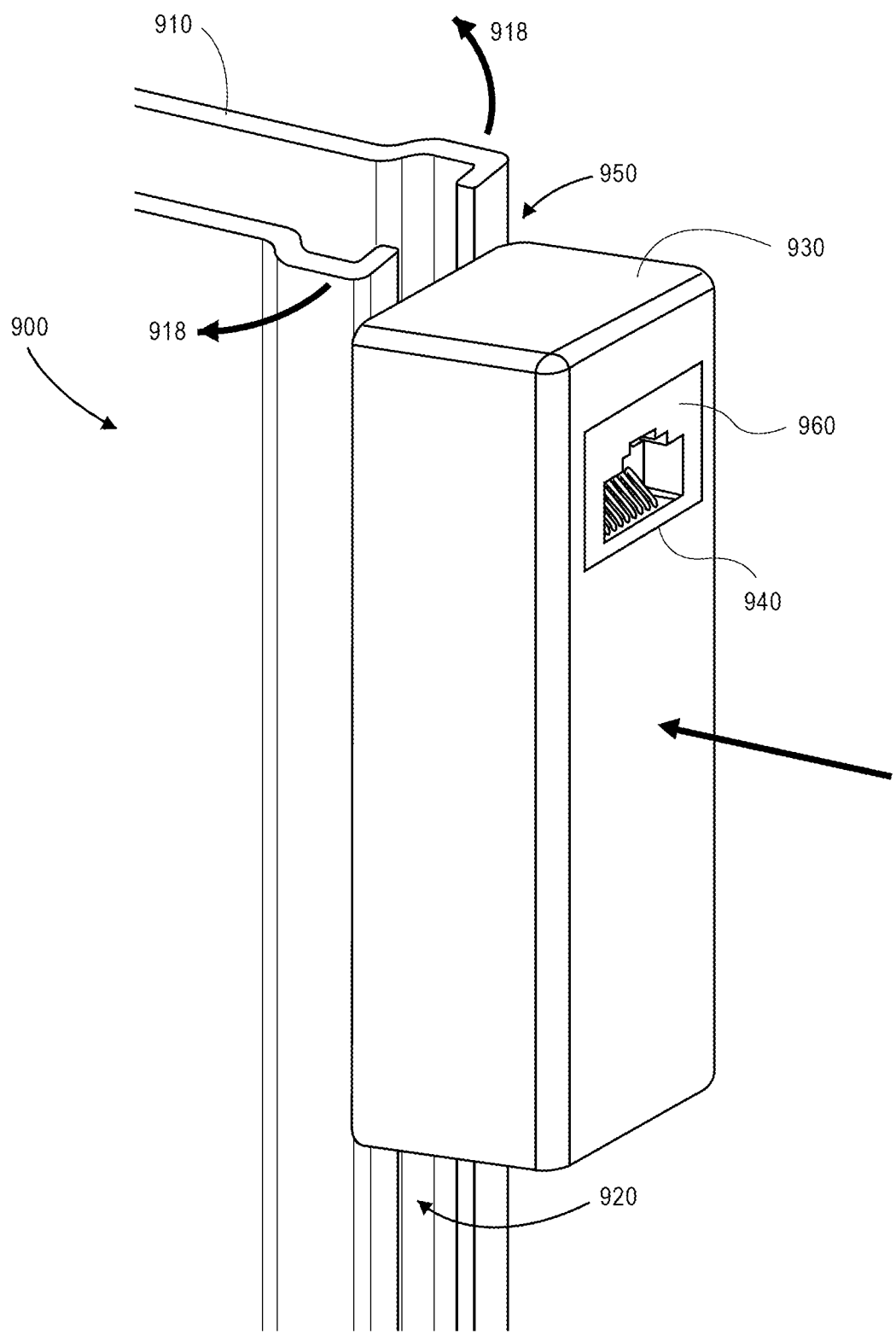

As is shown in FIG. 9E, with the cable 965 coupled to the female port 960 therein, the cable carrier 930 may be releasably inserted into the channel 920 of the frame 912, e.g., by applying an external force to urge the retention elements 950 into the channel 920, thereby causing edges 918 defining the channel 920 to widen in order to accommodate ends (e.g., heads) of the retention elements 950 therein. After the ends of the retention elements 950 have been inserted into the channel 920 by a sufficient distance, the edges 918 that define the channel 920 may return to their original form and configuration. With the ends of the retention elements 950 secured within the channel 920, the cable carrier 930 is enabled to be vertically translated up or down within the channel 920 as shown.

Figure 10A:
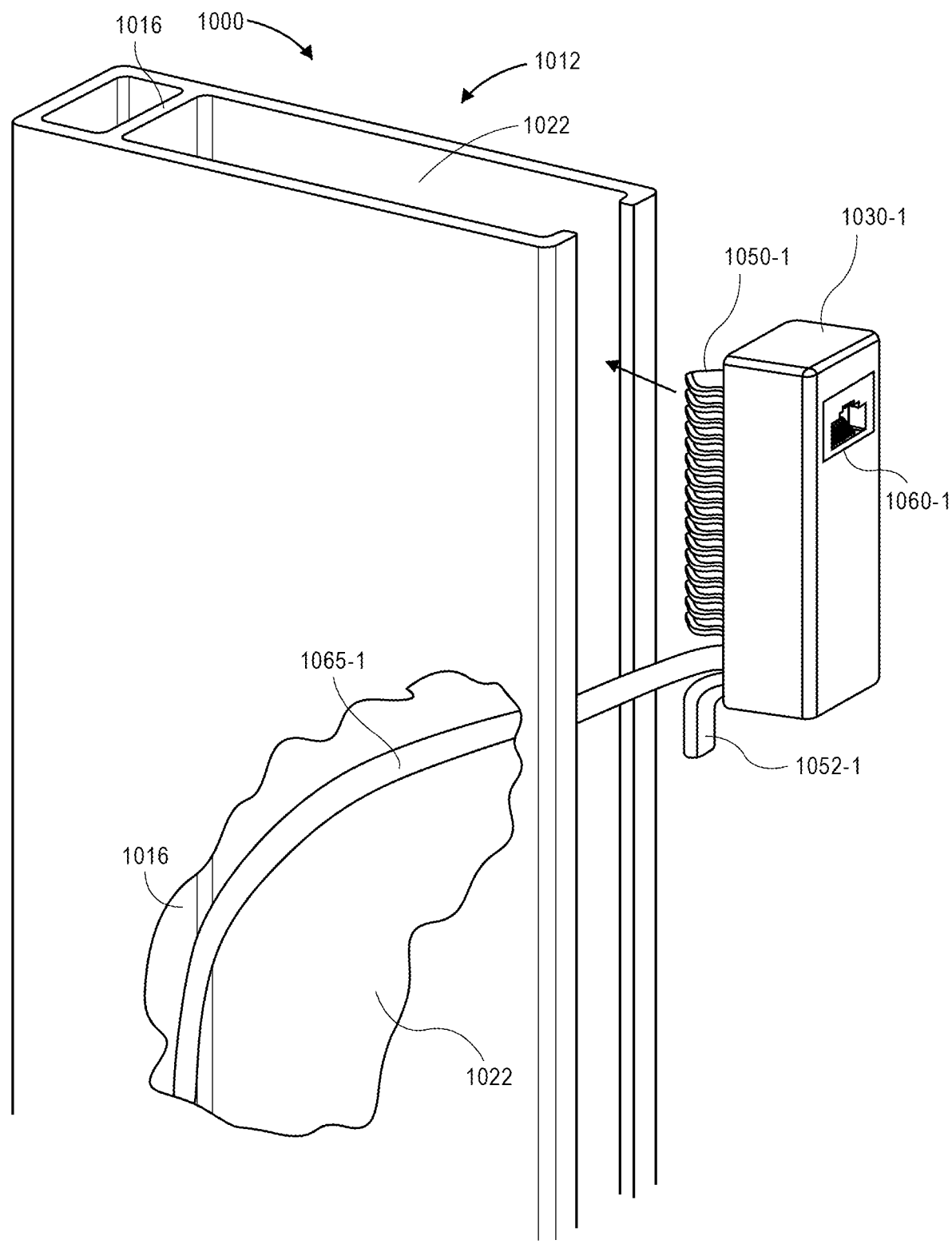
FIGS. 10A through 10C are views of components of one cable housing assembly in accordance with implementations of the present disclosure.
Figures 10B, 10C:
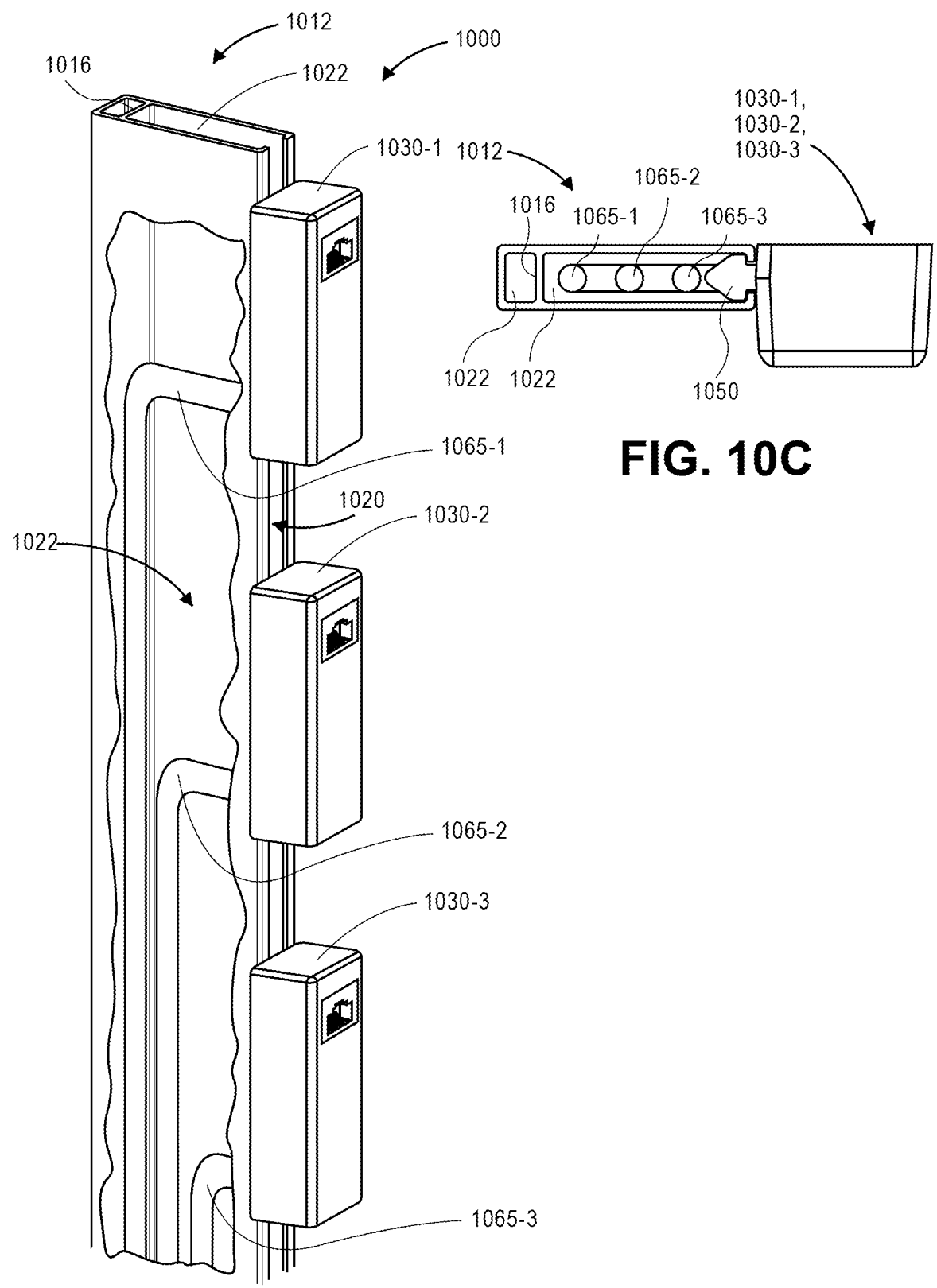

As is discussed above, in some implementations of the present disclosure, the cable housing assemblies of the present disclosure may include a plurality of cable carriers slidably mounted in one or more channels provided in a frame. A void within the frame may be sized to accommodate any number of cables therein. Referring to FIGS. 10A through 10C, views of components of one cable housing assembly in accordance with implementations of the present disclosure are shown. Except where otherwise noted, reference numerals preceded by the number "10" shown in FIGS.

10A through 10C indicate components or features that are similar to components or features having reference numerals preceded by the number "9" shown in FIGS. 9A through 9E, by the number "8" shown in FIGS. 8A through 8D, by the number "7" shown in FIGS. 7A and 7B, by the number "6" shown in FIGS. 6A through 6G, by the number "5" shown in FIGS. 5A through 5G, by the number "4" shown in FIGS. 4A through 4G, by the number "3" shown in FIGS. 3A through 3G, by the number "2" shown in FIGS. 2A through 2G or by the number "1" shown in FIGS. 1A through 1F.

Referring to FIG. 10A, a cable housing assembly 1010 including a frame 1012 and a cable carrier 1030-1 to be inserted in to the frame 1012 is shown. As is shown in FIG. 10A, the frame 1012 includes a single channel 1020 on one edge of the frame 1012, and a single void 1022 for accommodating cables. The void 1022 is provided between the channel 1020 and a spacer 1016.

The cable carrier 1030-1 is defined by a plurality of panels and includes a plurality of retention elements 1050-1 and a cable guide 1052-1 on one panel, and a keystone jack 1060-1 on another panel. A cable 1065-1 extends from the keystone jack 1060-1 in the frame 1012, out an opening 1042-1 in the cable carrier 1030-1, and into the channel 1020, where the cable 1065-1 descends through the void 1022 to one or more power or communications sources or systems (not shown). The cable carrier 1030-1 may be slidably mounted to the frame 1012 by inserting the retention elements 1050-1 and the cable guide 1052-1, along with any slack or excess length in the cable 1065-1, into the channel 1020.

Referring to FIG. 10B, the cable housing assembly 1010 is shown with a plurality of cable carriers 1030-1, 1030-2, 1030-3 slidably mounted to the frame 1012, viz., in the channel 1020. The cable carriers 1030-1, 1030-2, 1030-3 may be homogenous in nature, with each of the cable carriers 1030-1, 1030-2, 1030-3 having common sizes, shapes and configurations, or may be heterogeneous in nature, with one or more of the cable carriers 1030-1, 1030-2, 1030-3 having a size, a shape or a configuration that is different from another of the cable carriers 1030-1, 1030-2, 1030-3. Each of the cable carriers 1030-1, 1030-2, 1030-3 may be slidably mounted to the frame 1012 in a common manner, e.g., with sets of retention elements 1050-1, 1050-2, 1050-3 that are inserted into the channel 1020 and enable the cable carriers 1030-1, 1030-2, 1030-3 to translate in either direction within the channel 1020. Moreover, in some implementations, each of the cable carriers 1030-1, 1030-2, 1030-3 may have keystone jacks 1060-1, 1060-2, 1060-3 coupled to cables 1065-1, 1065-2, 1065-3 for providing connections to a common service or system, e.g., to power, to a network, or to another service or system. In some other implementations, however, one or more of the keystone jacks 1060-1, 1060-2, 1060-3 may provide connections to a service that is different from another of the keystone jacks 1060-1, 1060-2, 1060-3.

Referring to FIG. 10C, a top view of the cable housing assembly 1010 is shown, with each of the cables 1065-1, 1065-2, 1065-3 extended within the void 1022. The cables 1065-1, 1065-2, 1065-3 are sufficiently spaced within the void 1022 to avoid contact within one another while enabling the cable carriers 1030-1, 1030-2, 1030-3 to translate within the channel 1020. In some implementations, the void 1022 may be sized and shaped to accommodate any number of cables 1065-1, 1065-2, 1065-3 therein, e.g., one to six.

Figure 11A:
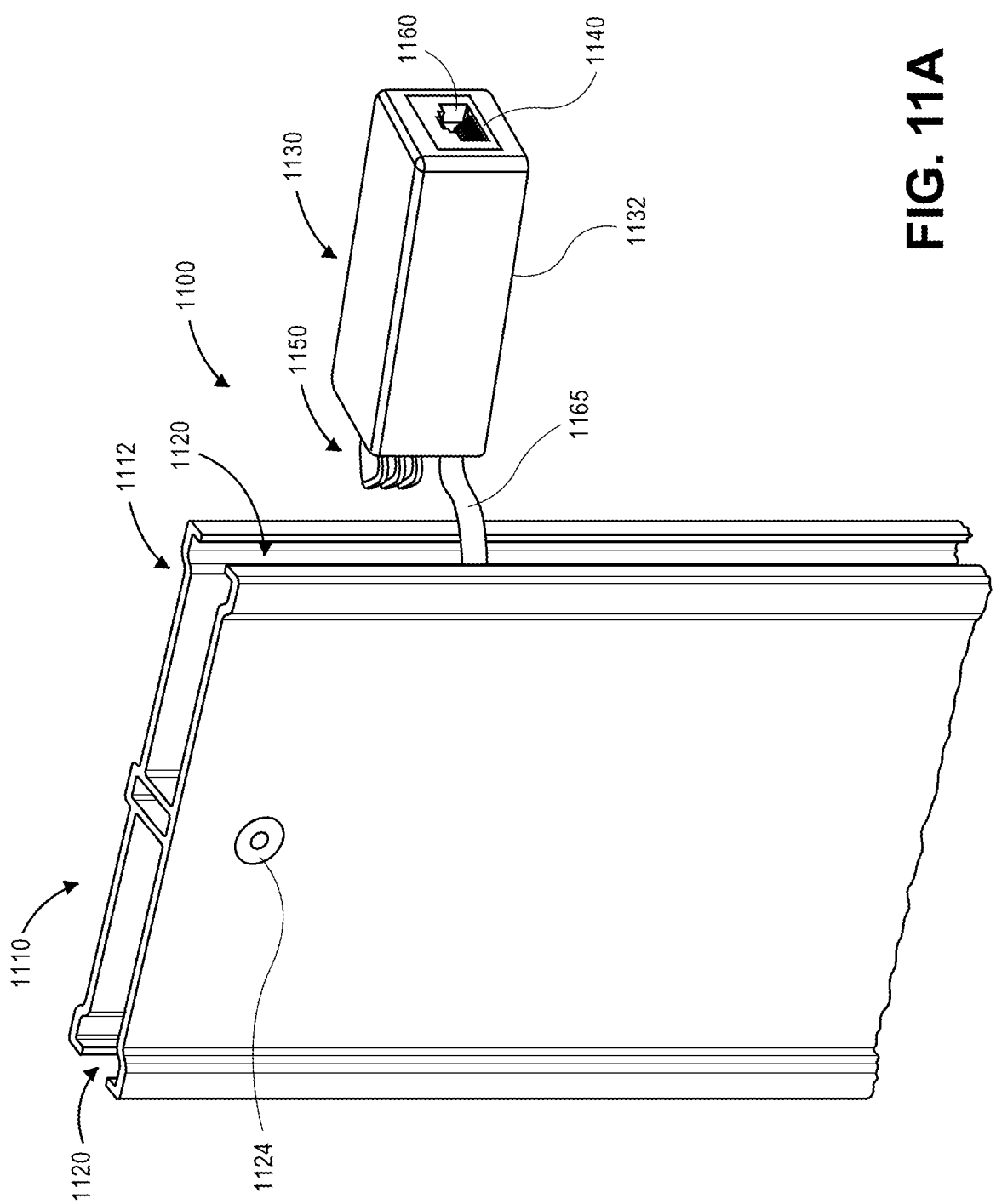
FIGS. 11A and 11B are views of components of one cable housing assembly in accordance with implementations of the present disclosure.
Figure 11B:
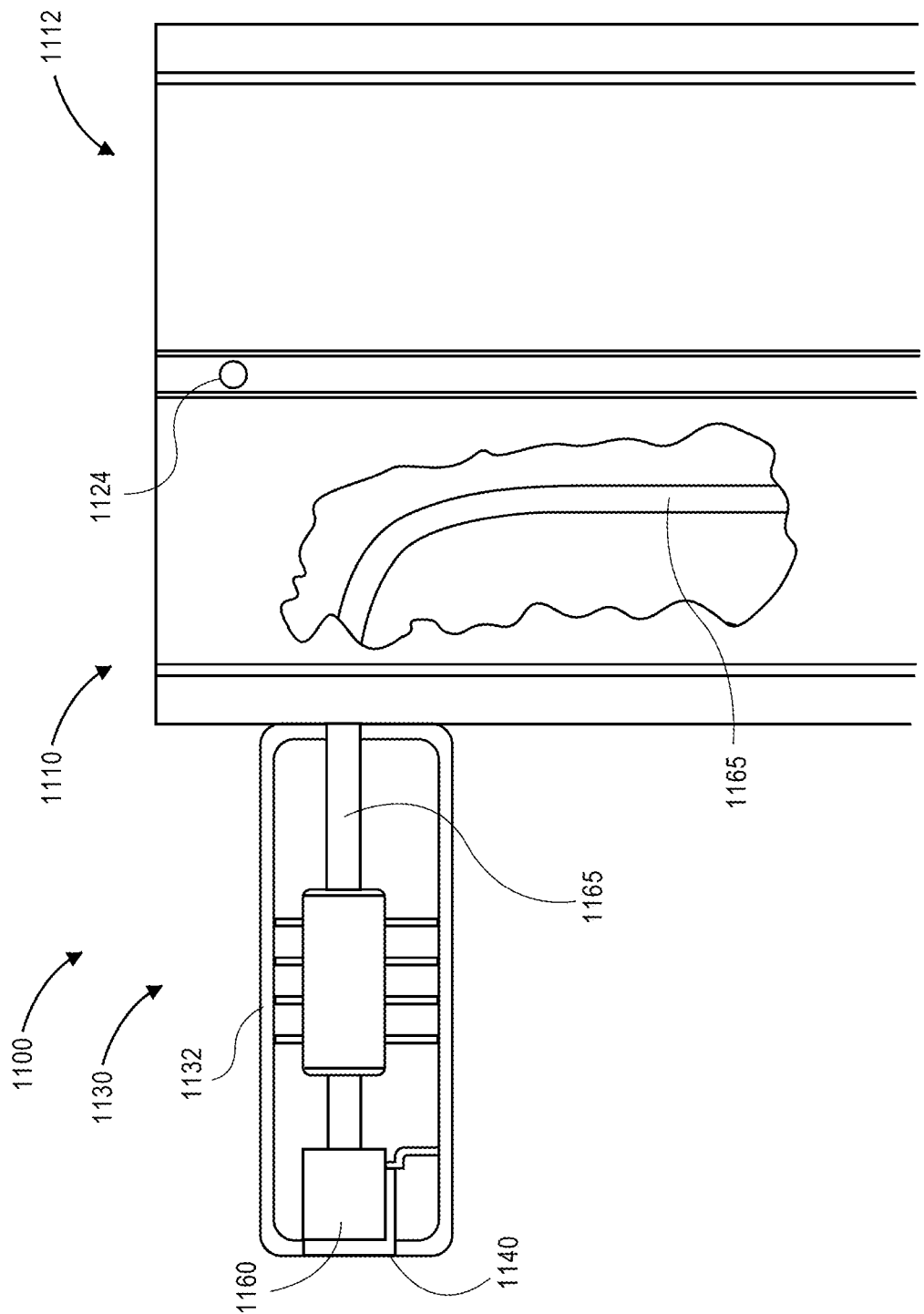

As is discussed above, cable housing assemblies of the present disclosure may include one or more cable carriers that are slidably mounted to frames in any alignment or orientation with respect to the frames. Referring to FIGS. 11A and 11B, views of components of one cable housing assembly in accordance with implementations of the present disclosure are shown. Except where otherwise noted, reference numerals preceded by the number "8" shown in FIGS. 11A and 11B indicate components or features that are similar to components or features having reference numerals preceded by the number "10" shown in FIGS. 10A through 10C, by the number "9" shown in FIGS. 9A through 9E, by the number "8" shown in FIGS. 8A through 8D, by the number "7" shown in FIGS. 7A and 7B, by the number "6" shown in FIGS. 6A through 6G, by the number "5" shown in FIGS. 5A through 5G, by the number "4" shown in FIGS. 4A through 4G, by the number "3" shown in FIGS. 3A through 3G, by the number "2" shown in FIGS. 2A through 2G or by the number "1" shown in FIGS. 1A through 1F.

As is shown in FIGS. 11A and 11B, a cable housing assembly 1110 includes a frame 1112 and a cable carrier 1130. The frame 1112 is defined by a plurality of panels and includes a pair of channels 1120 on either edge of the frame 1112, as well as a mounting bore 1124 extending through the panels of the frame 1112. The cable carrier 1130 includes a housing (or frame) 1132, an opening 1140 in a distal end of the housing 1132 and a plurality of retention elements 1150 in a proximal end of the housing 1132. A keystone jack 1160 coupled to a cable 1165 is installed in and extends through the opening 1140. The cable 1165 extends through an opening 1142 in the proximal end of the housing 1132 and into the channel 1120.

Unlike the cable carrier 130 of FIGS. 1A and 1B, which includes retention elements 150 along a longest panel or side of the cable carrier 130, and is configured for slidable mounting into the frame 112 with the longest panel or side of the cable carrier 130 parallel to the channel 120, the cable carrier 1130 of FIGS. 11A and 11B includes retention elements 1150 along a shortest panel or side of the cable carrier 1130. Thus, the cable carrier 1130 is configured for slidable mounting into the frame 1112 with the longest panel or side of the cable carrier 1130 perpendicular to the channel 1120. Those of ordinary skill in the pertinent arts will recognize that a cable carrier may be slidably mounted to a frame of a cable housing assembly in any alignment or orientation, and are not limited to any of the alignments or orientations described herein. For example, in some other implementations, a cable carrier may be configured for slidable mounting into a frame with a longest panel or side of the cable carrier in alignments or orientations other than parallel or perpendicular with respect to the frame.

Figure 12A:
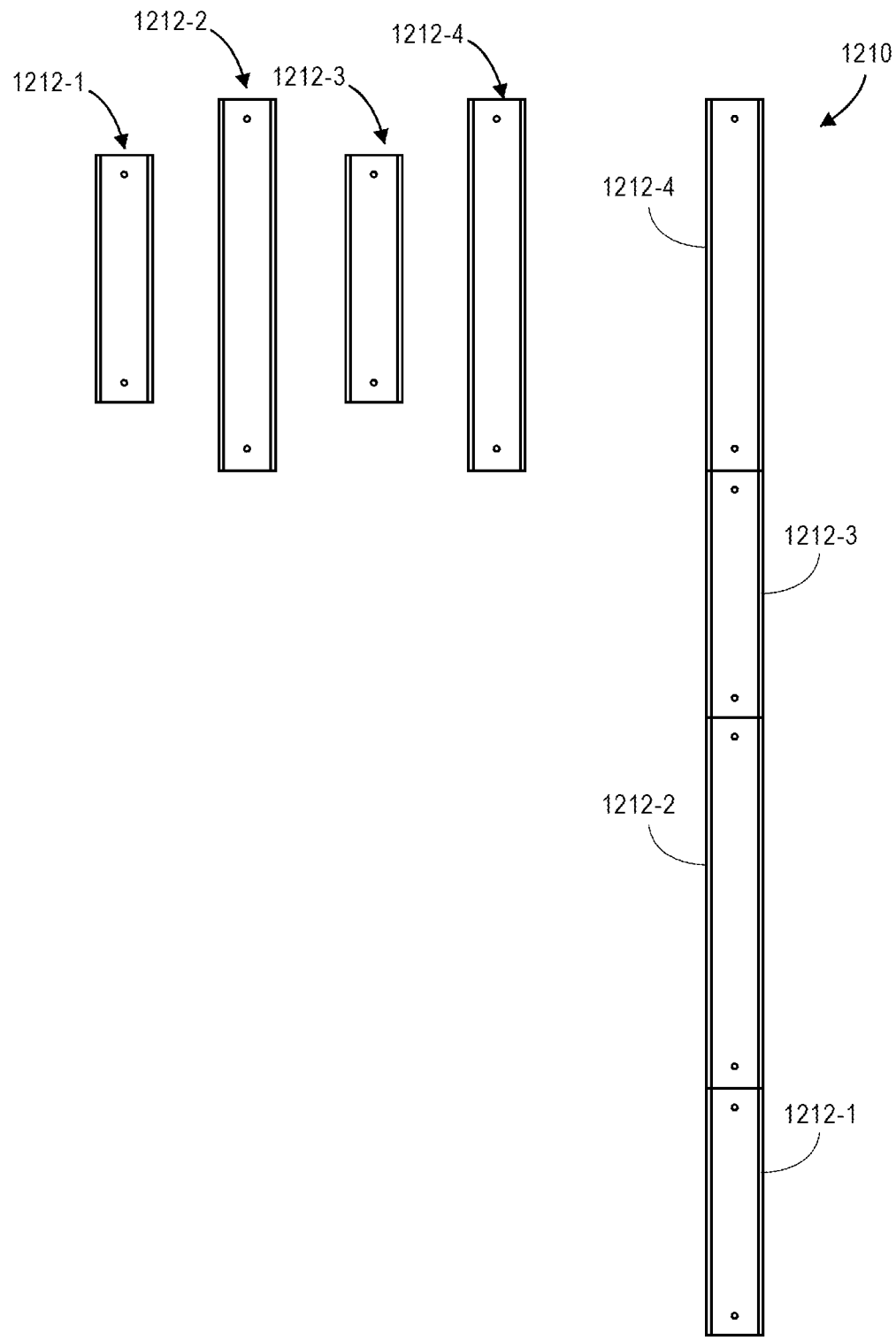

As is discussed above, a cable housing assembly may be formed from any number of frames, which may include any number of channels for accommodating any number of cable carriers therein. Referring to FIGS. 12A through 12C, a view of components of one cable housing assembly in accordance with implementations of the present disclosure is shown. Except where otherwise noted, reference numerals preceded by the number "12" shown in FIGS. 12A through 12C indicate components or features that are similar to components or features having reference numerals preceded by the number "11" shown in FIGS. 11A and 11B, by the number "10" shown in FIGS. 10A through 10C, by the number "9" shown in FIGS. 9A through 9E, by the number "8" shown in FIGS. 8A through 8D, by the number "7" shown in FIGS. 7A and 7B, by the number "6" shown in FIGS. 6A through 6G, by the number "5" shown in FIGS. 5A through 5G, by the number "4" shown in FIGS. 4A through 4G, by the number "3" shown in FIGS. 3A through 3G, by the number "2" shown in FIGS. 2A through 2G or by the number "1" shown in FIGS. 1A through 1F.

Referring to FIG. 12A, a plurality of frames 1212-1, 1212-2, 1212-3, 1212-4 having varying lengths are shown. The plurality of frames 1212-1, 1212-2, 1212-3, 1212-4 may be aligned in series to form a cable housing assembly 1210, e.g., by mounting the plurality of frames 1212-1, 1212-2, 1212-3, 1212-4 in vertical co-alignment such that voids within the respective frames 1212-1, 1212-2, 1212-3, 1212-4 and channels defined by edges of such frames 1212-1, 1212-2, 1212-3, 1212-4 are provided in series with one another.

Referring to FIG. 12B, a plurality of cable carriers 1230-1, 1230-2, 1230-3, 1230-4, 1230-5, 1230-6, each having one or more jacks, ports, sockets or other modules and cables extending from such components into one or more voids of the frames 1212-1, 1212-2, 1212-3, 1212-4 are slidably mounted to the frames 1212-1, 1212-2, 1212-3, 1212-4 in channels provided on either side of the cable housing assembly 1210, which may be installed in association with a set of shelves or another storage unit, and may provide any number of power or network connections to the shelves or the storage unit. Referring to FIG. 12C, the plurality of cable carriers 1230-1, 1230-2, 1230-3, 1230-4, 1230-5, 1230-6 may be translated within such frames to selected positions along a length of the cable housing assembly 1210, in order to make power or communications services available at such positions. For example, where each of the cable carriers 1230-1, 1230-2, 1230-3, 1230-4, 1230-5, 1230-6 includes a single power or network connection, the cable housing assembly 1210 may provide power or network connectivity at six discrete locations, by vertically repositioning the cable carriers 1230-1, 1230-2, 1230-3, 1230-4, 1230-5, 1230-6 with respect to one another, and connecting one or more components to such carriers, such as is shown in FIG. 1F.

Figure 13:
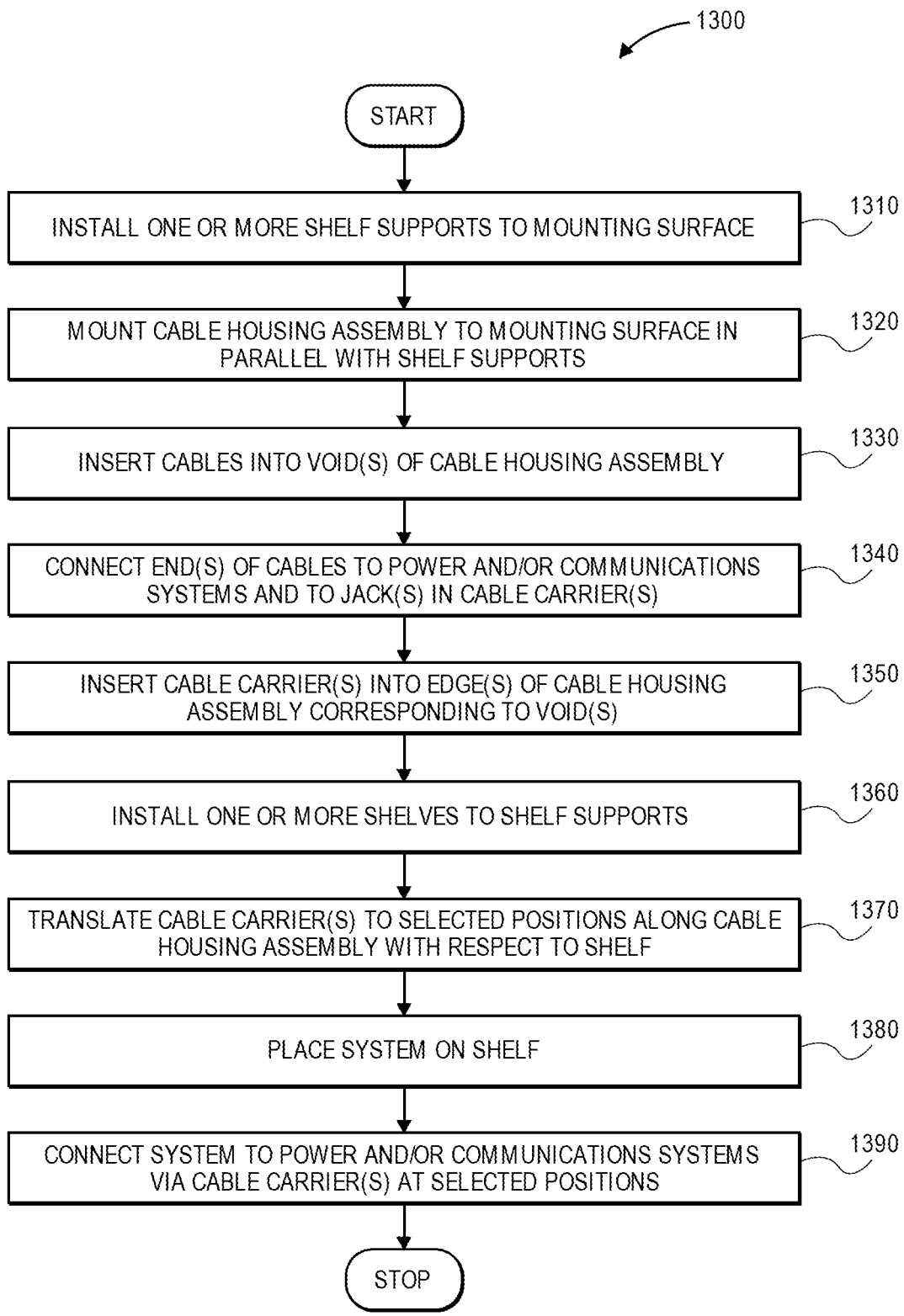
FIG. 13 is a flow chart of one process for operating a cable housing assembly in accordance with implementations of the present disclosure.

One or more of the cable housing assemblies of the present disclosure may be installed in association with a plurality of shelves or other storage units, thereby enabling one or more systems places upon such shelves to receive power and/or communications services at selected locations. Referring to FIG. 13, a flow chart 1300 of one process for operating a cable housing assembly in accordance with implementations of the present disclosure is shown. At box 1310, one or more shelf supports are installed on a mounting surface. The shelf supports may be mounted to a backerboard or another suitable surface, e.g., by rear faces, and may include a plurality of vertically co-aligned slots, e.g., on front faces, with each of the first plurality of slots being separated by a predetermined vertical distance, such as the shelf supports 174 shown in FIG. 1A. Alternatively, the shelf supports may be mounted in any other manner, and need not be aligned vertically. For example, in some implementations, the mounting surface (e.g., a backerboard or another suitable surface) may be mounted to the shelf supports.

At box 1320, a cable housing assembly is mounted to the mounting surface in parallel with the shelf supports. For example, the cable housing assembly may be mounted by extending one or more fasteners through mounting bores or other openings and into contact with the mounting surface. Alternatively, in some implementations, the cable housing assembly may be mounted to the mounting surface in any other manner, e.g., by one or more belts, straps, bands, clamps, clips or any other tension or compression members, or any number of layers of glues, straps, or other adhesives. Moreover, in some implementations, any number of cable housing assemblies may be mounted to the mounting surface at any angle, and need not be aligned parallel to the shelf supports.

At box 1330, cables are inserted into one or more voids of the cable housing assembly. For example, the cables may be inserted into such voids either singularly or in parallel with one another, such as is shown in FIG. 10B, and either from above or below such voids, or by way of one or more channels associated with such voids.

At box 1340, ends of the cables are connected to power and/or communications systems and to jacks within one or more cable carriers, and at box 1350, the cable carriers are inserted into edges of the cable housing assembly corresponding to the voids. For example, the cables may be coupled to such systems or the cable carriers by way of male and/or female ends, or any other ports or connectors. The cable carriers may be slidably mounted within such channels in any manner, such as is shown in FIGS. 8A through 8D, FIGS. 9A through 9E, FIGS. 10A through 10C, or FIGS. 11A through 11B, or in any other manner. At box 1360, one or more shelves are installed on the shelf supports. For example, in some implementations, a shelf may have one or more hooks that may be inserted into one or more of a plurality of vertically co-aligned slots of the shelf supports. In some other implementations, the shelves may be installed in any other manner, e.g., by way of one or more brackets or other mounting components.

At box 1370, cable carriers may be translated to selected positions along the cable housing assemblies with respect to the shelves. For example, in some implementations, a cable carrier may be slidably mounted in a cable housing assembly above a shelf, and slid vertically downward toward the shelf, such as is shown in FIGS. 1D and 1E, to a selected position. Alternatively, in some implementations, a cable carrier may be slidably mounted in a cable housing assembly below a shelf, and slid vertically upward toward the shelf to a selected position.

At box 1380, a system such as an audio system, a video system, a telephone system, a network communications system, or any other system, is placed on the shelf, e.g., manually or automatically. At box 1390, the system is connected to one or more power or communications systems via the cable carriers at the selected positions, e.g., by inserting a male end of a connector of the system into a female port in the cable carrier, and the process ends.

Although the disclosure has been described herein using exemplary techniques, components, and/or processes for implementing the systems and methods of the present disclosure, it should be understood by those skilled in the art that other techniques, components, and/or processes or other combinations and sequences of the techniques, components, and/or processes described herein may be used or performed that achieve the same function(s) and/or result(s) described herein and which are included within the scope of the present disclosure. For example, in some implementations, the cable housing assemblies disclosed herein may be combined with shelf supports, such as by providing a plurality of vertically co-aligned slots on a first, outwardly extending face, and providing a channel having edges sized to accommodate a cable carrier on a second, laterally oriented face. Although some of the implementations of storage units and/or inventory areas disclosed herein may be provided within a fulfillment center, those of ordinary skill in the pertinent arts will recognize that the systems and methods of the present disclosure are not so limited, and may be utilized in association with any systems for which power, utility, communications or other connections are required, including but not limited to storage units and/or inventory areas having narrow, slender spaces or gaps between two or more components that may be provided in any environment or for any purpose.

Furthermore, although some other implementations of shelves, storage units and/or inventory areas of the present disclosure are referenced as providing support for one or more items, those of ordinary skill in the pertinent arts will recognize that such storage units and/or inventory areas may accommodate any type, form or number of items, and in any location or space thereon, irrespective of any attribute or category of such items.

Moreover, those of ordinary skill in the pertinent arts will further recognize that any type, form or number of the cable housing assemblies of the present disclosure may be provided singly or in tandem for the purpose of providing power, utility, communications or other connections to one or more shelves or like units thereon. For example, although some of the implementations disclosed herein include single cable housing assemblies, with cable carriers slidably disposed on single edges of such assemblies, those of ordinary skill in the pertinent arts will recognize that two or more cable housing assemblies may be provided in association with one or more storage units or like systems, each of which may include cable carriers slidably disposed on one or more edges thereof in accordance with the present disclosure.

Those of ordinary skill in the pertinent arts will further recognize that the cable housing assemblies and/or cable carriers of the present disclosure need not be flat surfaces that are mounted to backerboards or other like structural features of a materials handling facility, or a like facility. Rather, implementations of the present disclosure may include surfaces provided at any angle (e.g., an easel-like structure) that are mounted to frames or structures for providing support in any manner. As is discussed above, used herein, a "materials handling facility" may include, but is not limited to, warehouses, distribution centers, cross-docking facilities, order fulfillment facilities, packaging facilities, shipping facilities, rental facilities, libraries, retail stores or establishments, wholesale stores, museums, or other facilities or combinations of facilities for performing one or more functions of material or inventory handling for any purpose. Likewise, the systems and methods of the present disclosure may also be utilized outside of a traditional materials handling facility environment. For example, when utilized in a home, a plurality of storage units including shelves that are installed in a kitchen, a pantry, a garage, a shed or a work area, may include one or more of the cable housing assemblies and/or cable carriers provided in association with one or more of such shelves.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, orders in which such methods or processes are presented are not intended to be construed as any limitation on the claimed inventions, and any number of the method or process steps or boxes described herein can be combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:
1. A system comprising:
   a frame comprising:
      a first panel;
      a second panel, wherein the first panel and the second panel are substantially parallel to one another;
      a first void between the first panel and the second panel;
      a second void between the first panel and the second panel;
      a first channel defined at least in part by a first edge of the first panel and a second edge of the second panel;
      a second channel defined at least in part by a third edge of the first panel and a fourth edge of the second panel;
      a first spacer coupled to each of the first panel and the second panel, wherein the first spacer is substantially perpendicular to each of the first panel and the second panel, and wherein the first void is defined at least in part by the first spacer, the first panel, the second panel and the first channel; and
a second spacer coupled to each of the first panel and the second panel, wherein the second spacer is substantially perpendicular to each of the first panel and the second panel, and wherein the second void is defined at least in part by the second spacer, the first panel, the second panel and the second channel;
a first carrier slidably mounted to the frame, wherein the first carrier comprises:
a third panel having a first opening extending therethrough;
a first jack disposed within the first opening;
a fourth panel having a second opening extending therethrough; and
at least a first retention element mounted to the fourth panel; and
a first cable having a first end and a second end,
wherein the first end is coupled to the first jack disposed within the first opening,
wherein at least the first retention element is releasably inserted into the first channel, and
wherein a portion of the first cable extends from the first jack through the second opening into the first void by the first channel and out of the first void at a first end of the frame.

2. The system of claim 1, wherein the first carrier further comprises a fifth panel, a sixth panel and a seventh panel,
wherein the third panel, the fourth panel, the fifth panel and the sixth panel define an open cavity having a rectangular shape,
wherein the seventh panel is a bottom of the open cavity,
wherein each of the third panel and the fourth panel has a first length, and
wherein each of the fifth panel and the sixth panel has a second length.

3. The system of claim 2, wherein the first length is greater than the second length.

4. The system of claim 1, wherein the frame is formed from by an extrusion process from at least one of:
aluminum;
an aluminum alloy; or
a steel alloy.

5. The system of claim 1, wherein the first carrier is formed in an injection molding process from at least one of:
an acrylonitrile butadine styrene;
a polyester;
a polyethylene;
a polypropylene;
a polyurethane; or
a polyvinyl chloride.

6. The system of claim 1, wherein the first cable is one of:
an Ethernet cable;
a telephone cable;
a fiber optic cable;
a speaker wire;
at least one RCA cable;
an F-pin cable;
an S-video cable;
a Y/C cable;
a coaxial cable;
a DVI cable; or
an HDMI cable.

7. The system of claim 1, wherein the first jack is one of an RJ11 jack, an RJ14 jack, an RJ25 jack, an RJ45S jack, an RJ49 jack or an RJ61 jack.

8. A system comprising:
a frame comprising:
a first panel, wherein the first panel comprises a first section and a second sections;
a second panel, wherein the second panel comprises a third section and a fourth section, and wherein the first panel and the second panel are substantially parallel to one another;
a first void between the first panel and the second panel;
a first channel defined at least in part by a first edge of the first panel and a second edge of the second panel; and
at least a first spacer coupled to each of the first panel and the second panel, wherein the first spacer is coupled to the first section of the first panel and the third section of the second panel, wherein the first spacer is substantially perpendicular to each of the first panel and the second panel, and wherein the void is defined at least in part by the first spacer, the first panel, the second panel and the first channel;
a first carrier slidably mounted to the frame, wherein the first carrier comprises:
a third panel having a first opening extending therethrough;
a first jack disposed within the first opening;
a fourth panel having a second opening extending therethrough; and
at least a first retention element mounted to the fourth panel; and
a first cable having a first end and a second end,
wherein the first end is coupled to the first jack disposed within the first opening,
wherein at least the first retention element is releasably inserted into the first channel,
wherein a portion of the first cable extends from the first jack through the second opening into the first void by the first channel and out of the first void at a first end of the frame,
wherein the second section of the first panel comprises the first edge,
wherein the fourth section of the second panel comprises the second edge,
wherein the second section of the first panel is substantially parallel to the first section of the first panel, and
wherein the fourth section of the second panel is substantially parallel to the third section of the second panel.

9. A system comprising:
a frame comprising:
a first panel;
a second panel;
a first void between the first panel and the second panel; and
a first channel defined at least in part by a first edge of the first panel and a second edge of the second panel;
a first carrier slidably mounted to the frame, wherein the first carrier comprises:
a third panel having a first opening extending therethrough;
a first jack disposed within the first opening;
a fourth panel having a second opening extending therethrough; and
at least a first retention element mounted to the fourth panel;
a first cable having a first end and a second end;
a second carrier slidably mounted to the frame, wherein the second carrier comprises:

a fifth panel having a third opening extending therethrough;
a second jack disposed within the third opening;
a sixth panel having a fourth opening extending therethrough; and
at least a second retention element mounted to the sixth panel; and
a second cable having a third end and a fourth end,
wherein the first end is coupled to the first jack disposed within the first opening,
wherein at least the first retention element is releasably inserted into the first channel,
wherein a portion of the first cable extends from the first jack through the second opening into the first void by the first channel and out of the first void at a first end of the frame,
wherein the third end is coupled to the second jack disposed within the third opening,
wherein at least the second retention element is releasably inserted into the first channel, and
wherein a portion of the second cable extends from the second jack through the fourth opening, into the first void by the first channel and out of the first void at a first end of the frame.

10. A system comprising:
a frame comprising:
a first panel;
a second panel;
a first void between the first panel and the second panel;
a first channel defined at least in part by a first edge of the first panel and a second edge of the second panel;
a second void between the first panel and the second panel; and
a second channel defined at least in part by a third edge of the first panel and a fourth edge of the second panel;
a first carrier slidably mounted to the frame, wherein the first carrier comprises:
a third panel having a first opening extending therethrough;
a first jack disposed within the first opening;
a fourth panel having a second opening extending therethrough; and
at least a first retention element mounted to the fourth panel;
a first cable having a first end and a second end;
a second carrier slidably mounted to the frame, wherein the second carrier comprises:
a fifth panel having a third opening extending therethrough;
a second jack disposed within the third opening;
a sixth panel having a fourth opening extending therethrough; and
at least a second retention element mounted to the sixth panel; and
a second cable having a third end and a fourth end,
wherein the first end is coupled to the first jack disposed within the first opening,
wherein at least the first retention element is releasably inserted into the first channel,
wherein a portion of the first cable extends from the first jack through the second opening into the first void by the first channel and out of the first void at a first end of the frame,
wherein the third end is coupled to the second jack disposed within the third opening,
wherein at least the second retention element is releasably inserted into the second channel, and
wherein a portion of the second cable extends from the second jack through the fourth opening, into the second void by the second channel and out of the second void at the first end of the frame.

11. A system comprising:
a frame comprising:
a first panel;
a second panel;
a first void between the first panel and the second panel;
a first channel defined at least in part by a first edge of the first panel and a second edge of the second panel; and
a mounting bore extending through at least the first panel and the second panel;
a first carrier slidably mounted to the frame, wherein the first carrier comprises:
a third panel having a first opening extending therethrough;
a first jack disposed within the first opening;
a fourth panel having a second opening extending therethrough; and
at least a first retention element mounted to the fourth panel;
a first cable having a first end and a second end; and
a backerboard,
wherein the first end is coupled to the first jack disposed within the first opening,
wherein at least the first retention element is releasably inserted into the first channel, and
wherein a portion of the first cable extends from the first jack through the second opening into the first void by the first channel and out of the first void at a first end of the frame, and
wherein the frame is coupled to the backerboard by a fastener extended through the mounting bore.

12. The system of claim 11, further comprising:
a first shelf support having a front face and a rear face, wherein the rear face of the first shelf support is mounted to the backerboard;
a second shelf support having a front face and a rear face, wherein the rear face of the second shelf support is mounted to the backerboard; and
a shelf, wherein the shelf is supported by at least the front face of the first shelf support and the front face of the second shelf support, and
wherein the frame is mounted to the backerboard in a space between the backerboard and a rear edge of the shelf.

* * * * *